(12) United States Patent
Kayashima et al.

(10) Patent No.: US 10,297,547 B2
(45) Date of Patent: May 21, 2019

(54) SEMICONDUCTOR DEVICE INCLUDING FIRST AND SECOND WIRINGS

(71) Applicant: Renesas Electronics Corporation, Tokyo (JP)

(72) Inventors: Yuji Kayashima, Tokyo (JP); Tomohisa Sekiguchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/861,261

(22) Filed: Jan. 3, 2018

(65) Prior Publication Data

US 2018/0247893 A1   Aug. 30, 2018

(30) Foreign Application Priority Data

Feb. 27, 2017   (JP) ................. 2017-035049

(51) Int. Cl.
*H01L 23/528*   (2006.01)
*H01L 23/00*   (2006.01)

(52) U.S. Cl.
CPC ...... *H01L 23/5283* (2013.01); *H01L 23/5286* (2013.01); *H01L 24/04* (2013.01); *H01L 24/13* (2013.01); *H01L 2224/0236* (2013.01); *H01L 2224/02373* (2013.01); *H01L 2224/02375* (2013.01); *H01L 2224/02381* (2013.01); *H01L 2224/0401* (2013.01); *H01L 2224/13024* (2013.01); *H01L 2924/3512* (2013.01)

(58) Field of Classification Search
CPC . H01L 23/5283; H01L 24/13; H01L 23/5286; H01L 24/04; H01L 2224/02375; H01L 2224/02381; H01L 2224/0401; H01L 2224/02373; H01L 2224/13024; H01L 2224/0236

See application file for complete search history.

(56) References Cited

U.S. PATENT DOCUMENTS

2002/0096757 A1   7/2002 Takao et al.
2003/0168748 A1   9/2003 Katagiri et al.

FOREIGN PATENT DOCUMENTS

| JP | H06-53211 A | 2/1994 |
| JP | 2000-183214 A | 6/2000 |
| JP | 2003-264256 A | 9/2003 |

*Primary Examiner* — Sonya D. McCall-Shepard
(74) *Attorney, Agent, or Firm* — McGinn IP Law Group, PLLC.

(57) ABSTRACT

A wiring is formed over a semiconductor substrate via an interlayer insulation film, and another interlayer insulation film is formed over the interlayer insulation film so as to cover the wiring, and a pad is formed over the another interlayer insulation film. Over the another interlayer insulation film, a layered film having an opening portion in which a pad is exposed is formed, and a redistribution wiring electrically connected to the pad is formed over the layered film and over the pad exposed in the opening portion. An end portion of the wiring is located below a connection region between the pad and the redistribution wiring. The wiring has a plurality of opening portions formed therein, and at least a part of the plurality of opening portions overlaps with the connection region in plan view.

20 Claims, 44 Drawing Sheets

US 10,297,547 B2

SEMICONDUCTOR DEVICE INCLUDING FIRST AND SECOND WIRINGS

CROSS-REFERENCE TO RELATED APPLICATION

The present application claims priority from Japanese Patent Application No. 2017-035049 filed on Feb. 27, 2017, the content of which is hereby incorporated by reference into this application.

TECHNICAL FIELD OF THE INVENTION

The present invention relates to a semiconductor device and for example, can be suitably used for a semiconductor device in which a redistribution wiring is formed after a pad is formed.

BACKGROUND OF THE INVENTION

There is a technique of manufacturing a semiconductor device by forming a redistribution wiring after forming a bonding pad.

Japanese Patent Application Laid-Open Publication No. 2003-264256 (Patent Document 1) describes a technique relating to a semiconductor device in which a Cu wiring 10 is formed after a bonding pad BP is formed. Japanese Patent Application Laid-Open Publication No. 2000-183214 (Patent Document 2) and Japanese Patent Application Laid-Open Publication No. H6-53211 (Patent Document 3) describe a technique for providing a slit in a wiring layer.

SUMMARY OF THE INVENTION

It is required to improve reliability in a semiconductor device in which a redistribution wiring is formed after a pad is formed.

Other objects and novel characteristics of the present invention will be apparent from the description of the present specification and the accompanying drawings.

According to one embodiment, a semiconductor device includes a first wiring formed over a semiconductor substrate via a first interlayer insulation film, a second interlayer insulation film formed over the first interlayer insulation film so as to cover the first wiring, and a first pad formed over the second interlayer insulation film. The semiconductor device further includes a first insulation film formed over the second interlayer insulation film and having a first opening portion in which the first pad is exposed, a second wiring formed over the first insulation film and over the first pad exposed in the first opening portion and electrically connected to the first pad, and a second pad formed over the first insulation film and integrally connected to the second wiring. An end portion of the first wiring is located below a connection region between the first pad and the second wiring, a plurality of second opening portions are formed in the first wiring, and at least apart of the plurality of second opening portions overlaps with a connection region in plan view.

According to the one embodiment, reliability of the semiconductor device can be improved.

BRIEF DESCRIPTIONS OF THE DRAWINGS

DESCRIPTIONS OF THE PREFERRED EMBODIMENTS

Figure 1:
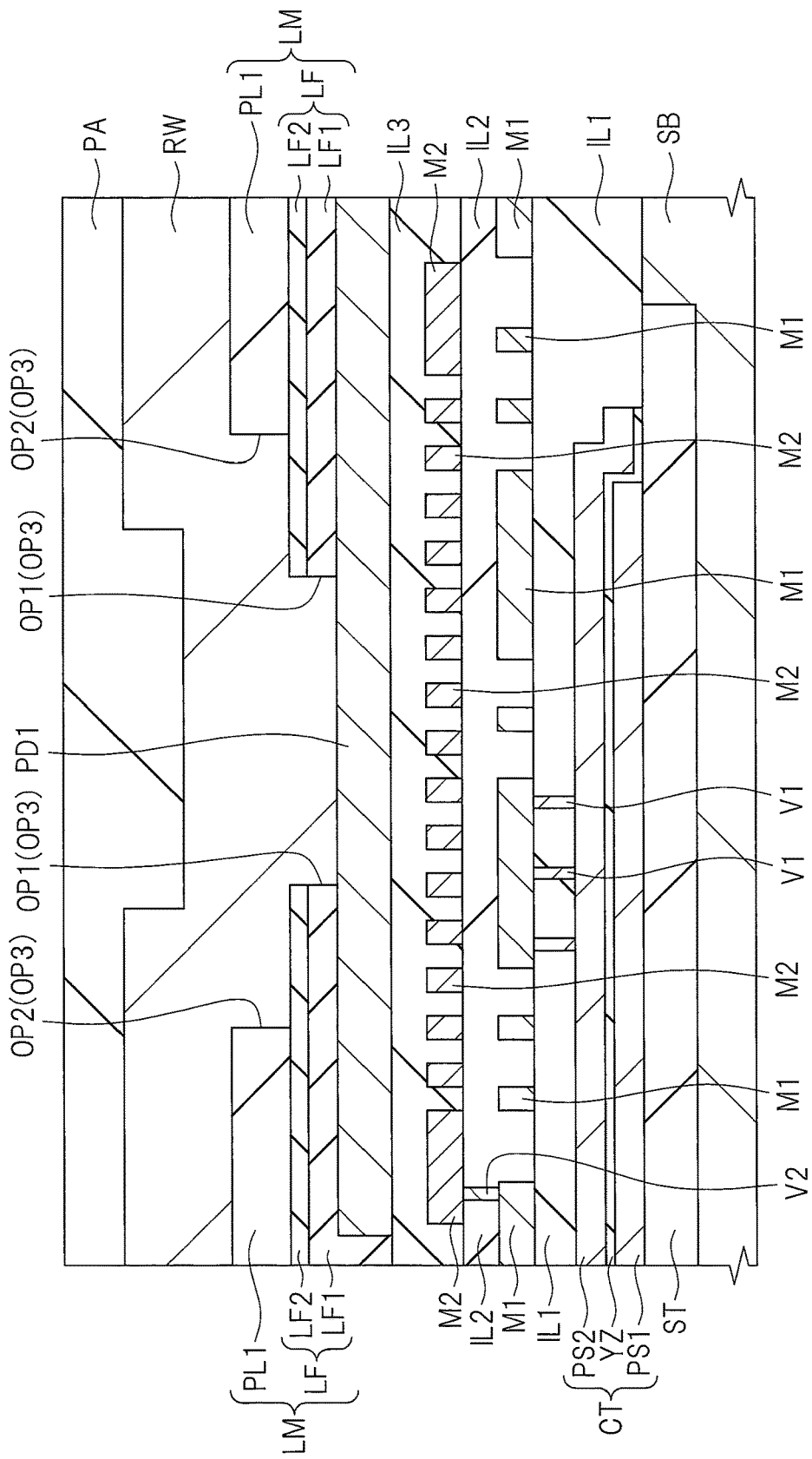
FIG. 1 is a cross-sectional view illustrating a principal part of a semiconductor device according to one embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specific number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof is omitted. In addition, the description of the same or similar portions is not repeated in principle unless particularly required in the following embodiments.

In addition, in some drawings used in the embodiments, hatching may be omitted even in a cross-sectional view so as to make the drawings easy to see. Also, hatching may be used even in plan view so as to make the drawings easy to see.

EMBODIMENT

<Regarding Structure of Semiconductor Device>

Figure 2:
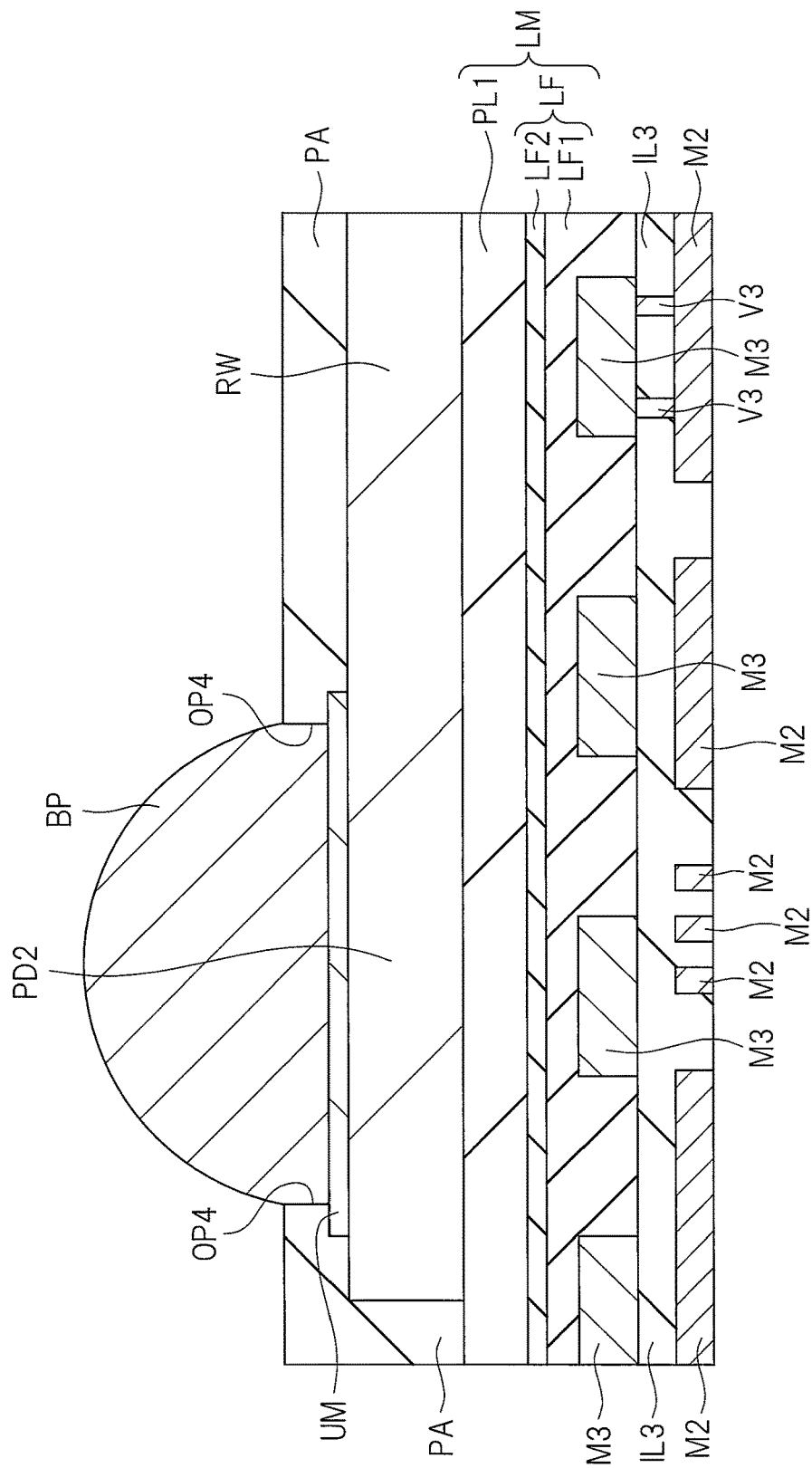
FIG. 2 is a cross-sectional view illustrating a principal part of the semiconductor device according to the one embodiment.

FIG. 1 and FIG. 2 are each a cross-sectional view of a principal part illustrating a sectional structure of a semiconductor device according to the present embodiment. FIG. 1 and FIG. 2 correspond to cross-sectional views at different positions in the semiconductor device according to the present embodiment. In FIG. 1, a cross section across the pad PD1 is illustrated. In FIG. 2, a cross section across pad PD2 is illustrated. In FIG. 2, for the sake of simplicity of the drawing, illustration of an interlayer insulation film IL2 and structures under the interlayer insulation film IL2 are omitted, but in practice, under the sectional structure of FIG. 2, there is a structure similar to the interlayer insulation film IL2 and the structure under the interlayer insulation film IL2 illustrated in FIG. 1.

The semiconductor device according to the present embodiment is a semiconductor device (semiconductor chip) manufactured using a semiconductor substrate SB made of monocrystalline silicon or the like.

As necessary, various elements (semiconductor elements) are formed in the semiconductor substrate SB made of monocrystalline silicon or the like constituting the semiconductor device (the semiconductor chip) according to the present embodiment. Examples of the elements formed in the semiconductor substrate SB include a transistor element such as a MISFET (Metal Insulator Semiconductor Field Effect Transistor), a memory element, a capacitive element, a resistance element, or the like. By way of example, FIG. 1 illustrates a case where a capacitive element CT is formed over the semiconductor substrate SB, but a transistor element such as a MISFET is also formed in a semiconductor substrate SB in a region not illustrated. The capacitive element CT is, for example, a capacitive element used for stabilizing a power supply.

The capacitive element CT is, for example, a capacitive element of PIP (polysilicon insulator polysilicon) type, but it may be a capacitive element of MIM (Metal Insulator Metal) type. When the capacitive element CT is a PIP type, the capacitive element CT includes a polysilicon film PS1 serving as a lower electrode, a polysilicon film PS2 serving as an upper electrode, and an insulation film YZ serving as a capacitive insulation film (dielectric film). In the case of FIG. 1, a polysilicon film PS1 is formed over an element separation region ST formed in the semiconductor substrate SB by using the STI (Shallow Trench Isolation) method, and a polysilicon film PS2 is formed over the polysilicon film PS1 with an insulation film YZ interposed therebetween.

In addition, a monocrystalline silicon substrate is taken as an example of the semiconductor substrate SB here, but in another mode, an SOI (Silicon On Insulator) substrate or the like can be used as the semiconductor substrate SB.

Over the semiconductor substrate SB, a multilayer wiring structure is formed with a plurality of interlayer insulation films and a plurality of wiring layers. More specifically, a plurality of interlayer insulation films IL1, IL2, and IL3 are formed over the semiconductor substrate SB. A plug V1, via portions V2 and V3, and wirings M1, M2, and M3 are formed in the plurality of interlayer insulation films IL1, IL2, and IL3.

More specifically, over the semiconductor substrate SB, the interlayer insulation film IL1 is formed as an insulation film so as to cover the elements formed in the semiconductor substrate SB. Over the interlayer insulation film IL1, a wiring M1 is formed. The wiring M1 is a wiring of the first wiring layer (the lowermost-layer wiring layer). Over the interlayer insulation film IL', the interlayer insulation film IL2 is formed as an insulation film so as to cover the wiring M1. Over the interlayer insulation film IL2, a wiring M2 is formed. The wiring M2 is a wiring of the second wiring layer immediately higher than the first wiring layer. Over the interlayer insulation film IL2, the interlayer insulation film IL3 is formed as an insulation film so as to cover the wiring M2. Over this interlayer insulation film IL3, a wiring M3 is formed. The wiring M3 is a wiring of the third wiring layer immediately higher than the second wiring layer.

The plug V1 is composed of a conductor and is formed in a layer below the wiring M1. More specifically, the plug V1 is formed so as to penetrate through the interlayer insulation film IL1 in the interlayer insulation film IL1. An upper surface of the plug V1 is in contact with a lower surface of the wiring M1 to be electrically connected to the wiring M1. A bottom of the plug V1 is connected to an element. For example, the bottom of the plug V1 is connected to the polysilicon film PS1 or the polysilicon film PS2 constituting the capacitive element CT or a gate electrode or a source and drain region constituting a MISFET (not illustrated). As a result, the wiring M1 is electrically connected to various elements formed in the semiconductor substrate SB via the plug V1.

The via portion V2 is composed of a conductor and is formed between the wiring M2 and the wiring M1, i.e., formed in the interlayer insulation film IL2 to connect the wiring M2 and the wiring M1. The via portion V2 can also be formed integrally with the wiring M2. The via portion V3 is composed of a conductor and is formed between the wiring M3 and the wiring M2, i.e., formed in the interlayer insulation film IL3 to connect the wiring M3 and the wiring M2. The via portion V3 can also be formed integrally with the wiring M3.

In the semiconductor device according to the present embodiment, the third wiring layer, i.e., the wiring M3 is the uppermost-layer wiring. More specifically, desired connections of the elements formed in the semiconductor substrate SB are made by the first wiring layer (wiring M1), the second wiring layer (wiring M2), and the third wiring layer (wiring M3), so that a desired operation can be performed.

A pad (pad region, pad electrode, or bonding pad) PD1 is formed of the third wiring layer which is the uppermost-layer wiring. More specifically, a pad PD1 is formed in the same layer as the wiring M3. In other words, the wiring M3 and the pad PD1 are formed of a conductive layer in the same layer in the same process. Therefore, the pad PD1 is formed over the interlayer insulation film IL3. Although the pad PD1 can also be regarded as a part of the wiring M3, the wiring M3 is entirely covered with an insulation film LF, and in contrast, at least a part of the pad PD1 is exposed in an opening portion OP1 of the insulation film LF.

Note that a part of the pad PD1 is covered with the insulation film LF. More specifically, although the pad PD1 is exposed in the opening portion OP1 of the insulation film LF, a portion of the pad PD1, which does not overlap with the opening portion OP1 in plan view, is covered with the insulation film LF. More specifically, a central portion of an upper surface of the pad PD1 is not covered with the insulation film LF, and an outer edge portion of the upper surface of the pad PD1 and a side surface of the pad PD1 are covered with the insulation film LF. Before forming a redistribution wiring RW, it is also possible to perform a test (probe test described later) as to whether or not the semiconductor device performs a desired operation by using this pad PD1.

Note that "in plan view" refers to a case in which a plane substantially parallel to a main surface of the semiconductor substrate SB is viewed.

The pad PD1 is preferably made of a conductive material (conductive material having metal conduction) containing aluminum as a main component (main material). Examples of suitable materials for the pad PD1 include a compound or an alloy of Al (aluminum) and Si (silicon), a compound or an alloy of Al (aluminum) and Cu (copper), or a compound or an alloy of Al (aluminum), Si (silicon), and Cu (copper). In the material constituting the pad PD1 (a conductive material containing aluminum as a main component), it is preferable that a composition ratio of Al (aluminum) is greater than 50 atomic % (i.e., Al-rich), and when the composition ratio of Al (aluminum) is 97 atomic % or more, this is more preferable. Although a single pad PD1 is illustrated in FIG. 1, one or more pads PD1 are formed in practice, and preferably, a plurality of pads PD1 are formed.

The wiring M3 formed integrally with the pad PD1 is connected (coupled) to the pad PD1. The wiring M3 formed integrally with the pad PD1 is connected with the wiring M2 through the via portion V3 provided immediately below the wiring M3, so that the pad PD1 can be electrically connected with the wiring M2. In another mode, the via portion V3 may be provided immediately below the pad PD1, and the pad PD1 can also be electrically connected with the wiring M2 through the via portion V3.

Also, FIG. 1 illustrates the case where the number of wiring layers formed over the semiconductor substrate SB (not including the redistribution wiring RW) is three (in the case of three layers in total, i.e., the wirings M1, M2, and M3), but the number of wiring layers is not limited to three and can be variously changed as long as the number of wiring layers is two or more (i.e., a plurality of wiring layers). Note that the number of wiring layers (not including the redistribution wiring RW) is more preferably three or more, since layout design of the wiring becomes easier.

As illustrated in FIG. 1 and FIG. 2, over the interlayer insulation film IL3, the insulation film (layered insulation film) LF is formed so as to cover the wiring M3. Over this insulation film LF, a resin film PL1 is formed, and the redistribution wiring (rearrangement wiring) RW is formed over the resin film PL1. More specifically, over the interlayer insulation film IL3, the layered film including the insulation film LF and the resin film PL1 formed over the insulation film LF is formed so as to cover the wiring M3, and the redistribution wiring RW is formed over the layered film.

The insulation film LF is an insulation film functioning as a passivation film. Here, the insulation film LF is composed of a layered film including a silicon oxide film LF1 and a silicon oxynitride film LF2 formed over the silicon oxide film LF1. Instead of the silicon oxynitride film LF2, a silicon nitride film can also be used. The silicon oxynitride film and the silicon nitride film are excellent as an insulation film for passivation film. For this reason, the insulation film LF includes the silicon oxynitride film or the silicon nitride film, so that the insulation film LF can function suitably as a passivation film.

The resin film PL1 is preferably a polyimide film (polyimide resin film). The polyimide film is a polymer containing an imide bond in a repeating unit and is a type of organic insulation film. The polyimide-based resin is an organic resin that is suitably used for a device which is required to have a high heat resistance of 200° C. or higher. In addition to the polyimide film, other organic insulation films such as epoxy-based, PBO-based, acrylic-based, and WRP-based resins can also be used as the resin film PL1. When the insulation film LF is composed of a layered film including the silicon oxide film LF1 and the silicon oxynitride film LF2 formed over the silicon oxide film LF1, the resin film PL1 is formed over the silicon oxynitride film LF2.

The insulation film LF has the opening portion OP1 in which at least a part of the pad PD1 is exposed. The resin film PL1 has an opening portion OP2 such that the opening portion OP1 of the insulation film LF is included in the opening portion OP2. More specifically, in plan view, the opening portion OP1 of the insulation film LF is included in the pad PD1 and is included in the opening portion OP2 of the resin film PL1. For this reason, a plane size (plane area) of the opening portion OP1 is smaller than a plane size of the pad PD1, and a plane size of the opening portion OP2 is larger than the plane size of the opening portion OP1. Therefore, a portion of the pad PD1, which is exposed in the opening portion OP1 of the insulation film LF, is not covered with the resin film PL1 but is exposed in the opening portion OP2 of the resin film PL1.

After the layered film (i.e., the insulation film LF) including the silicon oxide film LF1 and the silicon oxynitride film LF2 formed over the silicon oxide film LF1 is formed, the opening portion OP1 is formed in the layered film by photolithography and etching. Therefore, the opening portion (OP1) of the silicon oxynitride film LF2 and the opening portion (OP1) of the silicon oxide film LF1 are aligned (continuous). More specifically, the opening portion OP1 of the insulation film LF is composed of the opening portion (OP1) of the silicon oxynitride film LF2 and the opening portion (OP1) of the silicon oxide film LF1. However, the opening portion (OP1) of the silicon oxynitride film LF2 and the opening portion (OP1) of the silicon oxide film LF1 have substantially the same planar shape and plane size, and the planar positions thereof are substantially the same.

Meanwhile, the resin film PL1 is formed after the opening portion OP1 in the layered film (insulation film LF) of the silicon oxide film LF1 and the silicon oxynitride film LF2 is formed. Therefore, the plane size of the opening portion OP2 of the resin film PL1 can be made different from the plane size of the opening portion OP1 of the insulation film LF. In the present embodiment, the plane size of the opening portion OP2 of the resin film PL1 is larger than the plane size of the opening portion OP1 of the insulation film LF, and the opening portion OP1 of the insulation film LF is included in the opening portion OP2 of the resin film PL1 in plan view.

Therefore, in the opening portion OP1 of the insulation film LF, at least a portion of the pad PD1 is exposed. In the opening portion OP2 of the resin film PL1, the portion of the pad PD1 exposed in the opening portion OP1 of the insulation film LF is exposed. The insulation film LF constituting a peripheral portion of the opening portion OP1 is also exposed.

The pad PD1 is exposed in the opening portion OP1 of the insulation film LF. The redistribution wiring RW is also formed over the pad PD1 exposed in the opening portion OP1. The redistribution wiring RW is also formed over the portion of the insulation film LF, which is exposed in the opening portion OP2 of the resin film PL1. More specifically, the redistribution wiring RW is formed over the resin film PL1, in addition to over the pad PD1 exposed in the opening portion OP1 and over the insulation film LF exposed in the opening portion OP2, and is electrically connected to the pad PD1.

In plan view, the opening portion OP1 is included in the opening portion OP2, and the opening portion OP2 is included in the redistribution wiring RW. Therefore, the upper surface of the pad PD1 (i.e., the upper surface of the portion of the pad PD1 exposed in the opening portion OP1) constituting a bottom surface of the opening portion OP1, a side surface of the insulation film LF constituting a side wall of the opening portion OP1, an upper surface of the insulation film LF exposed in the opening portion OP2, and a side surface of the resin film PL1 constituting a side wall of the opening portion OP2 are covered with the redistribution wiring RW.

The redistribution wiring RW is a wiring leading out the pad PD1 which is a part of the uppermost-layer wiring (here, the third wiring layer) to a desired region (pad PD2) of the semiconductor chip. More specifically, the redistribution wiring RW is formed so as to extend over the resin film PL1 from the pad PD1 exposed in the opening portion OP1 of the insulation film LF to the pad PD2 over the resin film PL1.

The pad (pad region, pad electrode, or bonding pad) PD2 and the redistribution wiring RW are composed of the conductive layer of the same layer in the same layer in the same process. Therefore, the pad PD2 is also formed over the resin film PL1. The pad PD2 is formed integrally with the redistribution wiring RW and is electrically connected thereto and is electrically connected with the pad PD1 via the redistribution wiring RW. In addition, FIG. 2 illustrates one pad PD2, but in practice, one or more pads PD2 are formed in the semiconductor device, and preferably, a plurality of pads PD2 are formed. In FIG. 1 and FIG. 2, in order to make the drawing easy to see, the redistribution wiring RW and the pad PD2 are integrated without separating a copper film CF and a seed film SE, which will be described later.

Over the resin film PL1, an insulating protective film PA is formed so as to cover the redistribution wiring RW. Since the protective film PA is an insulation film, the protective film PA can be regarded as a protective insulation film. The redistribution wiring RW is covered and protected by the protective film PA. As the protective film PA, a resin film is preferable, and for example, a polyimide film (polyimide resin film) can be suitably used. The protective film PA is the outermost surface film of the semiconductor device (semiconductor chip). By using the resin film such as polyimide film as the protective film PA, advantages such as improvement of reliability and ease of handling of the semiconductor device can be obtained.

The pad PD2 is exposed in an opening portion OP4 of the protective film PA. More specifically, by providing the opening portion OP4 on the pad PD2, the pad PD2 is exposed in the opening portion OP4 of the protective film PA. The planar shape of each of the pad PD2 and the opening portion OP4 can be, for example, a circular shape. Over the pad PD2 exposed in the opening portion OP4 of the protective film PA, a bump electrode BP is formed. The opening portion OP4 of the protective film PA is included in the pad PD2 in plan view. Also, FIG. 2 illustrates a case where the bump electrode BP is formed over the pad PD2 with an underlying metal film UM interposed therebetween. Although it is possible to omit formation of the underlying metal film UM, it is more preferable to form the underlying metal film UM.

Figure 3:
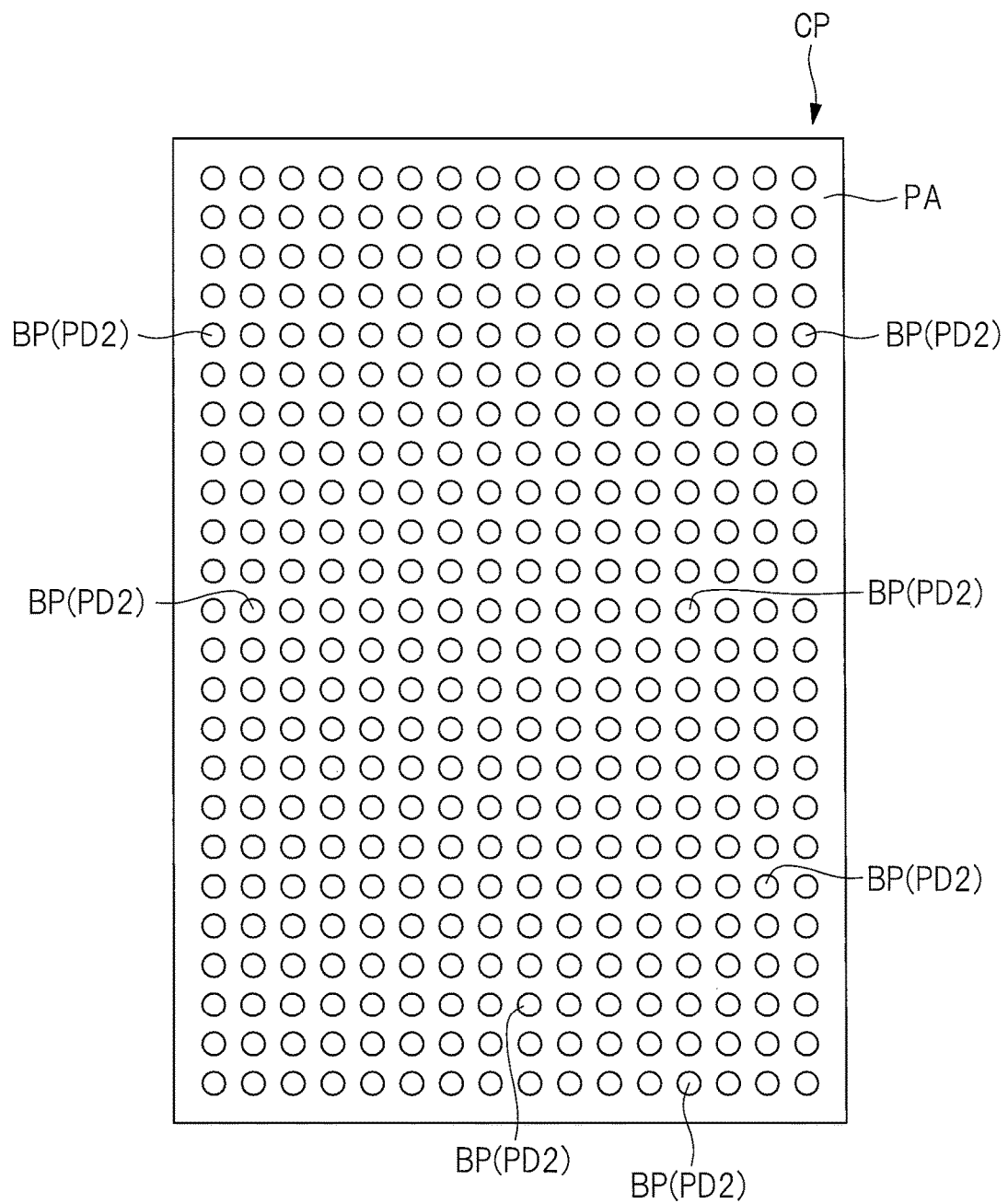
FIG. 3 is a top view illustrating the semiconductor device according to the one embodiment.
Figure 4:
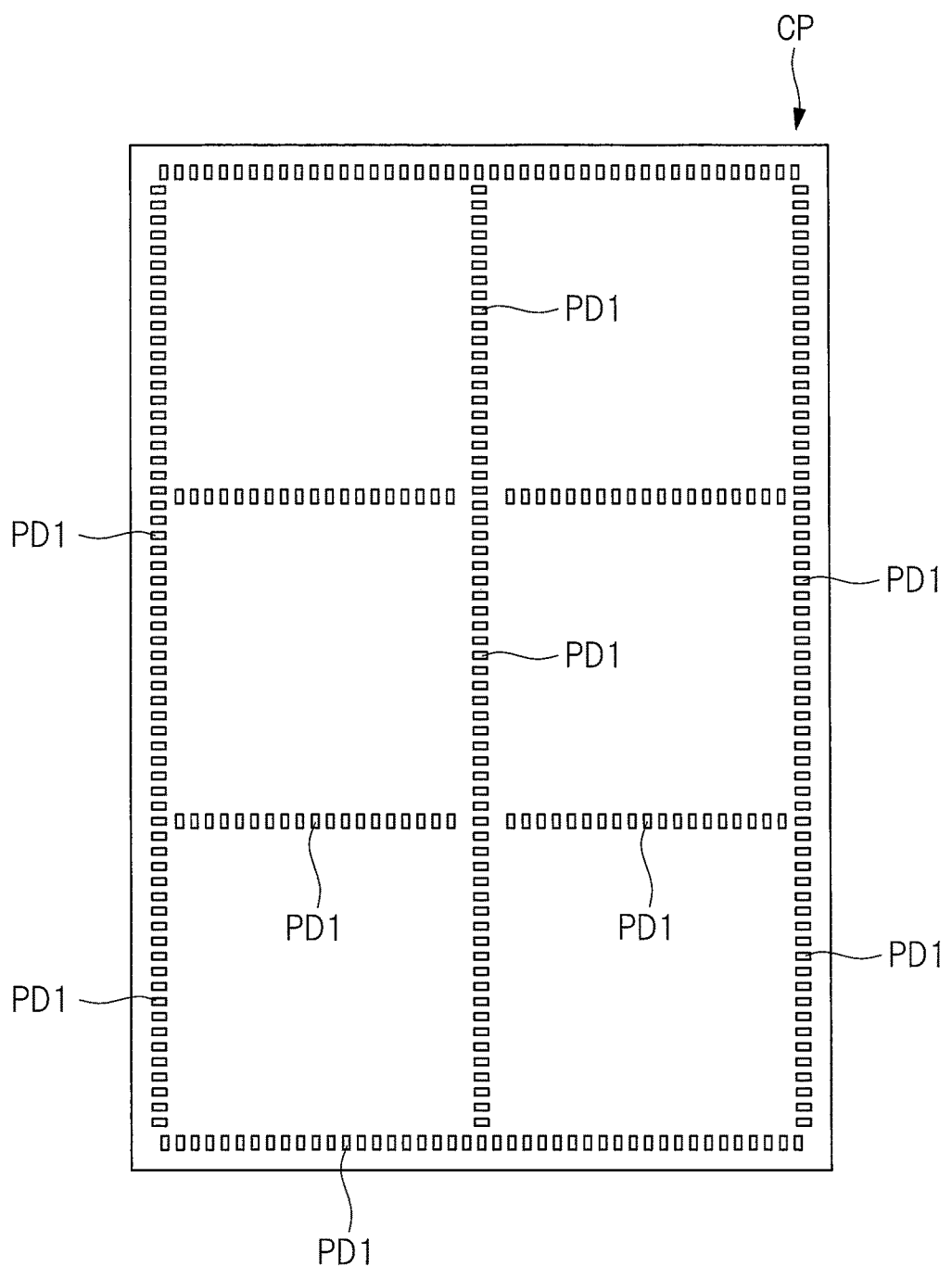
FIG. 4 is a plan perspective view illustrating the semiconductor device according to the one embodiment.

FIG. 3 is a top view (whole top view) of a semiconductor device (semiconductor chip) CP according to the present embodiment and illustrates an array of bump electrodes BP in the semiconductor device CP. Since the bump electrode BP is formed over the pad PD2 as illustrated in FIG. 2, an array of the pads PD2 in the semiconductor device CP is the same as the array of the bump electrodes BP in FIG. 3. FIG. 4 is a plan perspective view of the semiconductor device CP according to the present embodiment, illustrating an array of pads PD1 in the semiconductor device CP. FIG. 1 corresponds to a cross section across the pad PD1 in the semiconductor device CP, and FIG. 2 corresponds to a cross section across the pad PD2 and the bump electrode BP thereover in the semiconductor device CP. The pad PD1 and the pad PD2 are separated from each other in plan view, and the redistribution wiring RW extends so as to connect a plurality of pads PD1 and a plurality of pads PD2, although not illustrated in FIG. 3 and FIG. 4.

The redistribution wiring RW is a wiring electrically connecting the pad PD1 of each chip region of the semiconductor wafer (semiconductor substrate) and a mounting electrode (corresponding to the pad PD2 and the bump electrode BP thereover in the present embodiment) for mounting the semiconductor chip (CP) obtained by dividing the semiconductor wafer into each chip region, on a predetermined wiring substrate. The redistribution wiring RW has a function of matching a size of the pad PD1, which is governed by a size in the wafer process, with a size of the mounting electrode, which is governed by a size in the package process.

More specifically, since the size of the mounting electrode (the size of the electrode itself, the adjacent interval, the pitch, and the like) is governed by the size on the wiring substrate side, the size of the mounting electrode requires a relatively larger size than the size of the pad PD1 (the size of the pad itself, the adjacent interval, the pitch, and the like). Therefore, without using the fine pad PD1 governed by the wafer process as it is for the mounting electrode, the pad PD1 is led out to an empty region with a relatively large area on the main surface in the chip region via the redistribution wiring RW, and the mounting electrode (the pad PD2 and the bump electrode BP thereover) with a relatively large size and a relatively large pitch are arranged in the region. A plane size and an array pitch of the pad PD2 can be made larger than the plan dimension and an array pitch of the pad PD1, and the pad PD2 and the bump electrode BP thereover can be arranged in an array, for example, on an upper surface of the semiconductor device CP. Thus, the semiconductor device CP can be easily and accurately mounted on the wiring substrate.

<Manufacturing Process of Semiconductor Device>

Next, a manufacturing process of a semiconductor device according to the present embodiment will be described. According to the following manufacturing process, the semiconductor device of FIG. 1 to FIG. 4 is manufactured.

FIG. 5 to FIG. 21 are cross-sectional views of a principal part during a manufacturing process of the semiconductor device of the present embodiment. Among FIG. 5 to FIG. 21, FIGS. 5 to 11, 13, 15, 17, and 19 each indicate a cross-sectional view in a region corresponding to FIG. 1, and FIGS. 12, 14, 16, 18, 20, and 21 each indicate a cross-sectional view in a region corresponding to FIG. 2. In order to simplify the drawing, the interlayer insulation film IL2 and structures under the interlayer insulation film IL2 are not illustrated in FIG. 9 to FIG. 21.

Figure 5:
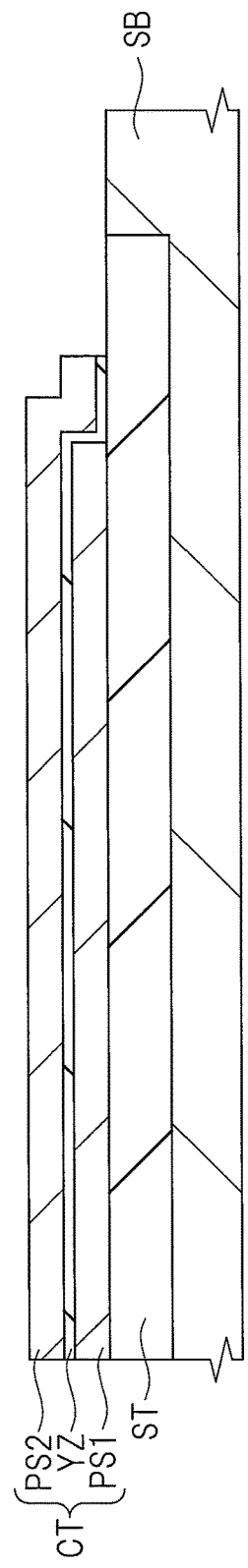
FIG. 5 is a cross-sectional view of a principal part during a manufacturing process of the semiconductor device of the one embodiment.

First, as illustrated in FIG. 5, a semiconductor substrate (semiconductor wafer) SB made of p-type monocrystalline silicon or the like having a specific resistance of substantially 1 to 10 Ωcm, for example, is provided (prepared).

Next, an element separation region ST is formed in a main surface of the semiconductor substrate SB by, for example, the STI (Shallow Trench Isolation) method or the like.

Next, in the semiconductor substrate SB, an element (semiconductor element) such as a MISFET (not illustrated) is formed in an active region defined by the element separation region ST. It is also possible to form a capacitive element CT on the element separation region ST by, for example, forming a polysilicon film, and thereafter, patterning the polysilicon film to form a polysilicon film PS1 over the element separation region ST, and forming an insulation film and a polysilicon film so as to cover the polysilicon film PS1 and patterning the insulation film and the polysilicon film to form an insulation film YZ and a polysilicon film PS2.

Figure 6:
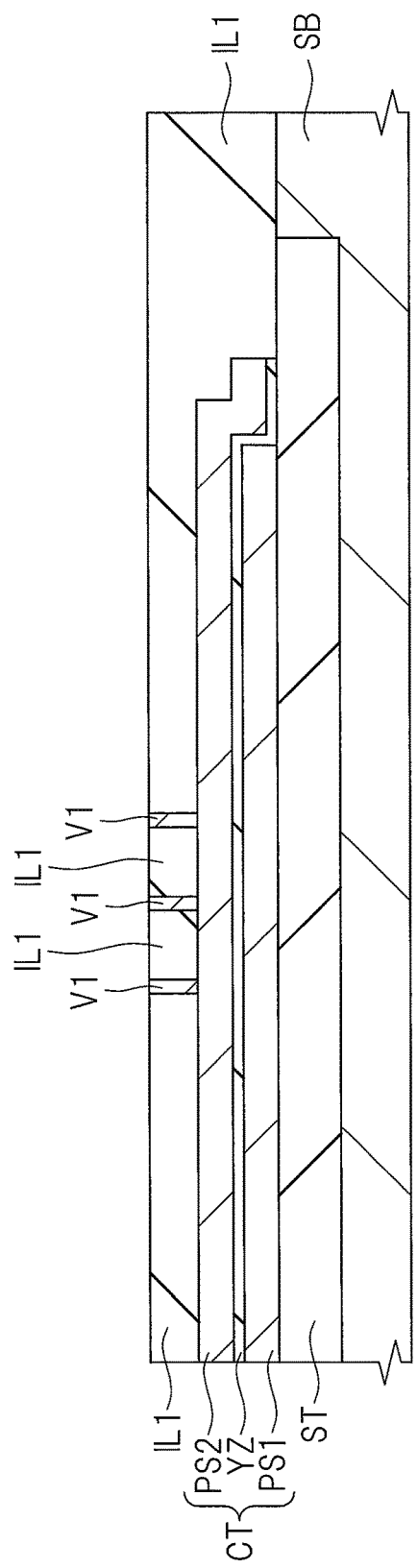
FIG. 6 is a cross-sectional view of the principal part during the manufacturing process of the semiconductor device continued from FIG. 5.

Next, as illustrated in FIG. 6, an interlayer insulation film IL1 is formed over the main surface (entire main surface) of the semiconductor substrate SB. The interlayer insulation film IL1 is formed so as to cover various elements formed in the semiconductor substrate SB. Accordingly, when a MISFET (not illustrated) is formed in the active region of the semiconductor substrate SB, the MISFET is also covered with the interlayer insulation film IL1. When the capacitive element CT is formed on the element separation region ST, the capacitive element CT is also covered with interlayer insulation film IL1. The interlayer insulation film IL1 is composed of, for example, a single film of a silicon oxide film, or a layered film including a silicon nitride film and a silicon oxide film thereon. After forming the interlayer insulation film IL, an upper surface of the interlayer insulation film IL1 is polished by the CMP (Chemical Mechanical Polishing), as necessary, thereby planarizng the upper surface of the interlayer insulation film IL1.

Next, the interlayer insulation film IL1 is subjected to dry etching using a photoresist layer (not illustrated) formed over the interlayer insulation film IL1 by photolithography as an etching mask, thereby forming a contact hole in the interlayer insulation film IL1. Then, a conductive film is embedded in this contact hole to form a conductive plug (connecting conductor portion) V1 as illustrated in FIG. 6.

In order to form the plug V1, for example, a barrier conductor film (for example, a titanium film, a titanium nitride film, or a layered film thereof, for example) is formed over the interlayer insulation film IL1 including a bottom surface and a sidewall of the contact hole by sputtering, the plasma CVD, or the like. Then, a main conductor film made of tungsten film or the like is formed over the barrier conductor film by the CVD or the like so as to fill the contact hole. Thereafter, the unnecessary main conductor film and the unnecessary barrier conductor film outside the contact hole are removed by the CMP, etching back, or the like. As a result, the upper surface of the interlayer insulation film IL1 is exposed, and the plug V1 is formed of the remained barrier conductor film and the remained main conductor film embedded in the contact hole of the interlayer insulation film IL1.

Figure 7:
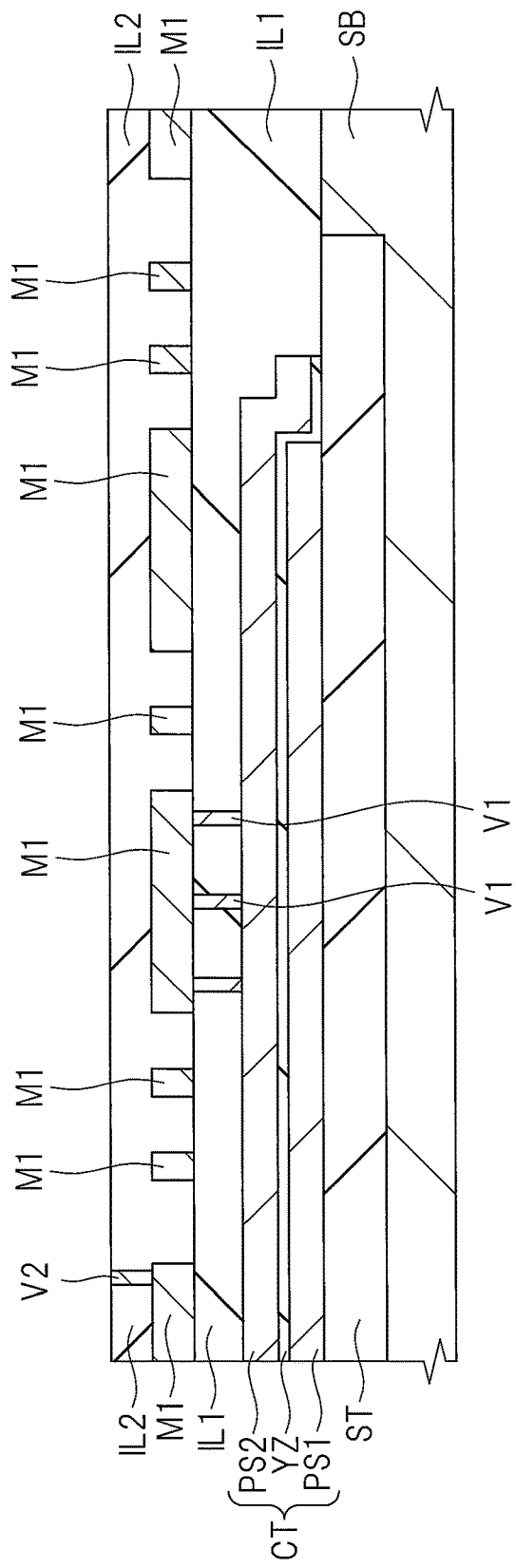
FIG. 7 is a cross-sectional view of the principal part during the manufacturing process of the semiconductor device continued from FIG. 6.

Next, as illustrated in FIG. 7, a wiring M1 of the first wiring layer which is the lowermost-layer wiring layer is formed over the interlayer insulation film IL1 in which the plug V1 is embedded. In order to form the wiring M1, first, a conductive film for the first wiring layer is formed over the interlayer insulation film IL1 in which the plug V1 is embedded. This conductive film is composed of, for example, a layered film including a barrier conductor film, an aluminum film, and a barrier conductor film arranged in order from the bottom and can be formed by sputtering or the like. The aluminum film in this conductive film can be regarded as an aluminum film for forming the wiring M1. As the barrier conductor film, for example, a titanium film, a titanium nitride film, or a layered film thereof can be used. Then, this conductive film is patterned by photolithography and etching, so that the wiring M1 can be formed. The plug V1 is electrically connected to the wiring M1 when its upper surface is in contact with the wiring M1.

The aluminum film for forming the wiring M1 is not limited to a pure aluminum film, and a conductive material film containing aluminum as its main component (conductive material film having metal conduction) can be used. For example, a compound film or an alloy film of Al (aluminum) and Si (silicon), a compound film or an alloy film of Al (aluminum) and Cu (copper), or a compound film or an alloy film of Al (aluminum), Si (silicon), and Cu (copper) can be suitably used as an aluminum film for forming the wiring M1. It is preferable that a composition ratio of Al (aluminum) in the aluminum film is greater than 50 atomic % (i.e., Al-rich), and more preferably 97 atomic % or more. This applies not only to the aluminum film for forming the wiring M1 but also to an aluminum film for forming the wiring M2 and an aluminum film for forming the wiring M3 and the pad PD1. For this reason, the wirings M1, M2, and M3 are all aluminum wiring containing aluminum (Al) as a main material, and the pad PD1 is an aluminum pad containing aluminum as a main material.

Next, as illustrated in FIG. 7, an interlayer insulation film IL2 is formed over the main surface (entire main surface) of the semiconductor substrate SB, i.e., over the interlayer insulation film IL1 so as to cover the wiring M1. The interlayer insulation film IL2 is made of a silicon oxide film or the like and can be formed by the CVD or the like. After the interlayer insulation film IL2 is formed, an upper surface of the interlayer insulation film IL2 is polished by the CMP, as necessary, for example, and accordingly, flatness of the upper surface of the interlayer insulation film IL2 can also be enhanced.

Next, the interlayer insulation film IL2 is subjected to dry etching using a photoresist layer (not illustrated) formed over the interlayer insulation film IL2 by photolithography as an etching mask, thereby forming a through hole in the interlayer insulation film IL2. Then, a conductive film is embedded in the through hole to form a conductive via portion (connecting conductor portion) V2. The via portion V2 can be regarded as a conductive plug. The via portion V2 can be formed by the same method as the plug V1, but a material of the conductive film for the via portion V2 can be made different from that of the plug V1. For example, the plug V1 may be composed of a tungsten film as a main material, and the via portion V2 may be composed of aluminum film as a main material.

Figure 8:
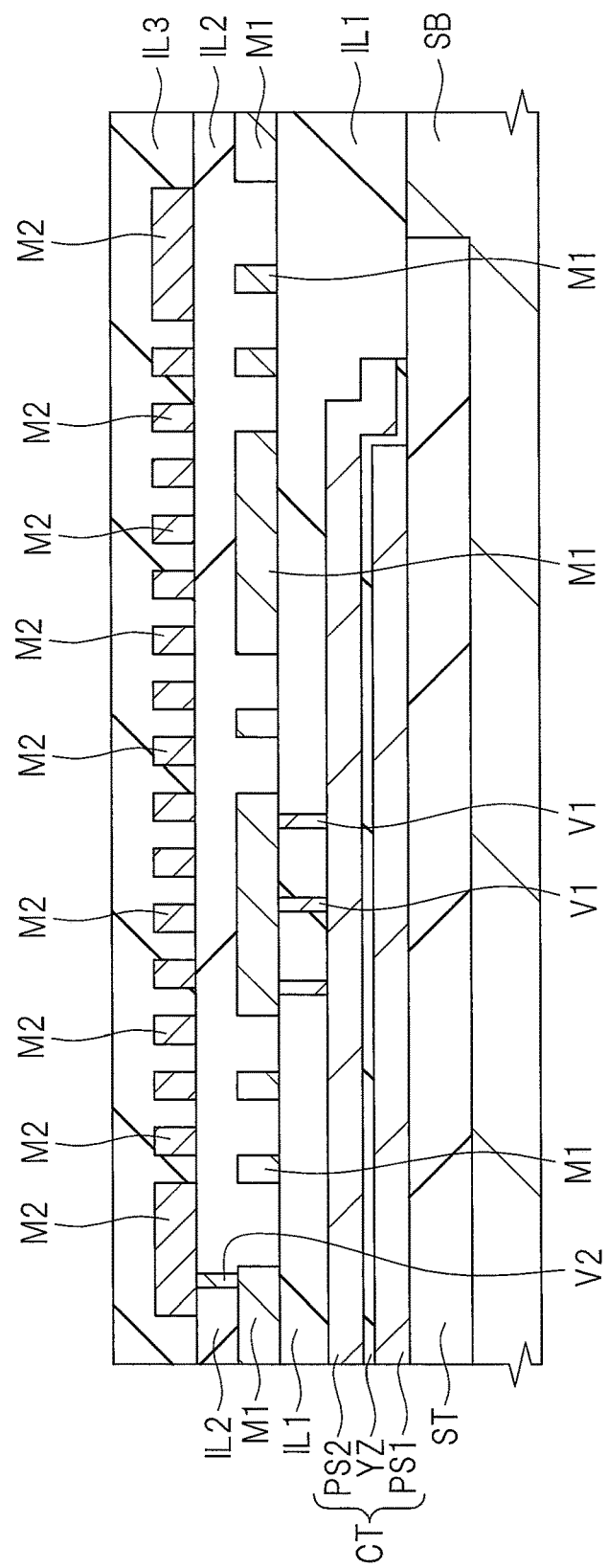
FIG. 8 is a cross-sectional view of the principal part during the manufacturing process of the semiconductor device continued from FIG. 7.

Next, as illustrated in FIG. 8, a wiring M2 of the second wiring layer is formed over the interlayer insulation film IL2 in which the via portion V2 is embedded. In order to form the wiring M2, first, a conductive film for the second wiring layer is formed over the interlayer insulation film IL2 in which the via portion V2 is embedded. This conductive film is composed of, for example, a layered film including a barrier conductor film, an aluminum film, and a barrier conductor film arranged in order from the bottom and can be formed by sputtering or the like. The aluminum film in this conductive film can be regarded as an aluminum film for forming the wiring M2. As the barrier conductor film, for example, a titanium film, a titanium nitride film, or a layered film thereof can be used. Then, this conductive film is patterned by photolithography and etching, so that the wiring M2 can be formed. The via portion V2 is electrically connected to the wiring M1 with its lower surface being in contact with the wiring M1 and is electrically connected to the wiring M2 with its upper surface being in contact with the wiring M2. More specifically, the via portion V2 electrically connects the wiring M1 and the wiring M2. The wiring M2 includes wirings M2a, M2b, and M2c described later.

Here, a case where the via portion V2 and the wiring M2 are formed in separate processes has been described. In another mode, the via portion V2 and the wiring M2 can be formed in the same process, in which case the via portion V2 is formed integrally with the wiring M2. In this case, after forming a through hole for the via portion V2 in the interlayer insulation film IL2, a conductive film (a conductive film for the second wiring layer) is formed over the interlayer insulation film IL2 so as to fill the through hole. This conductive film is patterned by photolithography and etching, so that the wiring M2 is formed. As a result, the wiring M2 is formed, and the via portion V2 formed integrally with the wiring M2 is also formed.

Next, as illustrated in FIG. 8, an interlayer insulation film IL3 is formed over the main surface (entire main surface) of the semiconductor substrate SB, i.e., over the interlayer insulation film IL2 so as to cover the wiring M2. The interlayer insulation film IL3 is made of a silicon oxide film or the like and can be formed by the CVD or the like. After the interlayer insulation film IL3 is formed, an upper surface of the interlayer insulation film IL3 can be polished by the CMP, as necessary, for example, and accordingly, flatness of the upper surface of the interlayer insulation film IL3 can also be enhanced.

Next, the interlayer insulation film IL3 is subjected to dry etching using a photoresist layer (not illustrated) formed over the interlayer insulation film IL3 by photolithography as an etching mask, thereby forming a through hole in the interlayer insulation film IL3. Then, a conductive film is embedded in the through hole to form a conductive via portion (connecting conductor portion) V3. The via portion V3 can be regarded as a conductive plug. The via portion V3 can be formed by the same method with the same conductive material as the via portion V2. Although the via portion V3 is not illustrated in FIG. 8, it is illustrated in FIG. 2.

Figure 9:
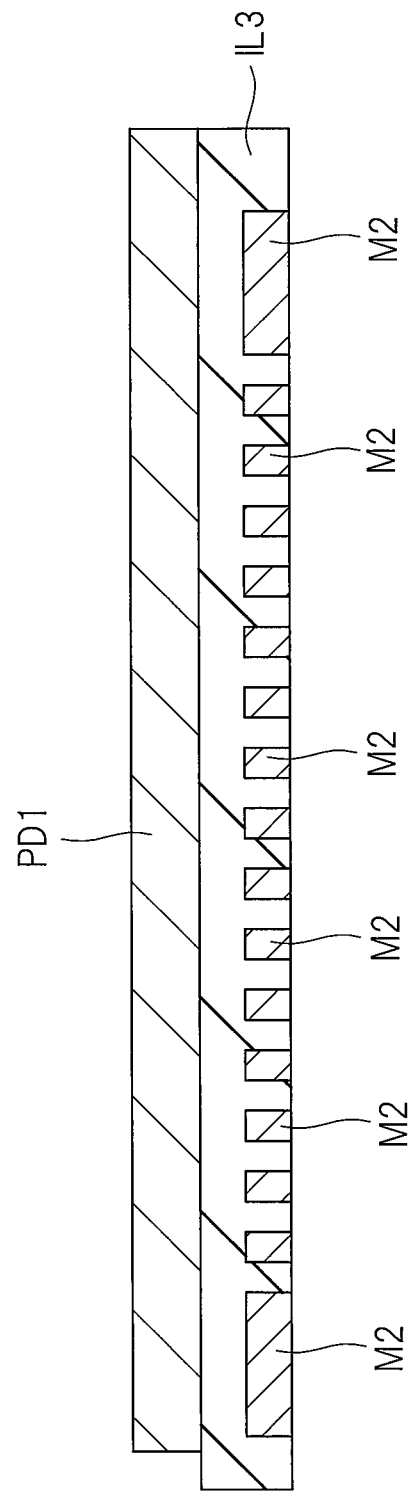
FIG. 9 is a cross-sectional view of the principal part during the manufacturing process of the semiconductor device continued from FIG. 10.

Next, as illustrated in FIG. 9, a pad PD1 and a wiring M3 of the third wiring layer are formed over the interlayer insulation film IL3 in which the via portion V3 is embedded.

Note that the wiring M3 and the via portion V3 are illustrated in FIG. 2. Also, as described above, in FIG. 9, for the sake of simplification of the drawing, the interlayer insulation film IL2 and structures under the interlayer insulation film IL2 are not illustrated, but in practice, the interlayer insulation film IL2 illustrated in FIG. 8 and the structure under the interlayer insulation film IL2 are present also under the sectional structure of FIG. 9.

In order to form the wiring M3 and the pad PD1, first, a conductive film for the third wiring layer is formed over the interlayer insulation film IL3 in which the via portion V3 is embedded. The conductive film is composed of, for example, a layered film including a barrier conductor film, an aluminum film, and a barrier conductor film arranged in order from the bottom and can be formed by sputtering or the like. This conductive film is a conductive film for the third wiring layer and also serves as a conductive film for forming the pad PD1. The aluminum film in the conductive film can be regarded as an aluminum film for forming the wiring M3 and the pad PD1. As the barrier conductor film, for example, a titanium film, a titanium nitride film, or a layered film thereof can be used. Then, this conductive film is patterned by photolithography and etching, so that the wiring M3 and the pad PD1 can be formed. The via portion V3 is electrically connected to the wiring M2 with its lower surface being in contact with the wiring M2 and is electrically connected to the wiring M3 or pad PD1 with its upper surface being in contact with the wiring M3 or pad PD1. More specifically, the via portion V3 electrically connects the wiring M2 and the wiring M3, or electrically connects the wiring M2 and the pad PD1. The planar shape of the pad PD1 can be, for example, a substantially rectangular planar shape having sides larger than a wiring width of the wiring M3.

Here, the case where the via portion V3 and the wiring M3 are formed in separate processes has been described. In another mode, the via portion V3, the wiring M3, and the pad PD1 can be formed in the same process, and in this case, the via portion V3 is formed integrally with the wiring M3 or the pad PD1. In this case, after forming a through hole for the via portion V3 in the interlayer insulation film IL3, a conductive film (a conductive film for the second wiring layer) is formed over the interlayer insulation film IL3 so as to fill the through hole, and thereafter, this conductive film is patterned by photolithography and etching to form the wiring M3 and the pad PD1. As a result, the wiring M3 and the pad PD1 are formed, and the via portion V3 formed integrally with the wiring M3 or the pad PD1 is also formed.

Figure 10:
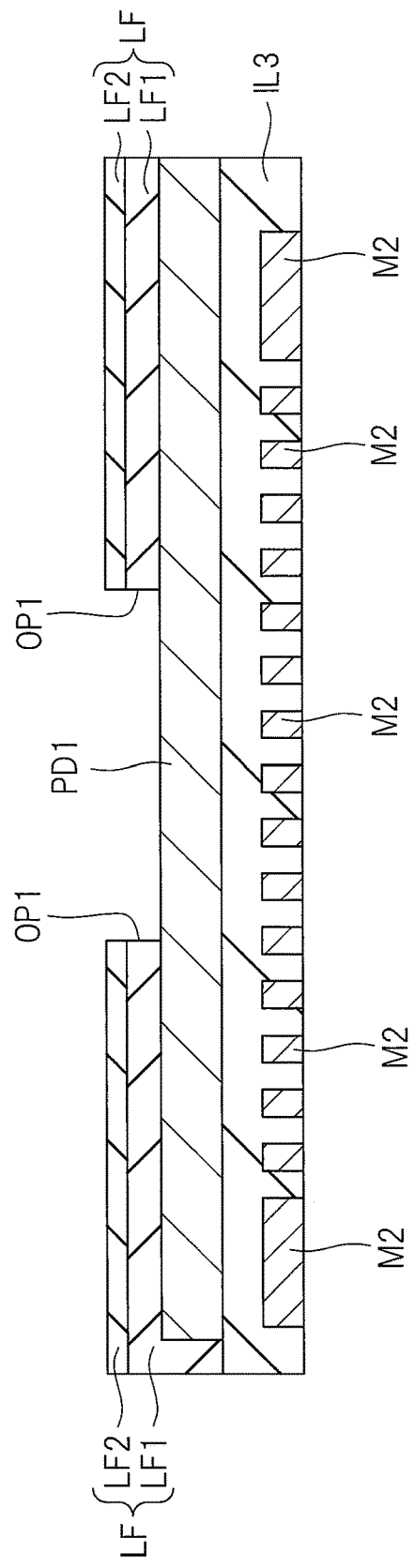
FIG. 10 is a cross-sectional view of the principal part during the manufacturing process of the semiconductor device continued from FIG. 9.

Next, as illustrated in FIG. 10, a silicon oxide film LF1 is formed over the main surface (entire main surface) of the semiconductor substrate SB, i.e., over the interlayer insulation film IL3 so as to cover the wiring M3 and the pad PD1. The silicon oxide film LF1 can be formed by the CVD or the like. The HDP (High Density Plasma)-CVD is particularly suitable as a film formation method of the silicon oxide film LF1. A thickness (formed film thickness) of the silicon oxide film LF1 can be, for example, substantially 0.5 to 0.6 μm. Although the wiring M3 and the pad PD1 are exposed before the silicon oxide film LF1 is formed, upon formation of the silicon oxide film LF1, the wiring M3 and the pad PD1 are covered with the silicon oxide film LF1 and are thus in an unexposed state.

Next, the silicon oxynitride film LF2 is formed over the main surface (entire main surface) of the semiconductor substrate SB, i.e., over the silicon oxide film LF1. The silicon oxynitride film LF2 can be formed by the CVD or the like. The plasma CVD is particularly suitable as a film formation method of the silicon oxynitride film LF2. A thickness (formed film thickness) of the silicon oxynitride film LF2 can be, for example, substantially 0.9 to 1.1 μm. As another mode, a silicon nitride film can be used instead of the silicon oxynitride film LF2.

The silicon oxide film LF1 and the silicon oxynitride film LF2 are formed, so that the insulation film LF composed of a layered film including the silicon oxide film LF1 and the silicon oxynitride film LF2 formed over the silicon oxide film LF1 is formed over the interlayer insulation film IL3 so as to cover wiring M3 and the pad PD1.

Next, the opening portion OP1 is formed in the insulation film LF. The opening portion OP1 is formed by selectively removing the insulation film LF over the pad PD1. The opening portion OP1 is formed so as to be included in the pad PD1 in plan view.

The opening portion OP1 can be formed as follows. More specifically, after the silicon oxide film LF1 and the silicon oxynitride film LF2 are formed in this order, a photoresist pattern (not illustrated) is formed over the silicon oxynitride film LF2 by photolithography. Then, the silicon oxynitride film LF2 and the silicon oxide film LF1 are sequentially etched (dry etching) by using the photoresist pattern as an etching mask to form the opening portion OP1 in the insulation film LF. Thereafter, the photoresist pattern is removed, and this stage is illustrated in FIG. 10. The opening portion OP1 is formed so as to penetrate through the insulation film LF (i.e., the layered film including the silicon oxide film LF1 and the silicon oxynitride film LF2), and at least a part of the pad PD1 is exposed in the opening portion OP1.

When the opening portion OP1 is formed in the insulation film LF, the pad PD1 is exposed in the opening portion OP1 of the insulation film LF. At this time, at least a part of an upper surface of the pad PD1 is exposed in the opening portion OP1 of the insulation film LF. In contrast, a side surface (side wall) of the pad PD1 is not exposed in the opening portion OP1 of the insulation film LF, but is preferably covered with the insulation film LF. More specifically, in plan view, the opening portion OP1 of the insulation film LF overlaps with the pad PD1, but it is preferable that the opening portion OP1 of the insulation film LF is included in the pad PD1. More specifically, in plan view, an outer edge of the opening portion OP1 of the insulation film LF is preferably located inside an outer edge of the pad PD1.

When the opening portion OP1 is formed in the insulation film LF, the pad PD1 is exposed in the opening portion OP1 of the insulation film LF. However, the wiring M3 other than the pad PD1 is not exposed because the wiring M3 remains covered with the insulation film LF. The wiring M3 other than the pad PD1 thereafter remains covered with the insulation film LF and is not exposed.

Figure 11:
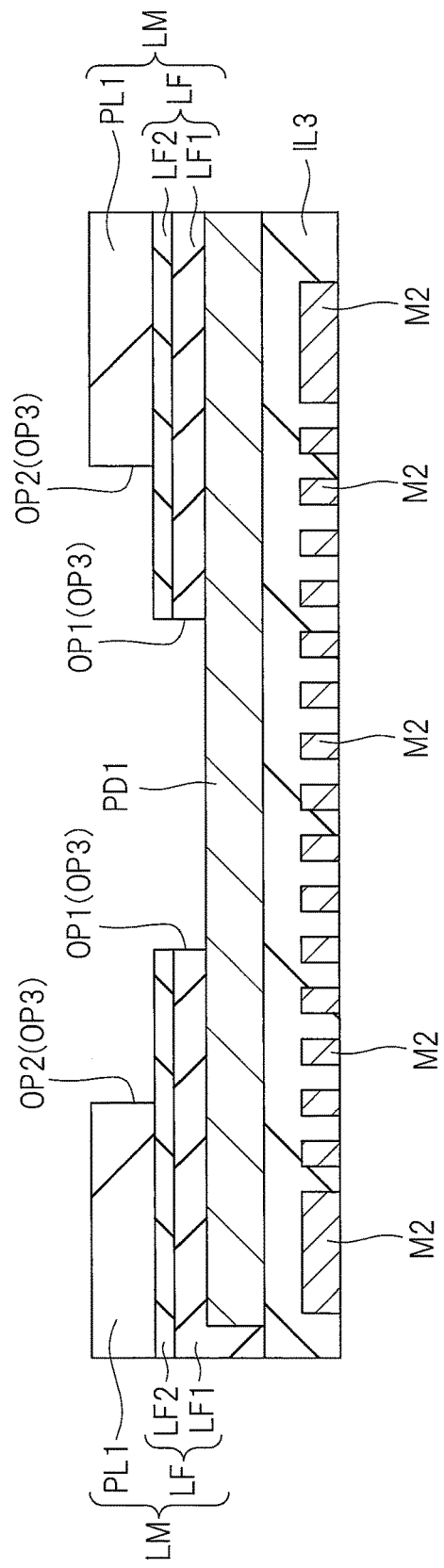
FIG. 11 is a cross-sectional view of the principal part during the manufacturing process of the semiconductor device continued from FIG. 10.
Figure 12:
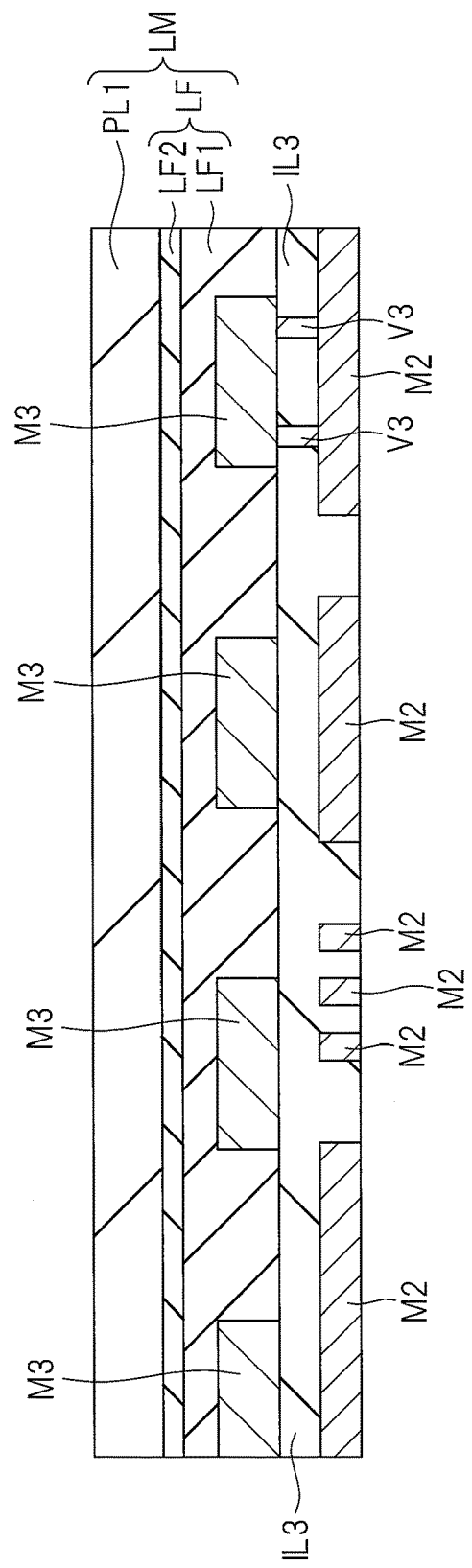
FIG. 12 is a cross-sectional view of the principal part during the manufacturing process of the semiconductor device of FIG. 11.

Next, as illustrated in FIG. 11 and FIG. 12, the resin film PL1 is formed over the main surface (entire main surface) of the semiconductor substrate SB, i.e., over the insulation film LF so as to cover the pad PD1.

A polyimide film or the like can be suitably used as the resin film PL1. The resin film PL1 can be formed by, for example, coating. More specifically, with use of a so-called spin coating (rotational coating) method, a precursor solution of polyimide is coated over the main surface of the semiconductor substrate SB while rotating the semiconductor substrate SB, and the semiconductor substrate SB is then dried, so that a polyimide film serving as the resin film PL1 can be formed. A thickness (formed film thickness) of the resin film PL1 can be, for example, substantially 3 to 5 μm.

The resin film PL1 is formed over the insulation film LF and over the pad PD1 exposed in the opening portion OP1 of the insulation film LF. Before forming the resin film PL1, the pad PD1 is exposed in the opening portion OP1 of the insulation film LF. However, when the resin film PL1 is formed, the pad PD1 exposed in the opening portion OP1 of the insulation film LF is covered with the resin film PL1, so that the pad PD1 is in an unexposed state.

Next, an opening portion OP2 is formed in the resin film PL1. FIG. 11 and FIG. 12 illustrate a stage where the opening portion OP2 is formed in the resin film PL1. However, FIG. 11 illustrates a cross section across the opening portions OP1 and OP2. However, FIG. 12 illustrates a cross section not crossing the opening portions OP1 and OP2. Accordingly, the opening portions OP1 and OP2 are illustrated in FIG. 11, but are not illustrated in FIG. 12. The opening portion OP2 can be formed as follows, for example.

More specifically, by forming the resin film PL1 as a photosensitive resin film in advance and then exposing and developing the resin film PL1 made of the photosensitive resin, it is possible to selectively remove the resin film PL1 serving as the portion for the opening portion OP2, so that the opening portion OP2 is formed in the resin film PL1. Thereafter, heat treatment is performed to harden the resin film PL1. The opening portion OP2 is formed so as to penetrate through the resin film PL1, and at least a part of the pad PD1 is exposed in the opening portion OP2.

Also, in another mode, the resin film PL1 is subjected to dry etching using, as an etching mask, a photoresist pattern formed over the resin film PL1 by photolithography, so that the opening portion OP2 can also be formed in the resin film PL1, in which case the resin film PL1 need not be a photosensitive resin film.

The opening portion OP2 is formed such that the opening portion OP1 is included in the opening portion OP2 in plan view. More specifically, a plane size (plane area) of the opening portion OP2 of the resin film PL1 is larger than a plane size of the opening portion OP1 of the insulation film LF. In plan view, the opening portion OP1 of the insulation film LF is included in the opening portion OP2 of the resin film PL1. More specifically, in plan view, an outer edge of the opening portion OP2 of the resin film PL1 is located outside the outer edge of the opening portion OP1 of the insulation film LF.

Therefore, when the resin film PL1 is formed, the upper surface of the pad PD1 constituting the bottom surface of the opening portion OP1 and an inner wall of the opening portion OP1 of the insulation film LF are covered with the resin film PL1, and when the opening portion OP2 is thereafter formed in the resin film PL1, the upper surface of the pad PD1 constituting the bottom surface of the opening portion OP1 and the inner wall of the opening portion OP1 of the insulation film LF are exposed without being covered with the resin film PL1.

In this way, the insulation film LF and the resin film PL1 respectively having the opening portions OP1 and OP2 in which at least a part of the pad PD1 is exposed are formed. Here, a combination of the opening portion OP2 of resin film PL1 and the opening portion OP1 of the insulation film LF is referred to as an opening portion OP3. Also, a layered film including the insulation film LF and the resin film PL1 formed over insulation film LF will be referred to as a layered film LM. Since the layered film LM is a layered insulation film, the whole layered film LM can also be regarded as an insulation film. The opening portion OP3 corresponds to the opening portion of the layered film LM including the insulation film LF and the resin film PL1 formed over the insulation film LF and is formed by the opening portion OP2 of the resin film PL1 and the opening portion OP1 of the insulation film LF. More specifically, an inner wall of the opening portion OP3 is formed by an inner wall of the opening portion OP2 of the resin film PL1, the inner wall of the opening portion OP1 of the insulation film LF, and an upper surface of the insulation film LF positioned between the inner wall of the opening portion OP2 and the inner wall of the opening portion OP1 and not covered with the resin film PL1. At this stage (FIG. 11 and FIG. 12), the layered film LM having the opening portion OP3 in which at least a part of the pad PD1 is exposed is formed over the interlayer insulation film IL3 so as to cover the wiring M3.

In this manner, as illustrated in FIG. 5 to FIG. 12, the wafer process is performed on the semiconductor substrate SB. The wafer process is also referred to as a front-end process. Here, the wafer process generally refers to a process for forming various elements and wiring layers (here, wirings M1, M2, and M3) and a pad electrode (here, pad PD1) over the main surface of a semiconductor wafer (semiconductor substrate SB) to form a surface protective film (in this case, the layered film LM), and thereafter preparing the semiconductor wafer ready for a state in which an electrical test of each of the plurality of chip regions formed in the semiconductor wafer can be performed by a probe or the like. Each chip region of the semiconductor wafer corresponds to a region where one semiconductor chip is acquired from the semiconductor wafer.

For this reason, the layered film LM becomes the uppermost layer and becomes a surface protective film in the semiconductor wafer subjected to the wafer process. More specifically, in the semiconductor wafer subjected to the wafer process, the resin film PL1 of the layered film LM is the uppermost-layer film. In the semiconductor wafer subjected to the wafer process, using a resin film (organic insulation film) such as polyimide film as the uppermost-layer film makes it easy to handle the semiconductor wafer. Further, the wiring M3 of the third wiring layer becomes the uppermost-layer wiring, and the pad PD1 is formed of this third wiring layer.

An electrical test of each chip region of the semiconductor wafer can also be performed by carrying out a probe test (wafer test) using the pad PD1 exposed in the opening portion OP3 of the layered film LM. More specifically, in each chip region of the semiconductor wafer, an electrical test of each chip region can be performed by applying a test probe (probe needle, probe) to the pad PD1 exposed in the opening portion OP3 of the layered film LM. As a result of this probe test, it is possible to select whether each chip region of the semiconductor wafer is a good item or a defective item. Alternatively, by feeding back the measurement result data of the probe test to each manufacturing process, the yield and the reliability can be improved. For this reason, although the probe test can be omitted, it is more preferable to perform the probe test.

Figure 13:
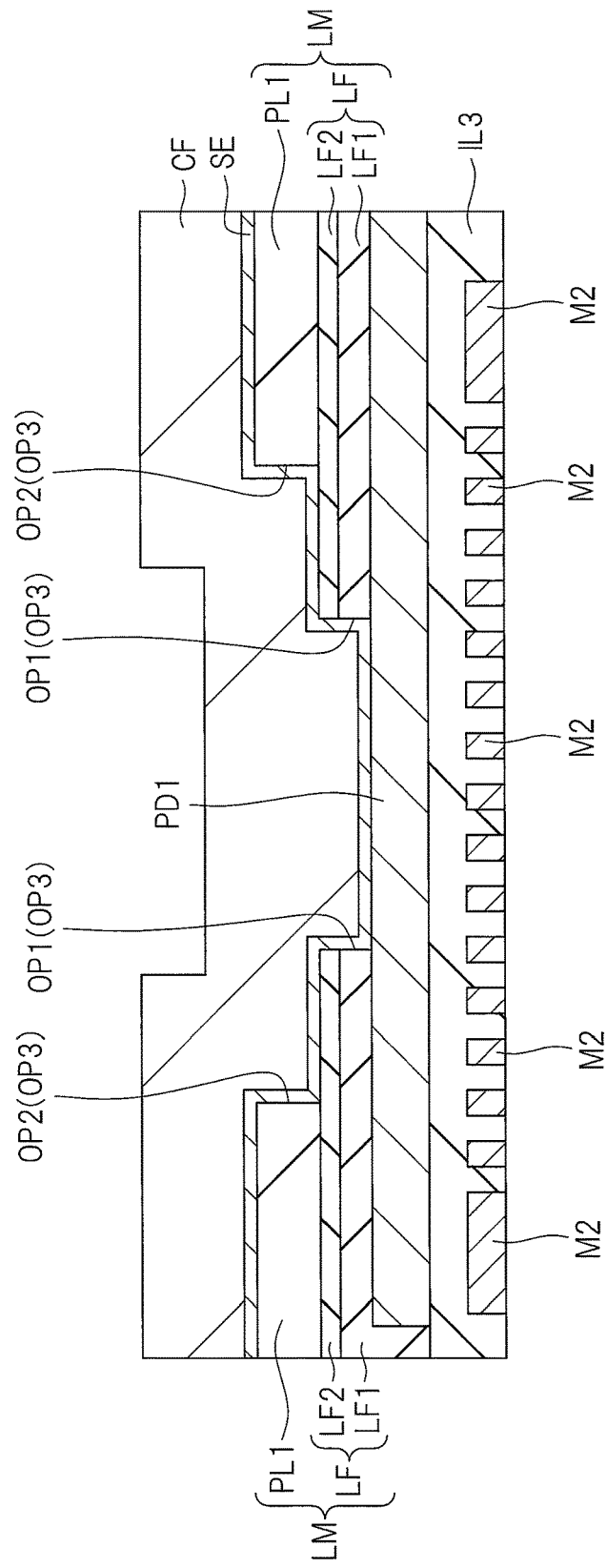
FIG. 13 is a cross-sectional view of the principal part during the manufacturing process of the semiconductor device continued from FIG. 11.
Figure 14:
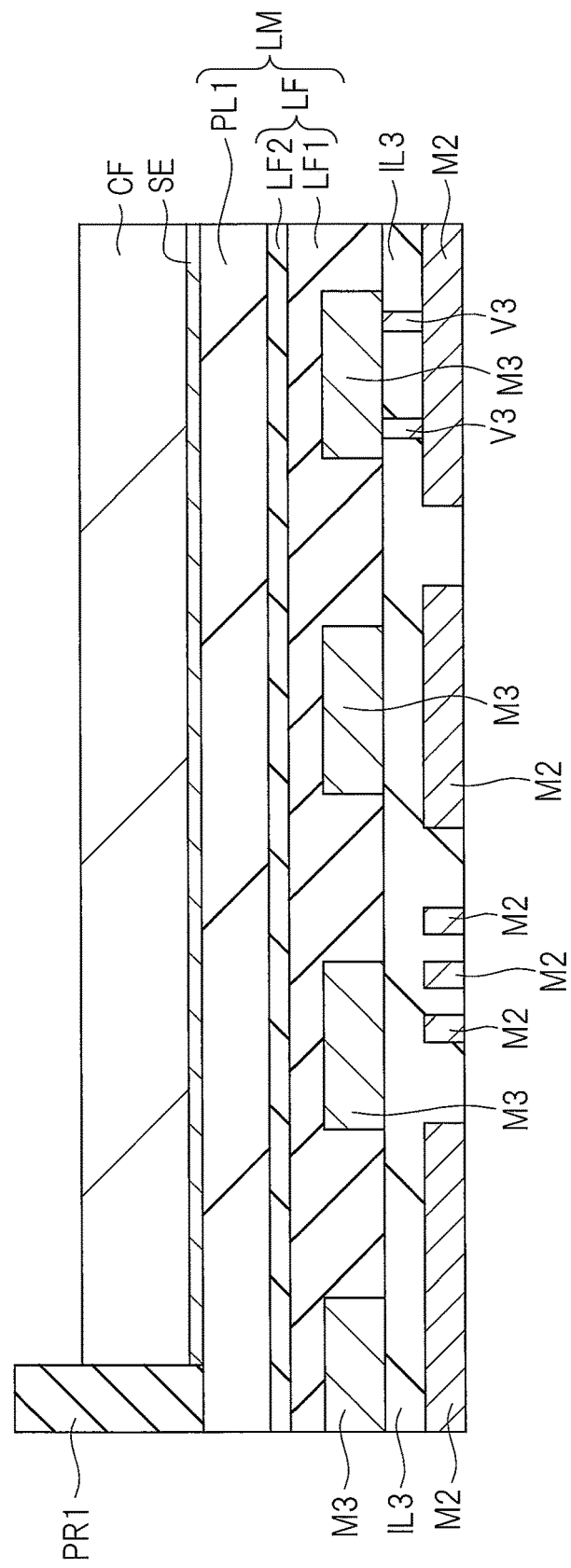
FIG. 14 is a cross-sectional view of the principal part during the manufacturing process of the semiconductor device of FIG. 13.

After the structure of FIG. 11 and FIG. 12 is obtained by the wafer process (pre-treatment) as described above, the probe test is carried out as necessary, and then, as illustrated in FIG. 13 and FIG. 14, a seed film (seed layer) SE is formed over the main surface (entire main surface) of the semiconductor substrate SB, i.e., over the layered film LM and over the pad PD1 exposed in the opening portion OP3 of the layered film LM. The seed film SE is a film functioning as a seed layer (power supply layer) for an electrolytic plating later.

The seed film SE is composed of, for example, a layered film including a chromium (Cr) film and a copper (Cu) film formed over the chromium (Cr) film and can be formed by sputtering, for example. As a result, the seed film SE is formed over the layered film LM as well as over the pad PD1 exposed at the bottom of the opening portion OP3 and the inner wall of the opening portion OP3. Except for the opening portion OP3, a front surface of the layered film LM is the resin film PL1, and therefore, the seed film SE is formed over the resin film PL1 so as to be in contact with the resin film PL1.

A film thickness of the seed film SE can be, for example, substantially 75 nm for the chromium (Cr) film and substantially 250 nm for the copper (Cu) film. Further, the chromium (Cr) film on a lower layer side of the seed film SE can function as a barrier conductor film and for example, has a function of preventing diffusion of copper and a function of improving adhesion to the resin film PL1. However, the seed film SE is not limited to the chromium (Cr) film, and it is also possible to use, for example, a titanium (Ti) film, a titanium tungsten (TiW) film, a titanium nitride (TiN) film, or a tungsten (W) film.

Next, a photoresist pattern PR1 is formed over the seed film SE by photolithography. The photoresist pattern PR1 is formed in a region other than the region where a redistribution wiring RW and a pad PD2 are to be formed, and in the region where the redistribution wiring RW is to be formed and the region where the pad PD2 is to be formed, the seed film SE is exposed. In other words, the photoresist pattern PR1 has an opening portion (trench) in the region where the redistribution wiring RW is to be formed and in the region where the pad PD2 is to be formed.

Next, the copper (Cu) film CF is formed over the seed film SE exposed in the opening portion of the photoresist pattern PR1 by electrolytic plating. As a result, the copper film CF is selectively formed over the seed film SE in the region not covered with the photoresist pattern PR1. A film thickness of the copper film CF can be, for example, substantially 5 to 6 μm. The copper film CF is formed in the region where the redistribution wiring RW is to be formed and the region where the pad PD2 is to be formed. FIG. 13 and FIG. 14 illustrate a case where copper film CF is formed.

Figure 15:
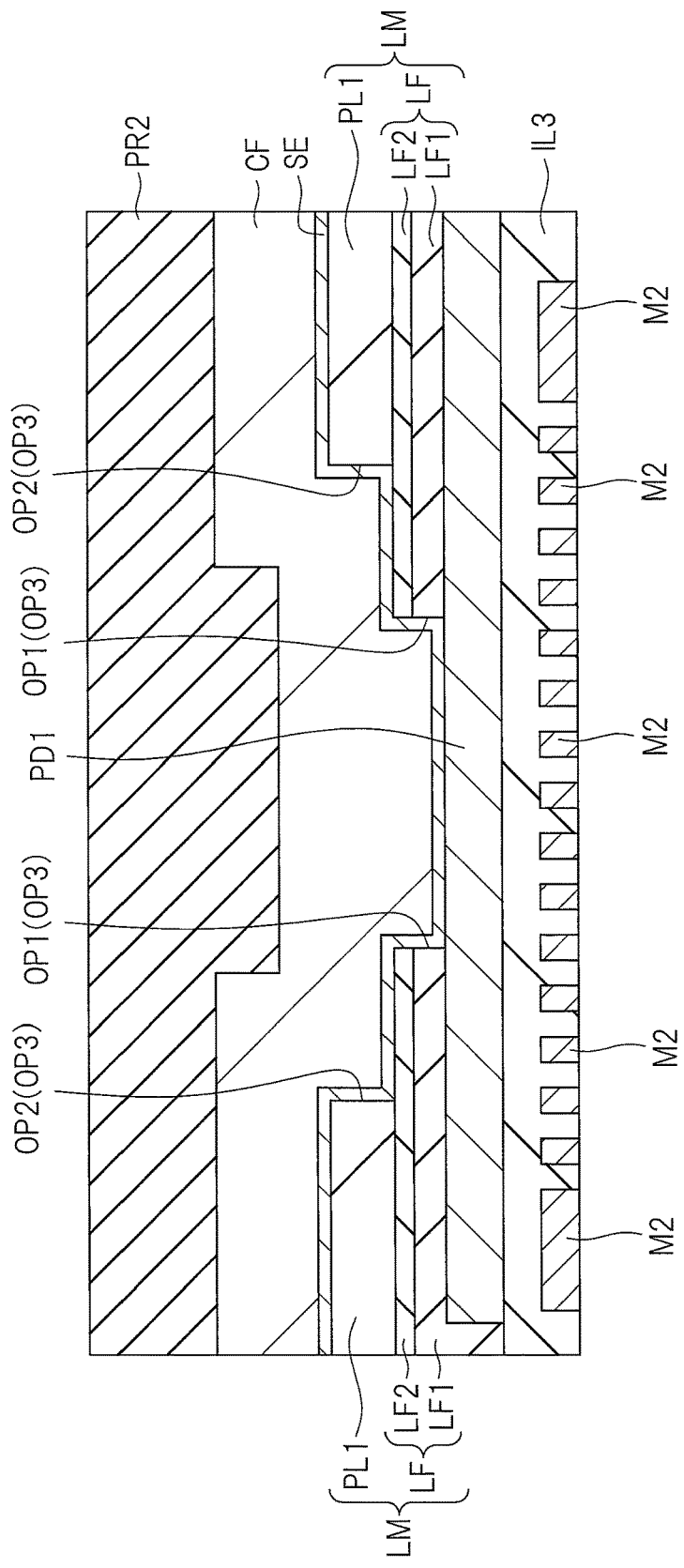
FIG. 15 is a cross-sectional view of the principal part during the manufacturing process of the semiconductor device continued from FIG. 13.
Figure 16:
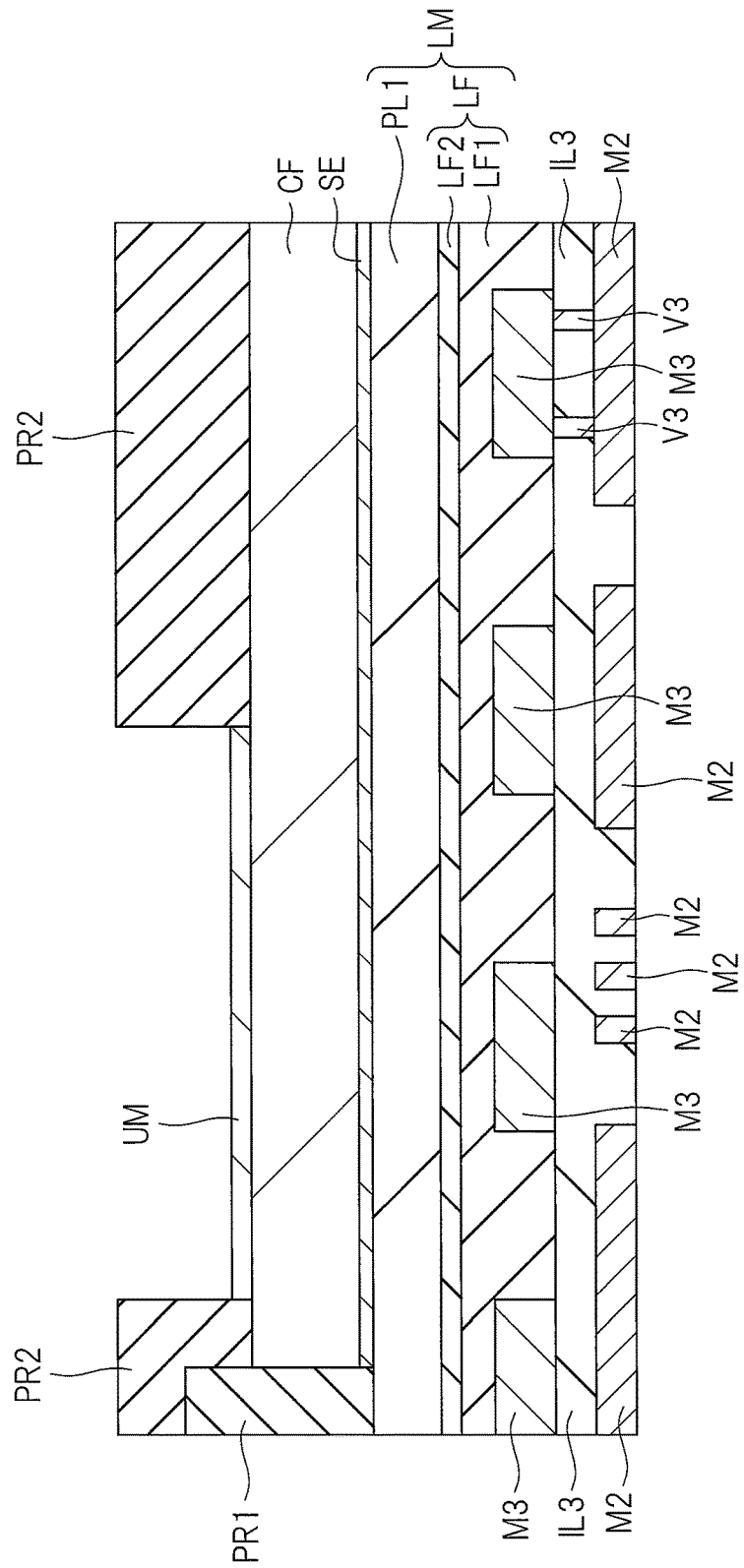
FIG. 16 is a cross-sectional view of the principal part during the manufacturing process of the semiconductor device of FIG. 15.

Next, as illustrated in FIG. 15 and FIG. 16, another photoresist pattern PR2 is formed over the photoresist pattern PR1 including the copper film CF by photolithography. This photoresist pattern PR2 is formed in a region other than the region where an underlying metal film UM in the pad PD2 is to be formed, and the copper film CF is exposed in the region where the underlying metal film UM is to be formed. More specifically, the photoresist pattern PR2 has an opening portion in the region where the underlying metal film UM is to be formed.

Next, the underlying metal film UM is formed over the copper film CF exposed in the opening portion of the photoresist pattern PR2 by electrolytic plating. As a result, the underlying metal film UM is formed over the copper film CF in the region not covered by the photoresist pattern PR2. The underlying metal film UM is formed on a portion of the copper film CF, which is to be the pad PD2. The underlying metal film UM is composed of a layered film including, for example, a nickel (Ni) film and a gold (Au) film formed over the nickel (Ni) film. A film thickness of the underlying metal film UM can be, for example, substantially 2 to 3 μm. FIG. 15 and FIG. 16 illustrate a case where the underlying metal film UM is formed.

Figure 17:
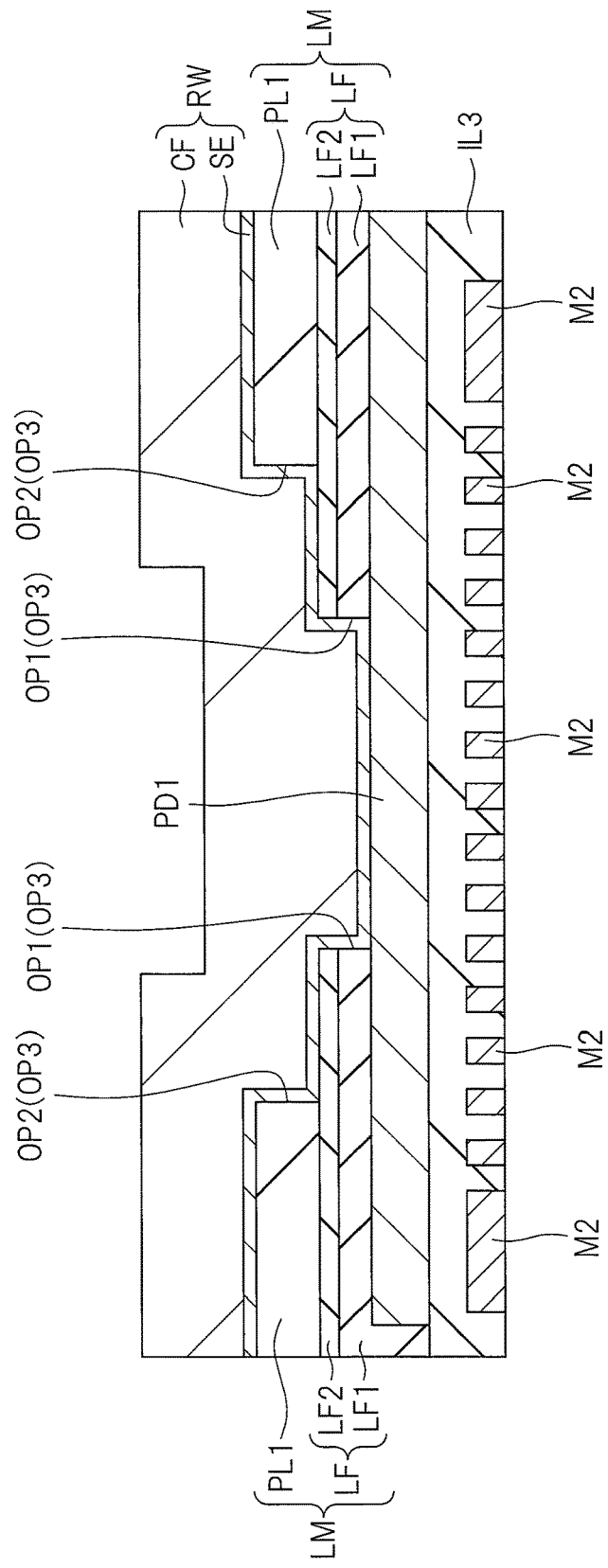
FIG. 17 is a cross-sectional view of the principal part during the manufacturing process of the semiconductor device continued from FIG. 15.
Figure 18:
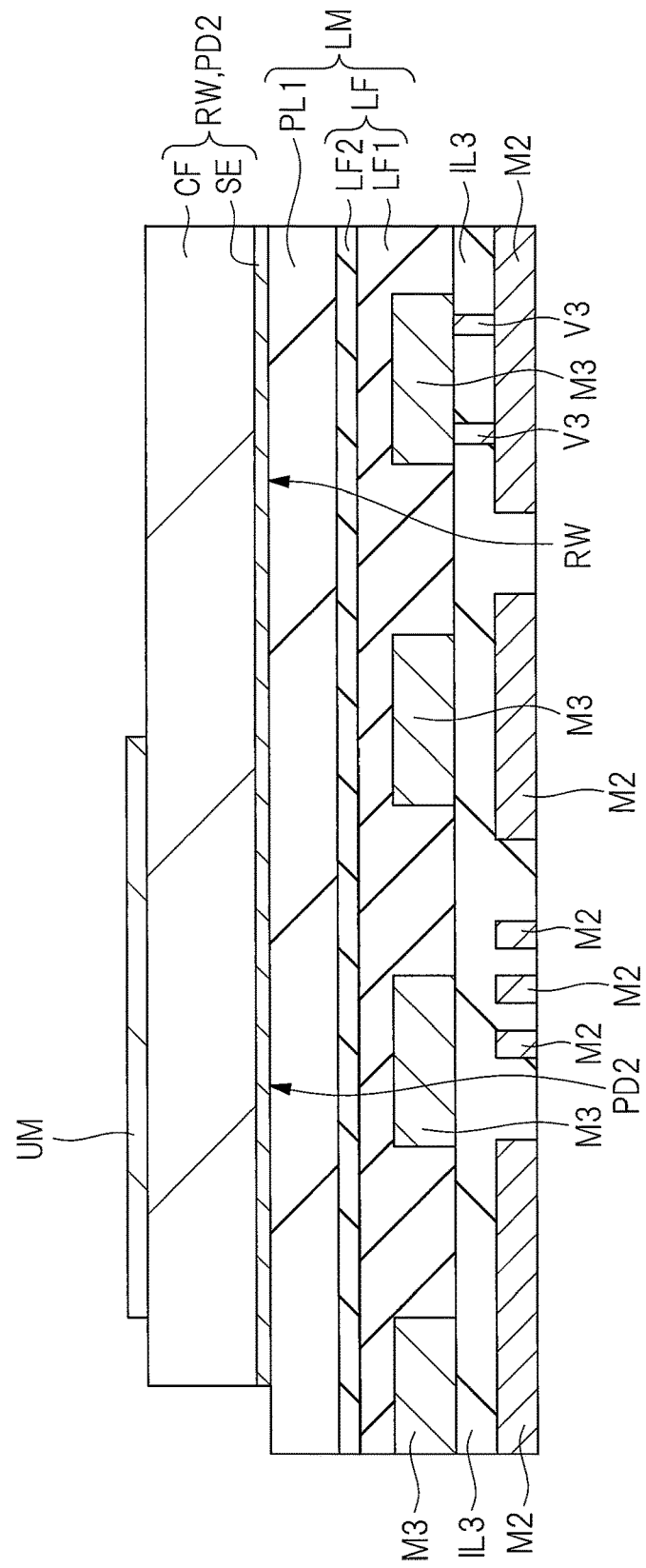
FIG. 18 is a cross-sectional view of the principal part during the manufacturing process of the semiconductor device of FIG. 17.

Next, as illustrated in FIG. 17 and FIG. 18, the photoresist pattern PR2 and the photoresist pattern PR1 are removed. As a result, the copper film CF is exposed, and a portion of the seed film SE, which is not covered with the copper film CF, is also exposed.

In the present embodiment, after the copper film CF is formed, the photoresist pattern PR2 is formed without removing the photoresist pattern PR1, then the underlying metal film UM is formed, and thereafter, the photoresist patterns PR2 and PR1 are removed. In another mode, after forming the copper film CF, the photoresist pattern PR2 can be formed after removing the photoresist pattern PR1, and then, the photoresist pattern PR2 can be removed after forming the underlying metal film UM.

Next, as illustrated in FIG. 17 and FIG. 18, the portion of the seed film SE, which is not covered with the copper film CF, is removed by etching. At this time, a portion of the seed film SE, which is covered with the copper film CF, i.e., the seed film SE located under the copper film CF, is not removed to remain. In this etching, the portion of the seed film SE, which is not covered with the copper film CF, is removed, but the etching is preferably performed to such an extent that the copper film CF and the underlying metal film UM are not excessively etched.

As described above, the redistribution wiring RW and the pad PD2 composed of the seed film SE and the copper film CF are formed. More specifically, the redistribution wiring RW and the pad PD2 are composed of a layered film including the seed film SE and the copper film CF formed over the seed film SE. Therefore, the redistribution wiring RW can be regarded as a copper wiring containing copper (Cu) as a main material, and the pad PD2 can be regarded as a copper pad containing copper (Cu) as a main material.

The redistribution wiring RW and the pad PD2 are formed over the resin film PL1 of the layered film LM. However, the redistribution wiring RW is formed over the layered film LM and over the pad PD1 exposed in the opening portion OP3, and is electrically connected to the pad PD1. The redistribution wiring RW is also connected to the pad PD2, and more specifically, the pad PD2 is formed integrally with the redistribution wiring RW. Therefore, the pad PD1 and the pad PD2 are electrically connected with each other via redistribution wiring RW. The underlying metal film UM is formed over the copper film CF constituting the pad PD2, and this underlying metal film UM can also be regarded as a part of the pad PD2.

Figure 19:
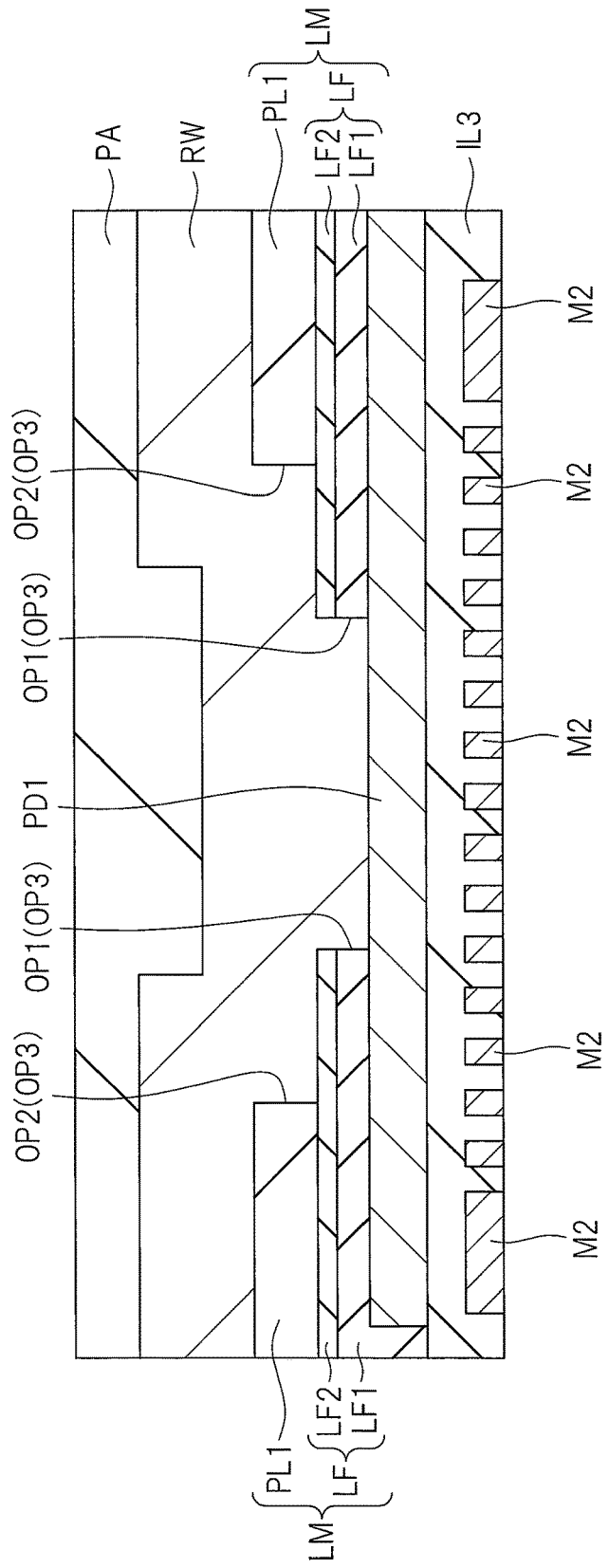
FIG. 19 is a cross-sectional view of the principal part during the manufacturing process of the semiconductor device continued from FIG. 17.
Figure 20:
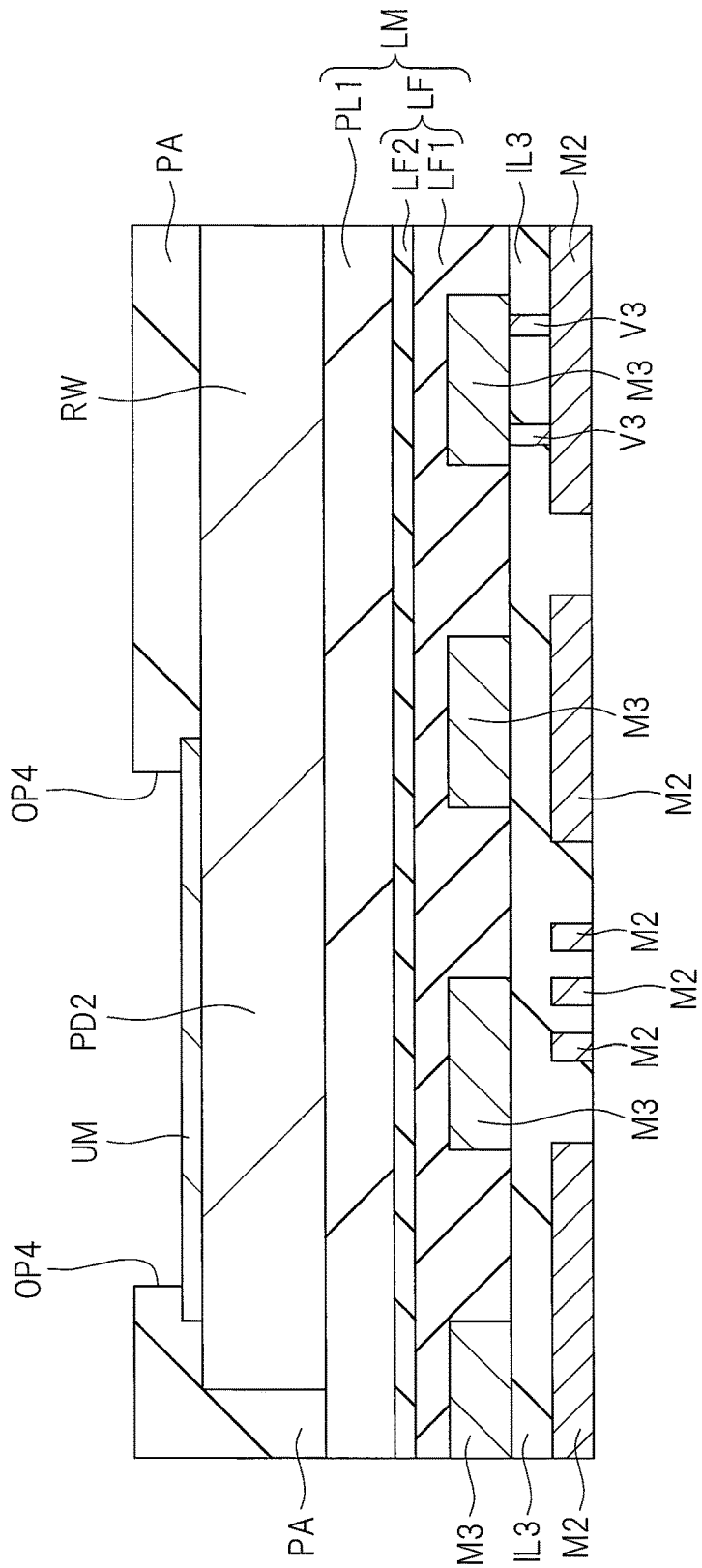
FIG. 20 is a cross-sectional view of the principal part during the manufacturing process of the semiconductor device of FIG. 19.

Next, as illustrated in FIG. 19 and FIG. 20, an insulating protective film PA is formed over the main surface (the whole main surface) of the semiconductor substrate SB, i.e., over the layered film LM so as to cover the redistribution wiring RW and the pad PD2. As the protective film PA, a resin film is preferable, and for example, a polyimide film can be suitably used. In FIG. 19 and FIG. 20, in order to make the drawing easy to see, the redistribution wiring RW and the pad PD2 are illustrated in such a manner that the copper film CF and the seed film SE are integrated without being divided. The protective film PA can be formed by coating, for example, and can be formed by a method similar to that used for the resin film PL1, for example.

Next, an opening portion OP4 is formed in the protective film PA. FIG. 19 and FIG. 20 illustrate a case where the opening portion OP4 is formed in the protective film PA. Note that FIG. 20 is a cross section across the opening portion OP4, but FIG. 19 is a cross section not crossing the opening portion OP4. Accordingly, the opening portion OP4 is illustrated in FIG. 20, but is not illustrated in FIG. 19.

The opening portion OP4 can be formed as follows, for example. More specifically, the protective film PA is formed as a photosensitive resin film, and the protective film PA composed of the photosensitive resin film is exposed and developed to selectively remove a portion of the protective film PA, which is to be the opening portion OP4. Accordingly, the opening portion OP4 is formed in the protective film PA. Thereafter, thermal treatment is applied to cure the protective film PA. The opening portion OP4 is formed to penetrate through the protective film PA, and at least a part of the pad PD2 is exposed in the opening portion OP4. When the underlying metal film UM is formed over the pad PD2, the underlying metal film UM over the pad PD2 is exposed in the opening portion OP4.

In another mode, by using, as an etching mask, a photoresist pattern formed over the protective film PA by photolithography, the protective film PA, is subjected to dry etching, so that the opening portion OP4 can also be formed in the protective film PA. In this case, the protective film PA need not be a photosensitive resin film.

The pad PD2 (or the underlying metal film UM on the pad PD2) is exposed in the opening portion OP4 of the protective film PA, but the redistribution wiring RW is covered and protected with the protective film PA. The uppermost-layer protective film PA is made of a resin film (organic insulation film) such as polyimide film or the like, and this makes it easier to handle the semiconductor device with relatively soft resin film (organic insulation film) as the uppermost layer.

Figure 21:
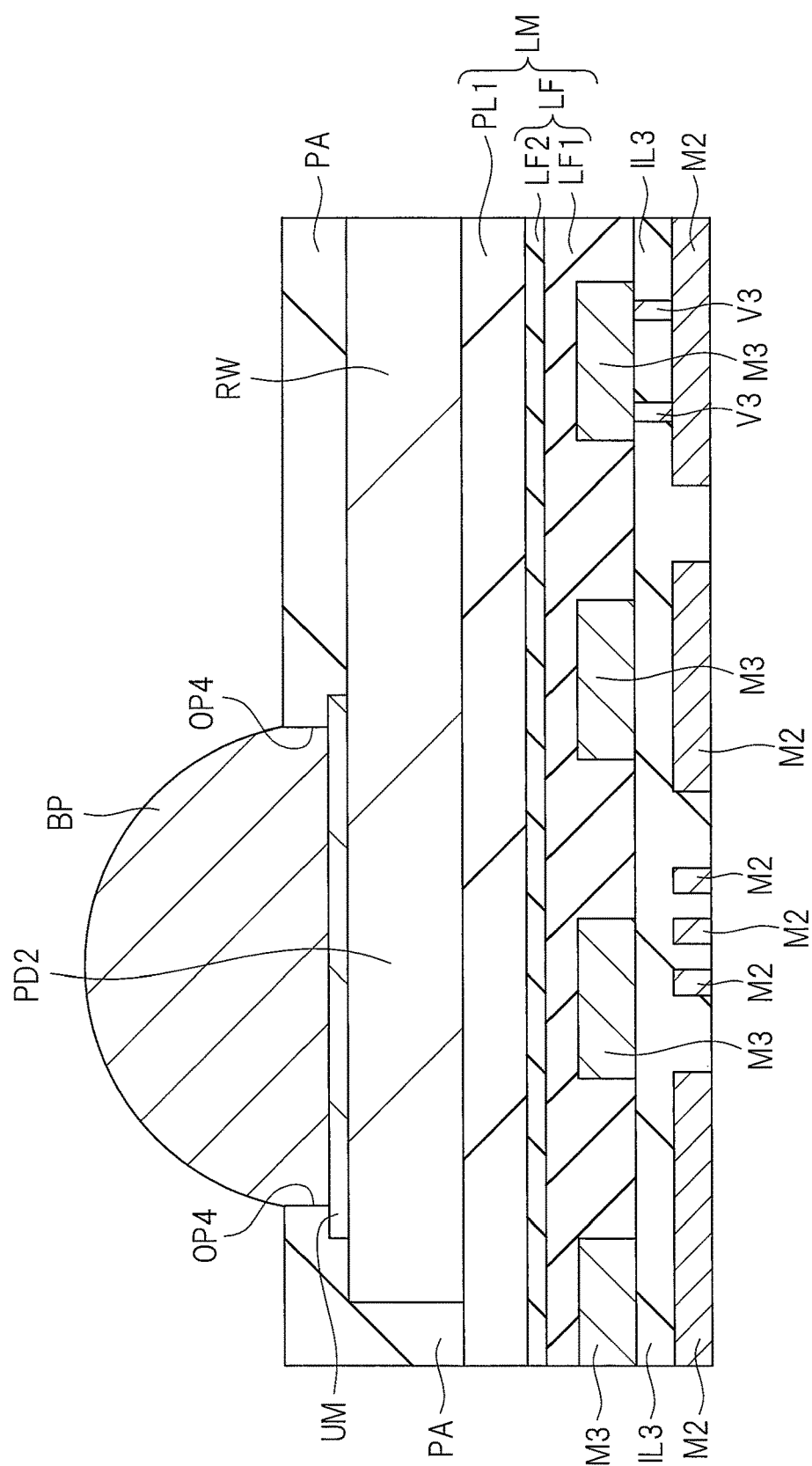
FIG. 21 is a cross-sectional view of the principal part during the manufacturing process of the semiconductor device continued from FIG. 20.

Next, as illustrated in FIG. 21, a bump electrode BP is formed on the underlying metal film UM over the pad PD2 exposed in the opening portion OP4. The bump electrode BP is made of, for example, a solder bump. For example, regarding the solder bump (bump electrode BP), by supplying a solder paste onto the underlying metal film UM over the pad PD2 exposed in the opening portion OP4 by printing and then applying thermal treatment (solder reflow treatment), the spherical solder bump (bump electrode BP) can be formed on the underlying metal film UM. The underlying metal film UM can also be regarded as a part of the bump electrode BP. In another mode, the spherical solder ball is arranged (supplied) on the underlying metal film UM over the pad PD2 exposed in the opening portion OP4 and then, subjected to a thermal treatment (solder reflow treatment), so that the spherical solder bump (bump electrode BP) can also be formed on the underlying metal film UM. Further, in another mode, the bump electrode BP can also be formed by plating.

Thereafter, by performing a dicing process, the semiconductor substrate SB is cut (diced) and divided (singulated) into a plurality of semiconductor chips. More specifically, the semiconductor substrate SB is cut along a scribe region. As a result, a semiconductor chip is acquired from each chip region of the semiconductor substrate SB (semiconductor wafer). Each semiconductor chip corresponds to the semiconductor device CP in each of FIG. 3 and FIG. 4. Before dicing, a back surface of the semiconductor substrate SB may be subjected to grinding, thereby reducing a thickness of the semiconductor substrate SB.

<Structure of Semiconductor Package>

Figure 22:
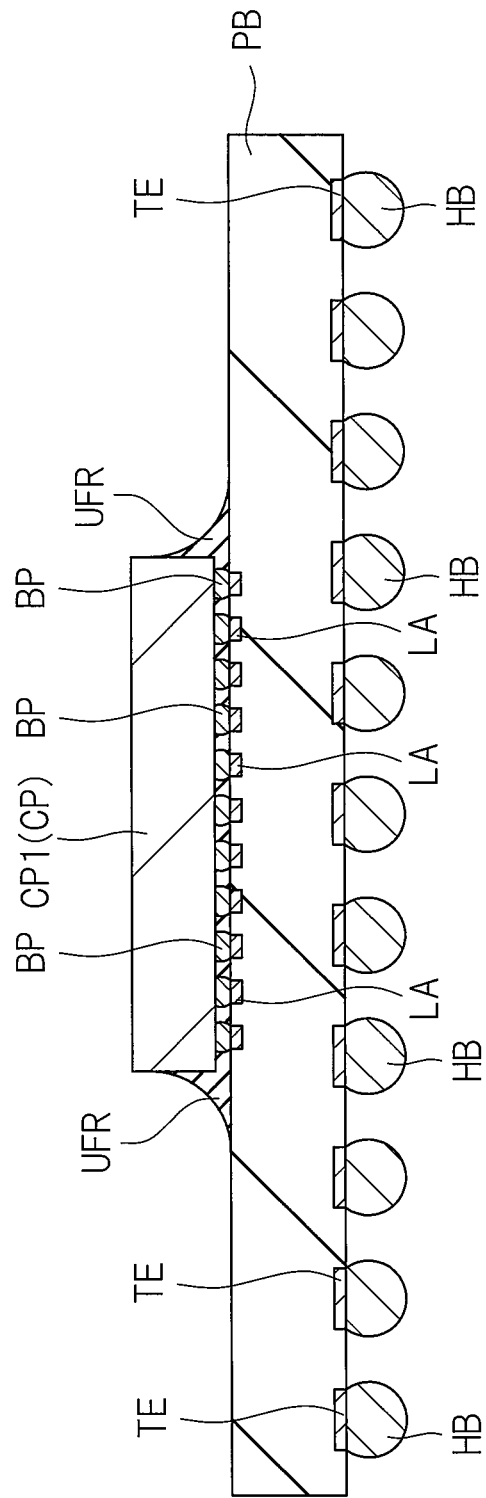
FIG. 22 is a cross-sectional view of a semiconductor package according to the one embodiment.

Next, an example of a semiconductor package (semiconductor device) PKG in which a semiconductor device (semiconductor chip) according to the present embodiment is used will be described with reference to FIG. 22. FIG. 22 is a cross-sectional view of the semiconductor package PKG according to the present embodiment.

As illustrated in FIG. 22, the semiconductor package PKG includes a wiring substrate PB, a semiconductor chip CP1 mounted on an upper surface of the wiring substrate PB, a resin portion (underfill resin) UFR filling a space between the semiconductor chip CP1 and the wiring substrate PB, and a plurality of solder balls HB provided on a lower surface of the wiring substrate PB. The semiconductor chip CP1 corresponds to the semiconductor device (CP) illustrated in FIG. 1 to FIG. 4. Accordingly, the semiconductor chip CP1 has a plurality of bump electrodes BP.

The semiconductor chip CP1 is flip-chip mounted on the upper surface of the wiring substrate PB. More specifically, the semiconductor chip CP1 is mounted on the upper surface of the wiring substrate PB with the plurality of bump electrodes BP interposed therebetween such that a back surface side of the semiconductor chip CP1 faces upward and that a front surface of the semiconductor chip CP1 (a main surface on a bump electrode BP formation side) faces the upper surface of the wiring substrate PB. Therefore, the semiconductor chip CP1 is bonded facedown to the upper surface of the wiring substrate PB. The plurality of bump electrodes BP of the semiconductor chip CP1 are respectively bonded and electrically connected to a plurality of lands (terminals, substrate side terminals, electrodes, or conductive land portions) LA on the upper surface of the wiring substrate PB. More specifically, the pads PD2 of the semiconductor chip CP1 are electrically connected with the plurality of lands LA on the upper surface of the wiring substrate PB via the bump electrodes BP, respectively.

The resin portion UFR serving as an underfill resin is filled between the semiconductor chip CP1 and the upper surface of the wiring substrate PB. The resin portion UFR is made of a resin material (for example, a thermosetting resin material) such as an epoxy resin or a silicone resin, and can also contain a filler (such as silica).

The wiring substrate (package substrate) PB has a planar rectangular shape intersecting a thickness thereof. The wiring substrate (package substrate) PB has the upper surface which is one main surface, and the lower surface which is the other main surface on an opposite side from the upper surface. On the upper surface of the wiring substrate PB, the plurality of lands LA are arrayed in an array corresponding to an array of the bump electrodes BP on the front surface of the semiconductor chip CP1 in a chip mounting region (a region where the semiconductor chip CP1 is mounted). As a result, the semiconductor chip CP1 is flip-chip mounted on the upper surface of the wiring substrate PB, so that the plurality of bump electrodes BP of the semiconductor chip CP1 can be bonded to the plurality of lands LA on the upper surface of the wiring substrate PB, respectively. In a case where the plurality of bump electrodes BP are arranged in an array on the front surface of the semiconductor chip CP1, the plurality of lands LA are arranged in an array in the chip mounting region on the upper surface of the wiring substrate PB.

A plurality of terminals (external connection terminals, electrodes, lands, or conductive land portions) TE are formed on the lower surface of the wiring substrate PB. The plurality of lands LA on the upper surface of the wiring substrate PB and the plurality of terminals TE on the lower surface of the wiring substrate PB are electrically connected to each other via wirings or wiring portions of the wiring substrate PB. On the lower surface of the wiring substrate PB, the plurality of terminals TE are arranged in an array, for example, and the solder balls (ball electrode, projection electrode, or protruding electrode) HB are connected to the terminals TE, respectively. The solder ball HB can function as an external terminal (external connection terminal) of the semiconductor package PKG.

<Wiring Structure Below Pad PD1>

Figure 23:
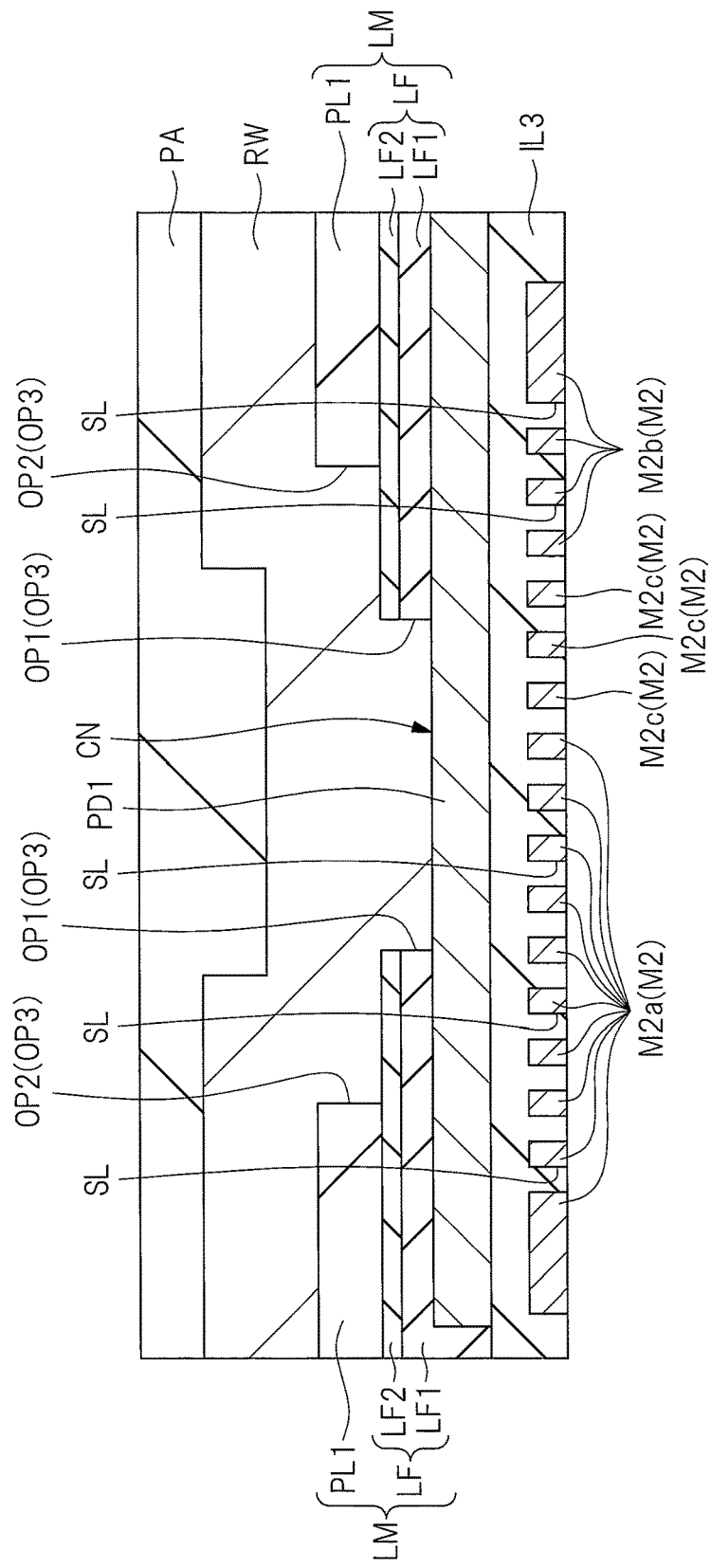
FIG. 23 is a cross-sectional view illustrating a principal part of the semiconductor device according to the one embodiment.
Figure 24:
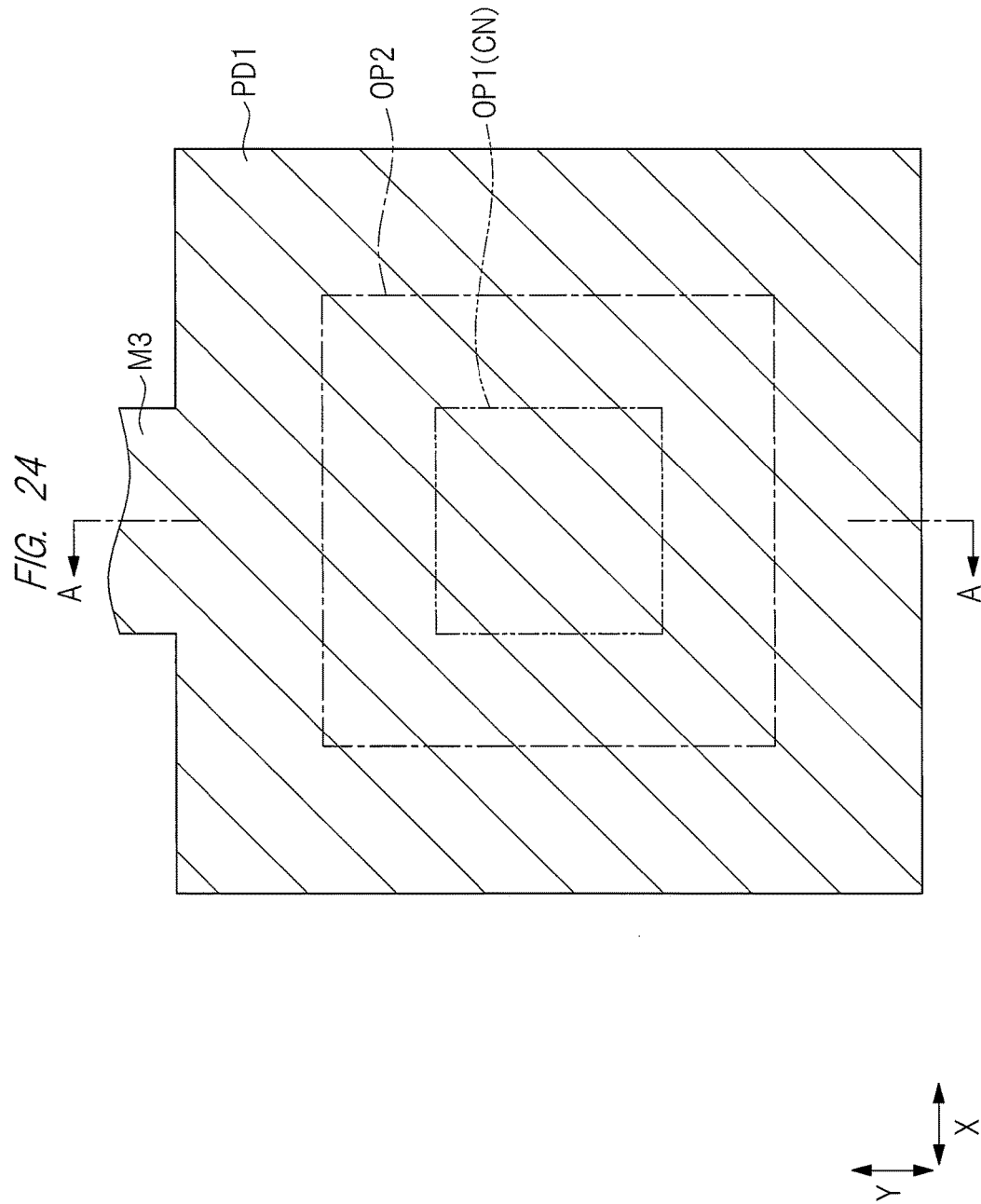
FIG. 24 is a plan view illustrating a principal part of the semiconductor device according to the one embodiment.
Figure 25:
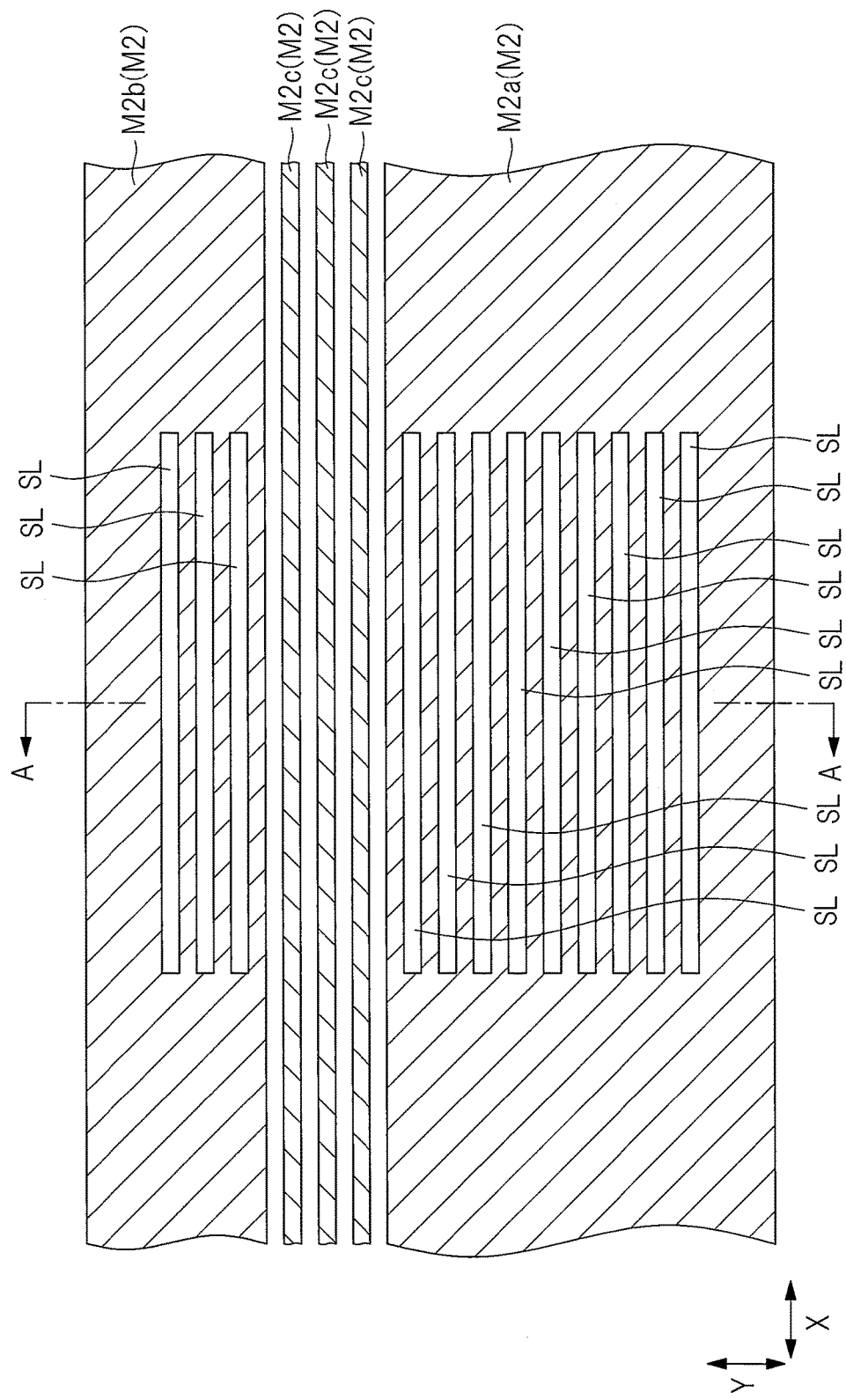
FIG. 25 is a plan view illustrating a principal part of the semiconductor device according to the one embodiment.
Figure 26:
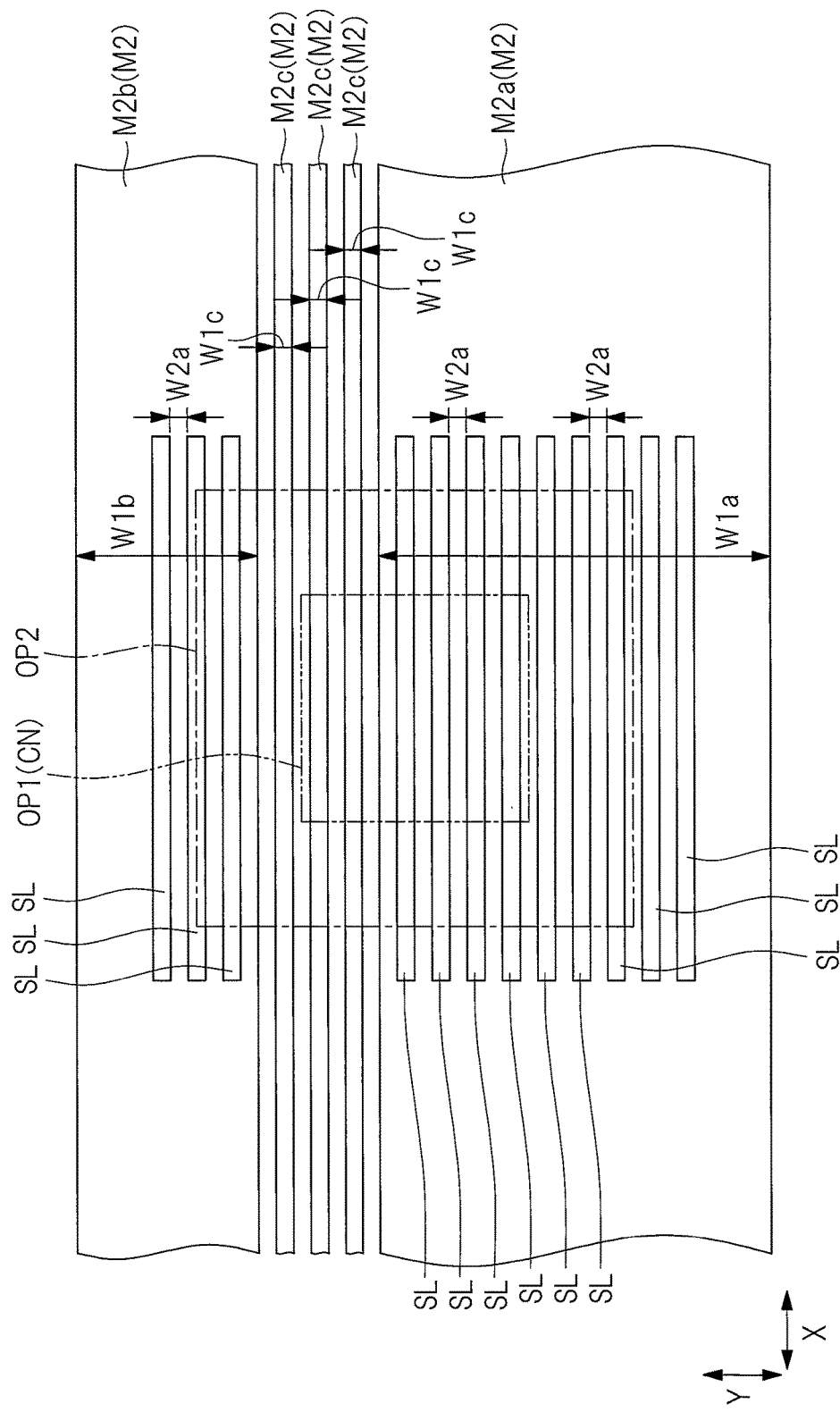
FIG. 26 is a plan view illustrating a principal part of the semiconductor device according to the one embodiment.
Figure 27:
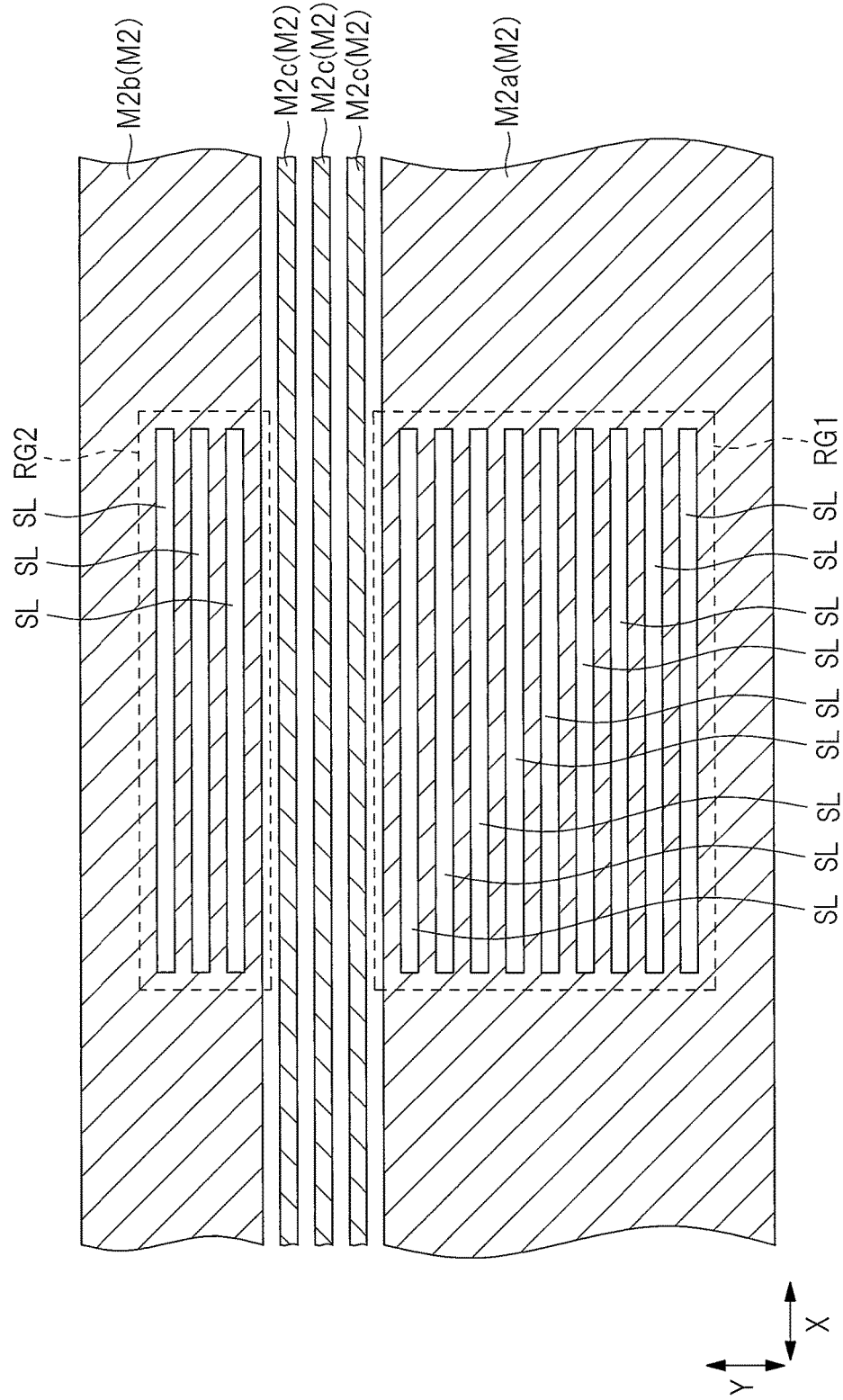
FIG. 27 is a plan view illustrating a principal part of the semiconductor device according to the one embodiment.

FIG. 23 is a cross-sectional view illustrating a principal part of the semiconductor device according to the present embodiment and indicates the same section as FIG. 1. Note that, in FIG. 23, for the sake of simplicity of the drawing, the interlayer insulation film IL2 and the structure under the interlayer insulation film IL2 are not illustrated, but in practice, the interlayer insulation film IL2 and the structure under the interlayer insulation film IL2 illustrated in FIG. 1 are present under the sectional structure of FIG. 23. In addition, FIG. 24 and FIG. 25 are plan views illustrating a principal part of the semiconductor device according to the present embodiment. In FIG. 24 and FIG. 25, the same plane regions are illustrated. However, each of FIG. 24 and FIG. 25 illustrates a different layer. FIG. 24 illustrates the pad PD1, and FIG. 25 illustrates the wiring M2 present in a lower layer than the PAD PD1. FIG. 24 is a plan view, and hatching is given to the pad PD1 and the wiring M3 in order to make the drawing easy to see. Also, FIG. 25 is a plan view, and in order to make the drawing easy to see, the wiring M2 is hatched. The sectional view taken along a line A-A of each of FIG. 24 and FIG. 25 substantially corresponds to both FIG. 1 and FIG. 23. FIG. 26 and FIG. 27 are also plan views illustrating a principal part of the semiconductor device according to the present embodiment and indicate the same plane region as FIG. 25 and the same layer as FIG. 25. FIG. 26 is a diagram provided to see a positional relation between the opening portions OP1 and OP2 and the wiring M2 illustrated in FIG. 25. As compared with FIG. 25, in FIG. 26, hatching is omitted, and positions of the opening portions OP1 and OP2 are additionally illustrated. Also, FIG. 27 is a diagram provided to see opening portion forming regions RG1 and RG2 to be described later. As compared with FIG. 25, in FIG. 27, a dotted line indicating the opening portion forming region RG1 and a dotted line indicating the opening portion forming region RG2 are additionally illustrated. In FIG. 24 and FIG. 26, the position (planar position) of the opening portion OP1 of the insulation film LF is indicated by a two-dot chain line, and the position (planar position) of the opening portion OP2 of the resin film PL1 is indicated by a one-dot chain line.

As can be seen from FIG. 23 and FIG. 24, in plan view, the opening portion OP1 is included in the opening portion OP2, and the opening portion OP2 is included in the pad PD1. In the case of FIG. 24, a planar shape of each of the opening portion OP1, the opening portion OP2, and the pad PD1 is a rectangular shape and more specifically, is a rectangle having a side in an X direction and a side in a Y direction. Note that the X direction and the Y direction illustrated in each plan view are directions substantially parallel to the main surface of the semiconductor substrate SB. Also, the X direction and the Y direction are perpendicular to each other.

As can be seen from FIG. 23 to FIG. 27, the wiring M2 also extends below the pad PD1. In wiring design, when, unlike the present embodiment, a region below the pad PD1 is set as a region prohibiting the arrangement of the wiring M2 and the wiring M2 is to be arranged avoiding the region below the pad PD1, this may reduce a degree of freedom of the wiring design, making it difficult to design the wiring, and the plane size of the semiconductor device may increase. Therefore, in the present embodiment, the region under the pad PD1 is set as the region where the wiring M2 can be arranged. For this reason, the wiring M2 also extends below the pad PD1, and in the case of FIG. 23 to FIG. 27, wirings M2a, M2b, and M2c extending in the X direction pass through the region below the pad PD1.

Each of the wirings M2a, M2b, and M2c is a wiring M2 of a wiring layer (here, the second wiring layer) immediately lower than the wiring layer (in this case, the third wiring layer) in which the pad PD1 is formed. Therefore, the wiring M2a, the wiring M2b, and the wiring M2c are wirings in the same layer. Since each of the wirings M2a, M2b, and M2c extends below the pad PD1, each of the wirings M2a, M2b, and M2c has a portion overlapping with the pad PD1 in plan view. More specifically, at least a part of each of the wirings M2a, M2b, and M2c overlaps with the pad PD1 in plan view.

Of the wirings M2a, M2b, and M2c, each of the wirings M2a and M2b has a plurality of opening portions SL below the pad PD1. Of the wirings M2a, M2b, and M2c, the wiring M2c does not have the opening portion (SL) below the pad PD1. In the case of FIG. 23 to FIG. 27, in each of the wirings M2a and M2b, each opening portion SL is a slit-shaped opening portion extending along an extending direction of the wiring (here, the X direction).

When a width W1a of the wiring M2a in a case where it is assumed that the plurality of opening portions SL are not formed in the wiring M2a, a width W1b of the wiring M2b in a case where it is assumed that the plurality of opening portions SL are not formed in the wiring M2b, and a width W1c of the wiring M2c are compared, each of the widths W1a and W1b are larger than the width W1c, and the width W1a is larger than the width W1b, whereby the relation W1a>W1b>W1c is satisfied. More specifically, the wiring M2a and the wiring M2b correspond to wirings having a large width and provided with the plurality of opening portions SL. The wiring M2c corresponds to a wiring having a small width and not provided with an opening portion (SL). Note that a "wiring width" corresponds to a dimension (width) in a direction substantially perpendicular to a current direction (a direction in which current flows) in the wiring. In FIG. 26, since the current direction in each of the wirings M2a, M2b, and M2c is the X direction, any of the widths W1a, W1b, and W1c is the dimension in the Y direction.

As can be seen from FIG. 25 and FIG. 26, in plan view, at least a part of the wiring M2a overlaps with the opening portion OP1 and therefore, overlaps with a connection region CN between the pad PD1 and the redistribution wiring RW. An end portion (side surface) of the wiring M2a is positioned below the connection region CN between the pad PD1 and the redistribution wiring RW.

Here, the connection region CN between the pad PD1 and the redistribution wiring RW is the region where the pad PD1 and the redistribution wiring RW are connected. Since the redistribution wiring RW is formed over the pad PD1 exposed in the opening portion OP1 of the insulation film LF, the upper surface of the pad PD1 exposed in the opening portion OP1 of the insulation film LF corresponds to the connection region CN between the pad PD1 and the redistribution wiring RW. Therefore, in plan view, the connection region CN between the pad PD1 and the redistribution wiring RW substantially coincides with the opening portion OP1 of the insulation film LF.

As can be seen from FIG. 25 and FIG. 26, in plan view, at least a part of the wiring M2b overlaps with the opening portion OP2, but the wiring M2b does not overlap with the opening portion OP1, and therefore, the wiring M2b does not overlap with the connection region CN between the pad PD1 and the redistribution wiring RW. An end portion (side surface) of the wiring M2b is located below the opening portion OP2, but the end portion (side surface) of the wiring M2b is not located below the connection region CN.

As can be seen from FIG. 25 and FIG. 26, three wirings M2c pass below the pad PD1, and two wirings M2c (two wirings M2c on a side close to the wiring M2a) thereof at least partly overlaps with the opening portion OP1 in plan view and therefore, overlaps with the connection region CN between the pad PD1 and the redistribution wiring RW. End portions (side surfaces) of the two wirings M2c are located below the connection region CN. Note that the number of wirings M2c is not limited to three.

In addition, as can be seen from FIG. 25 and FIG. 26, one wiring M2c (one wiring M2c on a side close to the wiring M2b) of the three wirings M2c passing below the pad PD1 at least partly overlaps with the opening portion OP2 but does not overlap with the opening portion OP1 and does not overlap with the connection region CN. The end portion (side surface) of the one wiring M2c is located below the opening portion OP2 but is not located below the connection region CN.

For this reason, the wiring M2a and the two wirings M2c are wirings in which the end portions (end portions of the wirings M2a and M2c) are located below the opening portion OP1 and therefore, below the connection region CN. Also, the wiring M2b and the single wiring M2c are such wirings that the end portions (the end portions of the wirings M2b and M2c) are not located below the opening portion OP1, but the end portions (the end portions of the wiring M2b and M2c) are located below the opening portion OP2.

In the present embodiment, although the details will be described later, a plurality of opening portions SL are provided in each of the wirings M2a and M2b in order to suppress or prevent occurrence of a crack in the interlayer insulation film IL3 sandwiched between each of the wirings M2a and M2b and the pad PD1. Meanwhile, since the width (W1c) of the wiring M2c is small, there is a small concern that a crack may occur in the interlayer insulation film IL3 sandwiched between the wiring M2c and the pad PD1 without forming the opening portion (SL) in the wiring M2c, so that reduction in resistance of the wiring M2c is achieved without forming the opening portion (SL) in the wiring M2c. The reasons for forming the opening portion SL and the location where the opening portion SL should be formed will be described in the following sections "Background of Study" and "Main Features and Effects."

<Background of Study>

The inventors of the present invention have studied a semiconductor device in which a redistribution wiring is formed after a pad is formed. Through the study of the inventors of the present invention, it became clear that, in such a semiconductor device, there is a possibility that a crack may occur in the interlayer insulation film (IL3) under the pad (PD1) due to pressure (stress) applied to the pad (PD1) through the redistribution wiring (RW). This will be described in detail with reference to FIG. 28 to FIG. 30.

Figure 28:
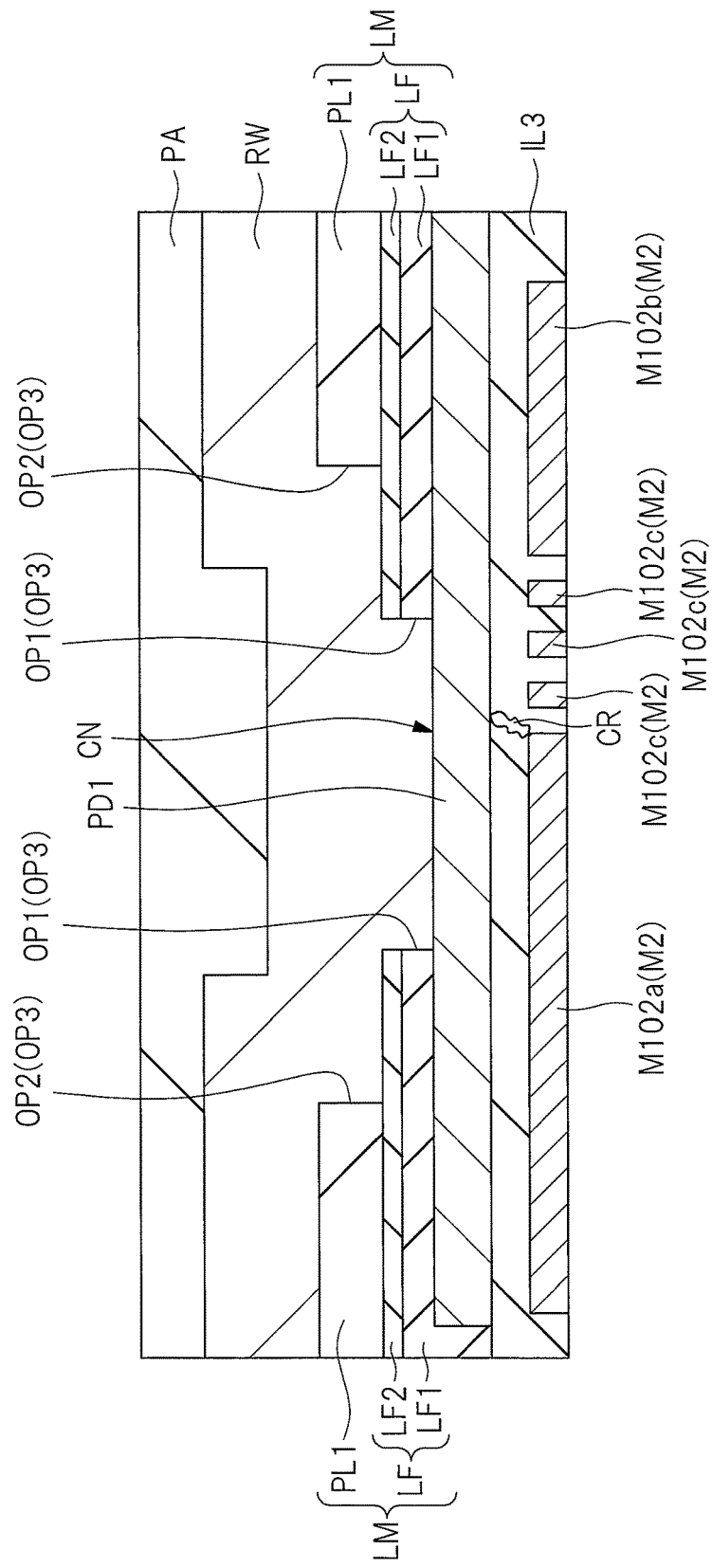
FIG. 28 is a cross-sectional view illustrating a principal part of a semiconductor device according to a study example.
Figure 29:
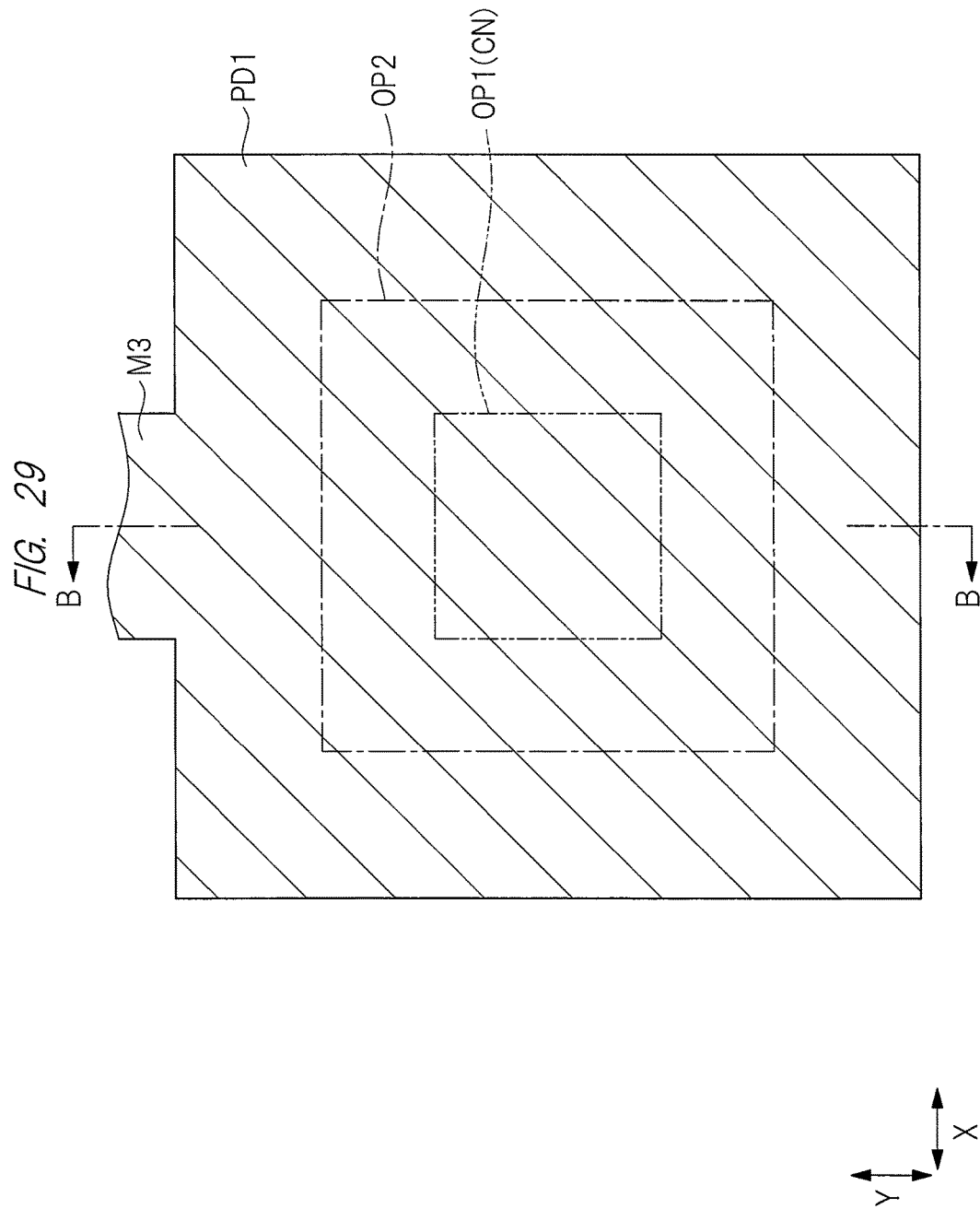
FIG. 29 is a plan view illustrating a principal part of the semiconductor device according to the study example.
Figure 30:
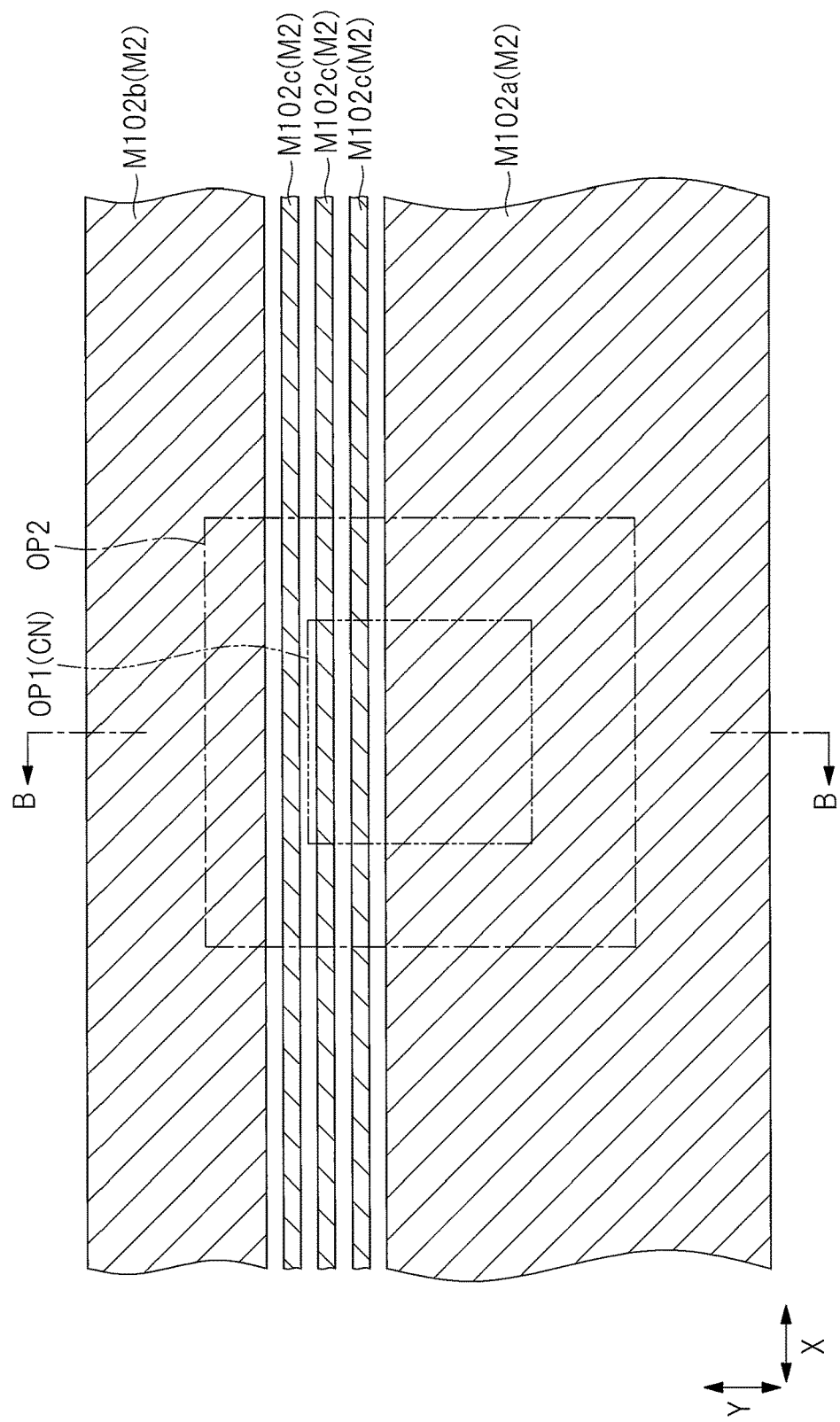
FIG. 30 is a plan view illustrating a principal part of the semiconductor device according to the study example.

FIG. 28 is a cross-sectional view illustrating a principal part of a semiconductor device according to a study example studied by the present inventors and corresponds to FIG. 23. Similarly to FIG. 23, also in FIG. 28, the interlayer insulation film IL2 and the structure under the interlayer insulation film IL2 are not illustrated. Also, FIG. 29 and FIG. 30 are plan views illustrating a principal part of the semiconductor device according to the study example studied by the present inventors and correspond to FIG. 24 and FIG. 25, respectively. FIG. 29 illustrates the pad PD1, and FIG. 30 illustrates the wiring M2 in a lower layer than the PAD PD1. In order to make the drawing easy to see, hatching is given to the pad PD1 and the wiring M3 in FIG. 29 and the wiring M2 in FIG. 30. The sectional view taken along a line B-B of each of FIG. 29 and FIG. 30 substantially corresponds to FIG. 28. Also, in FIG. 29 and FIG. 30, a position of the opening portion OP1 of the insulation film LF is indicated by a two-dot chain line, and a position of the opening portion OP2 of the resin film PL1 is indicated by a one-dot chain line.

In the study example of FIG. 28 to FIG. 30, a wiring M102a corresponds to the wiring M2a, a wiring M102b corresponds to the wiring M2b, and a wiring M102c corresponds to the wiring M2c. However, unlike the wirings M2a and M2b, the opening portions SL are not formed in the wirings M102a and M102b. More specifically, the case where the opening portions SL are not formed in the wirings M2a and M2b in FIG. 23 to FIG. 27 corresponds to the study example of FIG. 28 to FIG. 30. The wiring M102a is similar to the wiring M2a except that the wiring M102a does not have the opening portion SL, the wiring M102b is similar to the wiring M2b except that the wiring M102b does not have the opening portion SL, and the wiring M102c is the same wiring as the wiring M2c.

In the case of the study example of FIG. 28 to FIG. 30, a crack CR tends to occur in the interlayer insulation film IL3 between the pad PD1 and the wiring M2. The reason is as follows.

Since the redistribution wiring RW is formed over the pad PD1, pressure (stress) is applied to pad PD1 through the redistribution wiring RW. This is because, when the semiconductor device (CP) is mounted on the wiring substrate (PB) or the like, the bump electrode BP of the semiconductor device is connected to the terminal (land LA) of the wiring substrate (PB), and the stress caused by the thermal shrinkage of the wiring substrate (PB) is applied to the redistribution wiring RW through the bump electrode BP and further applied to the pad PD1 through the redistribution wiring RW. Since the metal material has a larger coefficient of thermal expansion than the insulation material and a thickness of the redistribution wiring RW is considerably large, the pressure (stress) caused by the redistribution wiring RW is likely to be applied to the pad PD1.

When the pressure (stress) is applied to the pad PD1 through the redistribution wiring RW, the crack CR may occur in the interlayer insulation film IL3 sandwiched between the pad PD1 and the wiring M2. According to the study of the inventors of the present invention, it became clear that the crack CR in the interlayer insulation film IL3 sandwiched between the pad PD1 and the wiring M2 occurs when the following two factors (the first factor and the second factor) are satisfied.

The first factor is that the end portion of the wiring M2 (here, the wiring M102a) is present below the connection region CN between the pad PD1 and the redistribution wiring RW, and the second factor is that the width (wiring width) of the wiring M2 (here, the wiring M102a) is large.

In the pad PD1, the pressure (stress) applied through the redistribution wiring RW is large in the connection region CN and the region therebelow. This is because the pressure (stress) is transmitted from the redistribution wiring RW to the pad PD1 via the connection region CN between the pad PD1 and the redistribution wiring RW. More specifically, in the pad PD1, a large pressure (stress) is directly transmitted from the redistribution wiring RW to the connection region CN and the region therebelow.

The end portion (the end portion of the wiring M102a) of the wiring M102a is present below the connection region CN. In a case where the end portion of the wiring M2 (here, the end portion of the wiring M102a) is present below the connection region CN, the crack CR may occur in the interlayer insulation film IL3 sandwiched by a corner portion (a corner portion formed of an upper surface and a side surface of the wiring) constituting the end portion of the wiring M102a and the pad PD1, starting from the corner portion of the wiring M102a. This is because the pressure (stress) applied to the pad PD1 through the redistribution wiring RW is applied to the interlayer insulation film IL3 below the connection region CN and because the stress applied to the interlayer insulation film IL3 due to the wiring M102a is concentrated on the corner portion constituting the end portion of the wiring M102a.

The stress applied to the interlayer insulation film IL3 due to the wiring M2 may be generated due to the thermal shrinkage of the wiring M2 and the like, and a magnitude of the stress tends to increase as the width of the wiring M2 is larger. More specifically, when the wiring M2 having a large width and the wiring M2 having a small width are compared, an amount of thermal shrinkage becomes larger in the wiring M2 having a large width than in the wiring M2 having a small width. Therefore, the stress applied to the interlayer insulation film IL3 due to the wiring M2 is larger in the wiring M2 having a large width than in the wiring M2 having a small width. Accordingly, a possibility that the crack CR may occur in the interlayer insulation film IL3, starting from the corner portion constituting the end portion of the wiring M2, is greater as the stress applied to the interlayer insulation film IL3 due to the wiring M2 becomes larger. Therefore, the possibility that the crack CR may occur in the interlayer insulation film IL3, starting from the corner portion constituting the end portion of the wiring M2, increases as the width of the wiring M2 becomes larger.

Therefore, if the end portion of the wiring M2 is present below the connection region CN, there is a possibility that the crack CR may occur in the interlayer insulation film IL3 sandwiched between the wiring M2 and the pad PD1, starting from the corner portion constituting the end portion of the wiring M2. If the width of the wiring M2 is small, the possibility is low. If the width of the wiring M2 is large, the possibility increases. More specifically, if the end portion of the wiring M102a having a large width is present below the connection region CN, a large stress is applied to the interlayer insulation film IL3 sandwiched between the corner portion constituting the end portion of the wiring M102a and the pad PD1, so that the crack CR tends to occur starting from the corner portion of the wiring M102a. The occurrence of the crack CR in the interlayer insulation film IL3 leads to degradation of reliability of the semiconductor device. Therefore, in order to improve reliability of the semiconductor device, it is desirable to suppress or prevent occurrence of the crack CR in the interlayer insulation film IL3.

Therefore, the first solution and the second solution in the following are conceivable as the solution for suppressing or preventing occurrence of the crack CR in the interlayer insulation film IL3.

The first solution is to prevent the end portion of the wiring M2 from being present below the connection region CN between the pad PD1 and the redistribution wiring RW. In this case, since the end portion (corner portion) of the wiring M2 which can be the starting point of the crack CR is not present in the region (region below the connection region CN) where the pressure from the redistribution wiring RW is easily transmitted, occurrence of the crack CR in the interlayer insulation film IL3 can be suppressed or prevented.

However, when the first solution is adopted, the entire region under the connection region CN is a region prohibiting arrangement of the end portion of the wiring M2, and therefore, a degree of freedom of layout of the wiring M2 is reduced, thereby making it difficult to design the wiring of the semiconductor device. When the wiring M2 is arranged to avoid the region below the connection region CN in order to adopt the first solution, this is disadvantageous to reduction in the size of the semiconductor device, resulting in an increase in the plane size of the semiconductor device.

The second solution is to arrange only the signal wiring having a small width below the connection region CN without arranging the ground wiring having a large width or the like. In this case, the end portion (corner portion) of the wiring M2 is present in the region (region below the connection region CN) where the pressure from the redistribution wiring RW is easily transmitted, but since the width of the wiring M2 is small, the crack CR is less likely to occur, starting from the end portion (corner portion) of the wiring M2, and occurrence of the crack CR in the interlayer insulation film IL3 can be suppressed or prevented.

However, in a case where the second solution is adopted, the entire region below the connection region CN becomes a region prohibiting the arrangement of the end portion of the wiring M2 having a large width such as the ground wiring, and this reduces the degree of freedom of the layout of the wiring M2, thereby making it difficult to design the wiring of the semiconductor device. When the wiring M2 having a large width such as the ground wiring is arranged to avoid the region below the connection region CN in order to adopt the second solution, this is disadvantageous to reduction in the size of the semiconductor device, resulting in an increase in the plane size of the semiconductor device.

Therefore, it is desirable to provide a technique capable of suppressing or preventing occurrence of the crack CR in the interlayer insulation film IL3 and improving the degree of freedom of the layout of the wiring M2 which is present in a lower layer than the pad PD1.

<Main Features and Effects>

The semiconductor device according to the present embodiment includes the semiconductor substrate SB, the wiring M2a (first wiring) formed over the semiconductor substrate SB via the interlayer insulation film IL2 (first interlayer insulation film), the interlayer insulation film IL3 (second interlayer insulation film) formed over the interlayer insulation film IL2 so as to cover the wiring M2a, and the pad PD1 (first pad) formed over the interlayer insulation film IL3. The semiconductor device according to the present embodiment further includes the layered film LM (first insulation film) formed over the interlayer insulation film IL3 and having the opening portion OP3 (first opening portion) in which the pad PD1 is exposed. The semiconductor device according to the present embodiment further includes the redistribution wiring RW (second wiring) formed over the layered film LM and over the pad PD1 exposed in the opening portion OP3 and electrically connected to the pad PD1, and the pad PD2 (second pad) formed over the layered film LM and integrally connected to the redistribution wiring RW.

One of the main features of the present embodiment is that at least a part of the wiring M2a (the first wiring) overlaps with the pad PD1 in plan view and the end portion of the wiring M2a is located below the connection region CN between the pad PD1 and the redistribution wiring RW. The other of the main features of the present embodiment is that the plurality of opening portions SL (second opening portions) are formed in the opening portion forming region RG1 (first region) in the wiring M2a, and at least a part of the opening portion forming region RG1 overlaps with the connection region CN between the pad PD1 and the redistribution wiring RW in plan view.

Note that the opening portion forming region RG1 corresponds to the region where the plurality of opening portions SL are formed in the wiring M2a and the opening portion forming region RG2 corresponds to the region where the plurality of opening portions SL are formed in the wiring M2b. More specifically, as illustrated in FIG. 27, the opening portion forming region RG1 substantially corresponds to the region obtained by combining the plurality of opening portions SL formed in the wiring M2a and the regions (wiring portions between adjacent opening portions SL) between the opening portions SL. The opening portion forming region RG2 substantially corresponds to the region obtained by combining the plurality of opening portions SL formed in the wiring M2b and the regions (wiring portions between adjacent opening portions SL) between the opening portions SL.

In the present embodiment, at least a part of the wiring M2a overlaps with the pad PD1 in plan view, and the end portion of the wiring M2a is located below the connection region CN between the pad PD1 and the redistribution wiring RW (see FIG. 23 to FIG. 27). Unlike the present embodiment, in a case where the opening portions SL are not formed in the wiring M2a, as described in connection with the study examples in FIG. 28 to FIG. 30 describe above, a pressure (stress) is applied to the pad PD1 through the redistribution wiring RW, and there is a possibility that the crack CR may occur in the interlayer insulation film IL3 sandwiched between the pad PD1 and the wiring M102a. This is because the end portion of the wiring M102a is present below the connection region CN and the width of the wiring M102a is large, as described in connection with the above study example.

In contrast, in the present embodiment, the end portion of the wiring M2a is present below the connection region CN. However, the opening portion forming region RG1 of the wiring M2a has a plurality of opening portions SL formed therein and at least a part of the opening portion forming region RG1 overlaps with the connection region CN in plan view. As a result, even if at least a part of the wiring M2a overlaps with the pad PD1 in plan view and the end portion of the wiring M2a is located below the connection region CN, it is possible to suppress or prevent occurrence of the crack CR or equivalent thereof in the interlayer insulation film IL3 sandwiched between the pad PD1 and the wiring M2a. The reason will be described below.

As described in connection with the above study example, if the end portion of the wiring M2 having a large width is present below the connection region CN between the pad PD1 and the redistribution wiring RW, a large stress is applied to the interlayer insulation film IL3 sandwiched between the corner portion constituting the end portion of the wiring M2 and the pad PD1, and the crack CR is likely to occur, starting from the end portion (corner portion) of the wiring M2. This is because the pressure (stress) applied to the pad PD1 through the redistribution wiring RW is applied to the interlayer insulation film IL3 below the connection region CN and the stress applied to the interlayer insulation film IL3 due to the wiring M2 is concentrated on the corner portion constituting the end portion of the wiring M2. The magnitude of the stress applied to the interlayer insulation film IL3 due to the wiring M2 increases as the width of the wiring M2 increases and decreases as the width of the wiring M2 decreases. In a case where the end portion of the wiring M2 is present below the connection region CN, the possibility that the crack CR may occur in the interlayer insulation film IL3, starting from the end portion (corner portion) of the wiring M2, is reduced as the stress applied to the interlayer insulation film IL3 due to the wiring M2 is reduced, and therefore, the possibility that the crack CR may occur in the interlayer insulation film IL3, starting from the end portion (corner portion) of the wiring M2, is reduced when the effective width of the wiring M2 is reduced.

Forming the opening portions SL in the wiring M2 corresponds to reducing the effective wiring width of the wiringM2. Therefore, forming the opening portions SL in the wiring M2 act such that the effective wiring width of the wiring M2 is reduced and the stress applied to the interlayer insulation film IL3 due to the wiring M2 is reduced. Also, if the opening portions SL are formed in the wiring M2, the interlayer insulation film IL3 is also embedded in the opening portion SL, so that the interlayer insulation film IL3 embedded in the opening portion SL can act so as to suppress the deformation of the wiring M2. This also acts so as to reduce the stress applied to the interlayer insulation film IL3 due to the wiring M2. Therefore, when the opening portions SL are formed in the wiring M2, the stress applied to the interlayer insulation film IL3 due to the wiring M2 can be reduced as compared with the case where the opening portion SL is not formed in the wiring M2. Therefore, in a case where the end portion of the wiring M2 is present below the connection region CN, the possibility that the crack CR may occur in the interlayer insulation film IL3, starting from the end portion (corner portion) of the wiring M2, can be reduced by forming the opening portions SL in the wiring M2. For this reason, as compared with the study examples of FIG. 28 to FIG. 30, the present embodiment illustrated in FIG. 23 to FIG. 27 has the plurality of opening portions SL formed in the wiring M2a, so that it is possible to suppress or prevent occurrence of the crack in the interlayer insulation film IL3 sandwiched between the pad PD1 and the wiring M2a (M102a). Therefore, reliability of the semiconductor device can be improved.

In addition, in the present embodiment, the region below the pad PD1 is not required to be set as the region prohibiting the arrangement of the wiring M2, and the wiring M2 can be freely arranged below the pad PD1, so that the degree of freedom in the layout of the wiring M2 can be improved. In addition, it is advantageous to reduce the size of the semiconductor device.

In the present embodiment, the opening portions SL are provided in the wiring M2, but it is extremely important in what region the opening portions SL are provided. The region to be provided with the opening portions SL will be described below.

As described above, in the interlayer insulation film IL3, the region where the pressure (stress) transmitted from the redistribution wiring RW to the pad PD1 is easily transmitted is the region below (directly below) the connection region CN. Therefore, in order to prevent the crack (CR) from occurring in the interlayer insulation film IL3, it is effective to reduce the stress applied to the interlayer insulation film IL3 due to the wiring M2 in the region below the connection region CN. In order to reduce the stress applied to the interlayer insulation film IL3 due to the wiring M2 below the connection region CN, it is effective to provide the opening portions (SL) in the wiring M2 below the connection region CN.

Therefore, in the present embodiment, as the first condition, in the wiring M2a of which end portion (the end portion of the wiring M2a) is present below the connection region CN, at least a part of the opening portion forming region RG1 which is the region in which the plurality of opening portions SL are formed overlaps with the connection region CN in plan view.

That at least a part of the opening portion forming region RG1 overlaps with the connection region CN in plan view suggests that at least a part of the plurality of opening portions SL formed in the wiring M2a overlaps with the connection region CN in plan view. In another view, that at least a part of the opening portion forming region RG1 overlaps with the connection region CN in plan view suggests that at least a part of the opening portion forming region RG1 is below the connection region CN, which suggests that at least a part of the plurality of opening portions SL formed in the wiring M2a is below the connection region CN.

If the first condition is satisfied, the effect of reducing the stress applied to the interlayer insulation film IL3 due to the wiring M2a can be obtained by providing the opening portion SL in the wiring M2a below the connection region CN, and therefore, it is possible to obtain the effect of suppressing or preventing occurrence of a crack in the interlayer insulation film IL3 where pressure (stress) is easily transmitted from the redistribution wiring RW through the pad PD1.

In addition, in the present embodiment, as the second condition, in plan view, the overlapping region between the wiring M2a and the connection region CN is preferably included in the opening portion forming region RG1.

Figure 31:
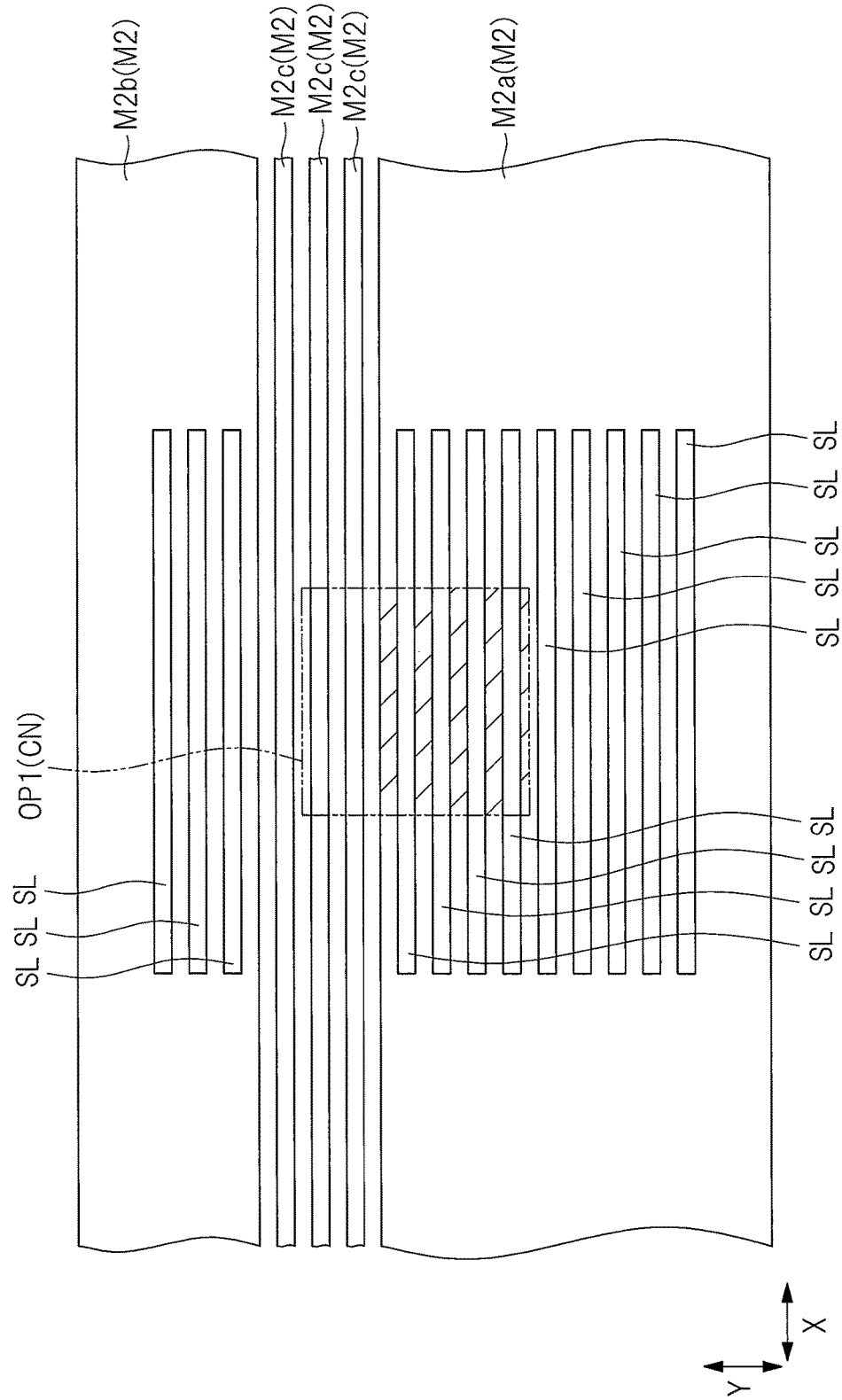
FIG. 31 is a plan view illustrating a principal part of the semiconductor device according to the one embodiment.

The overlapping region between the wiring M2a and the connection region CN in plan view corresponds to the hatched region in FIG. 31. Here, FIG. 31 is a plan view illustrating a principal part of the semiconductor device according to the present embodiment. As compared with FIG. 26, FIG. 31 does not have the one-dot chain line indicating the position of the opening portion OP2, and in FIG. 31, hatching is applied to the overlapping region between the wiring M2a and the connection region CN in plan view.

The overlapping region between the wiring M2a and the connection region CN in plan view corresponds to a region of the wiring M2a overlapping with the connection region CN in plan view. Also, that the overlapping region between the wiring M2a and the connection region CN in plan view is included in the opening portion forming region RG1 suggests that the entire region of the wiring M2a overlapping with the connection region CN in plan view is included in the opening portion forming region RG1, which suggests that the plurality of opening portions SL are arranged in the entire region of the wiring M2a overlapping with the connection region CN in plan view. In another view, that the overlapping region between the wiring M2a and the connection region CN in plan view is included in the opening portion forming region RG1 suggests that the entire region of the wiring M2a located below the connection region CN is included in the opening portion forming region RG1, which suggests that the plurality of opening portions SL are arranged in the entire region of the wiring M2a located below the connection region CN.

When the second condition is satisfied, the plurality of opening portions SL are arranged almost entirely in the region of the wiring M2a located below the connection region CN, thereby suppressing or preventing generation of a portion having a large wiring width. Therefore, the effect of reducing the stress applied to the interlayer insulation film IL3 due to the wiring M2a can be more accurately obtained by providing the opening portions SL in the wiring M2a below the connection region CN, so that occurrence of a crack can be more accurately suppressed or prevented in the interlayer insulation film IL3 where pressure (stress) is likely to be transmitted from the redistribution wiring RW through the pad PD1.

More specifically, even if only a part of the overlapping region between the wiring M2a and the connection region CN is included in the opening portion forming region RG1 in plan view, it is possible to obtain the effect of suppressing or preventing occurrence of a crack in the interlayer insulation film IL3, but in plan view, it is more preferable that the entire overlapping region between the wiring M2a and the connection region CN is included in the opening portion forming region RG1. More specifically, it is more preferable that the second condition is satisfied. As a result, the stress applied to the interlayer insulation film IL3 due to the wiring M2a can be more accurately reduced below the connection region CN, and it is possible to more accurately suppress or prevent occurrence of a crack in the interlayer insulation film IL3. Note that, if the second condition is satisfied, the first condition is inevitably satisfied.

In addition, in the present embodiment, as the third condition, it is preferable that the plurality of opening portions SL are formed in the opening portion forming region RG1 of the wiring M2a so as not to generate a portion having a width (the width of the wiring portion) of 0.6 μm or more in the wiring M2a below the connection region CN between the pad PD1 and the redistribution wiring RW. The width of the wiring (M2 or M2a) corresponds to a dimension (width) in a direction substantially perpendicular to the current direction (the direction in which the current flows) in the wiring (M2 or M2a). For example, in FIG. 26, the width W2a (dimension in the Y direction in this case) of the wiring portion sandwiched between the opening portions SL adjacent in the Y direction in the wiring M2a is preferably less than 0.6 μm.

As a premise of the third condition, when it is assumed that the plurality of opening portions SL are not formed in the wiring M2a, the width W1a of the wiring M2a is 0.6 μm or more. Note that, when it is assumed that the plurality of opening portions SL are not formed in the wiring M2a, the width W1a of the wiring M2a corresponds to the width of the wiring M102a, and the width of the wiring M102a is 0.6 μm or more.

As described above, the stress applied to the interlayer insulation film IL3 due to the wiring M2 is larger in the wiring M2 having a large width than the wiring M2 having a small width. Therefore, in the present embodiment, in order to reduce the effective width of the wiring M2a below the connection region CN, the plurality of opening portions SL are formed in the wiring M2a, whereby the stress applied to the interlayer insulation film IL3 due to the wiring M2a is reduced. Therefore, it is preferable to form the plurality of opening portions SL so as not to generate a portion having a large width in the wiring M2a below the connection region CN, and more specifically, it is preferable to form the plurality of opening portions SL in the wiring M2a so as not to generate a portion having a width (the width of the wiring portion) of 0.6 μm or more in the wiring M2a.

As described above, the stress applied to the interlayer insulation film IL3 due to the wiring M2 is larger in the wiring M2 having a large width than in the wiring M2 having a small width. According to the study of the inventors of the present invention, it became clear that, in the study examples illustrated in FIG. 28 to FIG. 30, when the width of the wiring M102a becomes 0.6 μm or more, the crack CR is likely to occur, starting from the end portion (corner portion) of the wiring M102a, in the interlayer insulation film IL3 sandwiched between the wiring M102a and the pad PD1. In this regard, in the present embodiment, the plurality of opening portions SL are formed in the wiring M2a of which width W1a is 0.6 μm or more when it is assumed that the plurality of opening portions SL are not formed, so that it is configured so as not to generate a portion having a width (the width of the wiring portion) of 0.6 μm or more in the wiring M2a below the connection region CN between the pad PD1 and the redistribution wiring RW. Therefore, the stress applied to the interlayer insulation film IL3 due to the wiring M2a can be more accurately reduced below the connection region CN, and occurrence of a crack in the interlayer insulation film IL3 sandwiched between the wiring M2a and the pad PD1 can be suppressed or prevented more accurately.

In addition, in the present embodiment, over the interlayer insulation film IL3, the layered film LM (first insulation film) having the opening portion OP3 in which the pad PD1 is exposed is formed, and the redistribution wiring RW electrically connected to the pad PD1 is formed over the layered film LM and over the pad PD1 exposed in the opening portion OP3. The layered film LM (the first insulation film) is composed of the layered film including the insulation film LF (the second insulation film) and the resin film PL1 (third insulation film) formed over the insulation film LF, and the opening portion OP3 (first opening portion) of the layered film LM is formed by the opening portion OP1 (third opening portion) of the insulation film LF and the opening portion OP2 (fourth opening portion) of the resin film PL1. The opening portion OP1 of the insulation film LF is included in the opening portion OP2 of the resin film PL1 in plan view, and the redistribution wiring RW is connected to the pad PD1 exposed in the opening portion OP1 of the insulation film LF.

In this case, the connection region CN between the pad PD1 and the redistribution wiring RW substantially coincides with the opening portion OP1 of the insulation film LF in plan view. For this reason, the above second condition is that, in plan view, the overlapping region between the wiring M2a and the connection region CN is included in the opening portion forming region RG1; however, this can also be expressed that, in plan view, the overlapping region between the wiring M2a and the opening portion OP1 is included in the opening portion forming region RG1, and this will be referred to as the fourth condition. More specifically, the fourth condition is that, in plan view, the overlapping region between the wiring M2a and the opening portion OP1 is included in the opening portion forming region RG1. The overlapping region between the wiring M2a and the opening portion OP1 in plan view corresponds to the region of the wiring M2a overlapping with the opening portion OP1 in plan view. The overlapping region between the wiring M2a and the opening portion OP1 in plan view and the overlapping region of the wiring M2a and the connection region CN in plan view substantially coincide with each other, and both correspond to the regions hatched in FIG. 31.

When the fourth condition is satisfied and in plan view, the overlapping region between the wiring M2a and the opening portion OP1 is included in the opening portion forming region RG1, this means that the plurality of opening portions SL are arranged almost entirely in the region located below the opening portion OP1 (i.e., below the connection region CN), and it is possible to suppress or prevent generation of a portion having a large wiring width. Accordingly, by providing the opening portions SL in the wiring M2a below the opening portion OP1 (i.e., below the connection region CN), it is possible to more accurately obtain the effect of reducing the stress applied to the interlayer insulation film IL3 due to the wiring M2a. This makes it possible to more accurately obtain the effect of suppressing or preventing the occurrence of the crack CR in the interlayer insulation film IL3 where the pressure (stress) is likely to be transmitted from the redistribution wiring RW through the pad PD1.

In addition, in the present embodiment, as the fifth condition, in plan view, the overlapping region between the wiring M2a and the opening portion OP2 is preferably included in the opening portion forming region RG1.

Figure 32:
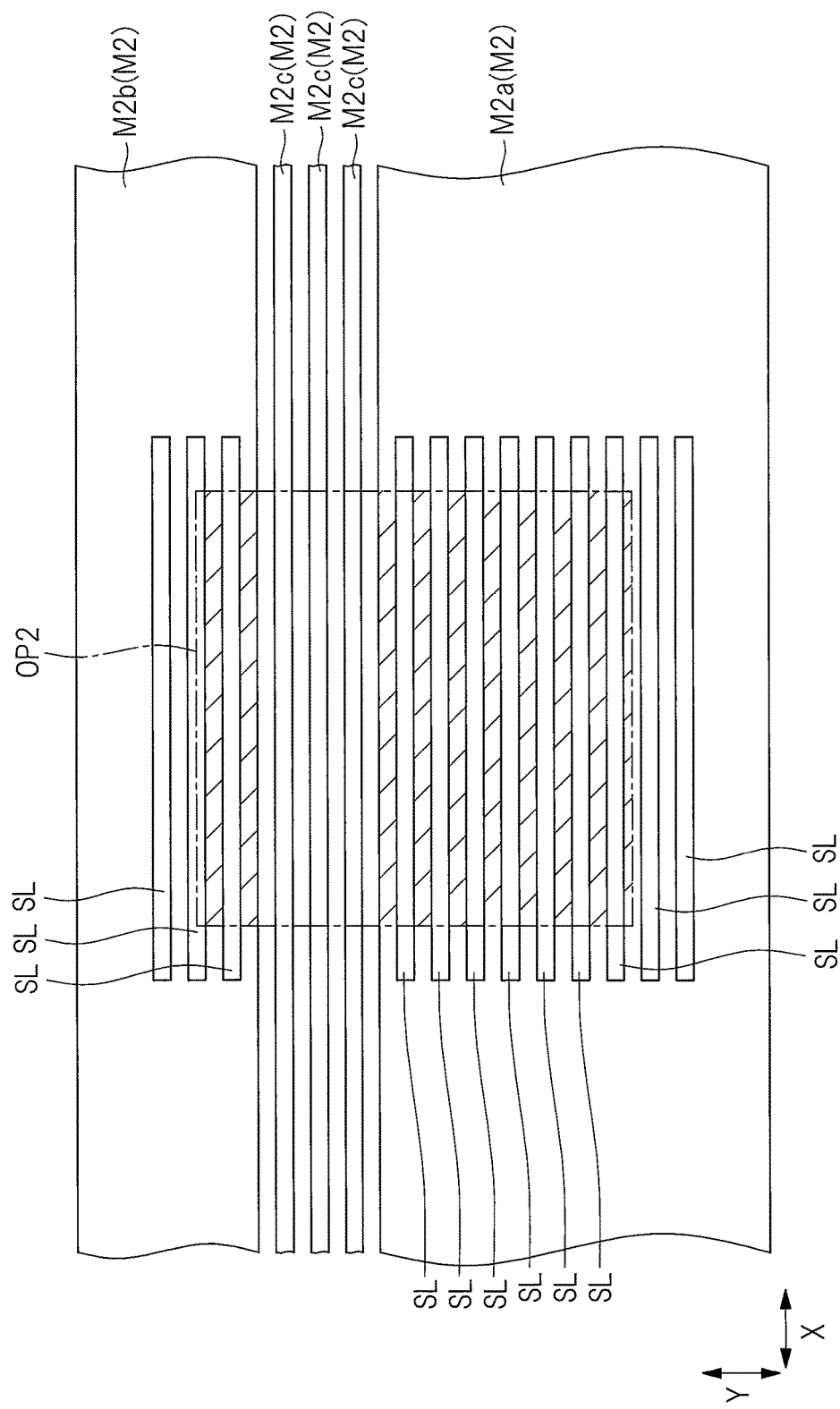
FIG. 32 is a plan view illustrating a principal part of the semiconductor device according to the one embodiment.

The overlapping region between the wiring M2a and the opening portion OP2 in plan view corresponds to the hatched region in the wiring M2a of FIG. 32. FIG. 32 is a plan view illustrating a principal part of the semiconductor device according to the present embodiment. As compared with FIG. 26, FIG. 32 does not have the two-dot chain line indicating the position of opening portion OP1, and in FIG. 32, hatching is applied to the overlapping region between the wiring M2a and the opening portion OP2 in plan view and the overlapping region between the wiring M2b and the opening portion OP2 in plan view.

Note that the overlapping region between the wiring M2a and the opening portion OP2 in plan view corresponds to the region of the wiring M2a overlapping with the opening portion OP2 in plan view. Also, that the overlapping region between the wiring M2a and the opening portion OP2 in plan view is included in the opening portion forming region RG1 suggests that the entire region of the wiring M2a overlapping with the opening portion OP2 in plan view is included in the opening portion forming region RG1, which suggests that the plurality of opening portions SL are arranged in the entire region of the wiring M2a overlapping with the opening portion OP2 in plan view. In another view, that the overlapping region between the wiring M2a and the opening portion OP2 is included in the opening portion forming region RG1 in plan view suggests that the entire region of the wiring M2a located below the opening portion OP2 is included in the opening portion forming region RG1, which suggests that the plurality of opening portions SL are arranged in the entire region of the wiring M2a located below the opening portion OP2.

In the region below the connection region CN, i.e., the region below the opening portion OP1, pressure (stress) applied from the pad PD1 to the interlayer insulation film IL3 is considerably large. This is because, since the redistribution wiring RW is formed so as to be in contact with the pad PD1 exposed in the opening portion OP1 and the insulation film is not interposed between the redistribution wiring RW and the pad PD1 exposed in the opening portion OP1, pressure (stress) is directly applied from the redistribution wiring RW to the pad PD1 exposed in the opening portion OP1, and the pressure is transmitted to the interlayer insulation film IL3 below the connection region CN (i.e., below the opening portion OP1).

Meanwhile, the opening portion OP2 includes the opening portion OP1 therein in plan view, and therefore, in the region outside the opening portion OP1 and inside the opening portion OP2 in plan view, the insulation film LF is interposed between the redistribution wiring RW and the pad PD1, but the resin film PL1 is not interposed between the redistribution wiring RW and the pad PD1. For this reason, in the region outside the opening portion OP1 and inside the opening portion OP2 in plan view, the pressure (stress) from the redistribution wiring RW is transmitted to the pad PD1 via the insulation film LF to some extent as much as there is no resin film PL1, and the pressure (stress) from the redistribution wiring RW is further applied to the lower interlayer insulation film IL3. More specifically, the pressure (stress) applied from the pad PD1 to the interlayer insulation film IL3 in the region outside the opening portion OP1 and inside the opening portion OP2 in plan view is less than the pressure (stress) applied from the pad PD1 to the interlayer insulation film IL3 in the region inside the opening portion OP1 in plan view, but nonetheless, the pressure (stress) applied from the pad PD1 to the interlayer insulation film IL3 in the region outside the opening portion OP1 and inside the opening portion OP2 in plan view is a certain degree of magnitude. Therefore, in plan view, although it is not as large as that of the region inside the opening portion OP1, there is a possibility that the crack CR or equivalent thereof may occur in the interlayer insulation film IL3 even in the region outside the opening portion OP1 and inside the opening portion OP2 in plan view, to some extent. Therefore, in order to reduce the possibility that the crack CR or equivalent thereof may occur in the interlayer insulation film IL3 as much as possible, it is desirable to reduce the stress applied to the interlayer insulation film IL3 due to the wiring M2 not only in the region inside the opening portion OP1 in plan view, but also in the region outside the opening portion OP1 and inside the opening portion OP2 in plan view.

Therefore, in the present embodiment, as the fifth condition, it is preferable that the overlapping region between the wiring M2a and the opening portion OP2 is included in the opening portion forming region RG1 in plan view. When the fifth condition is satisfied, it is considered that the plurality of opening portions SL are formed in the wiring M2a not only in the region inside the opening portion OP1 in plan view, but also in the region outside the opening portion OP1 and inside the opening portion OP2 in plan view. Accordingly, not only in the region inside the opening portion OP1 in plan view, but also in the region outside the opening portion OP1 and inside the opening portion OP2 in plan view, the stress applied to the interlayer insulation film IL3 due to the wiring M2a can be reduced, and therefore, it becomes possible to more accurately suppress or prevent occurrence of a crack in the interlayer insulation film IL3. Note that, when the fifth condition is satisfied, the fourth condition is inevitably satisfied.

Also, the end portion of the wiring M2a in the case of FIG. 23 to FIG. 27 (the present embodiment) and the end portion of the wiring M102a in the case of the study example of FIG. 28 to FIG. 30 are present below the connection region CN between the pad PD1 and the redistribution wiring RW and more specifically, are present at the position overlapping with the opening portion OP1 in plan view. Therefore, in the case of the study example of FIG. 28 to FIG. 30, there is a concern that the crack CR may occur in the interlayer insulation film IL3, starting from the end portion (corner portion) of the wiring M102a. Accordingly, in the case of FIG. 23 to FIG. 27 (the present embodiment), the plurality of opening portions SL are provided in the wiring M2a, so that occurrence of the crack CR in the interlayer insulation film IL3, starting from the end portion (corner portion) of the wiring M2a, is suppressed or prevented. In contrast, the end portion of the wiring M2b in the case of FIG. 23 to FIG. 27 (the present embodiment) and the end portion of the wiring M102b in the case of the study example of FIG. 28 to FIG. 30 are not present below the connection region CN between the pad PD1 and the redistribution wiring RW and more specifically, are not present at the position overlapping with the opening portion OP1 in plan view, but are present at the position overlapping with the opening portion OP2 in plan view. As described above, even in the region outside the opening portion OP1 and inside the opening portion OP2 in plan view, there is a possibility that the crack CR or equivalent thereof may occur in the interlayer insulation film IL3, to some extent, even though the possibility is not as high as in the region inside the opening portion OP1 in plan view. Accordingly, in the case of the study example of FIG. 28 to FIG. 30, the wiring M102b may also cause a crack in the interlayer insulation film IL3, although a possibility that the wiring M102b may cause a crack is not as high as a possibility that the wiring M102a may cause a crack. More specifically, there is also a possibility that the crack CR may occur in the interlayer insulation film IL3 sandwiched between the pad PD1 and the wiring M102b, starting from the end portion (corner portion) of the wiring M102b, to some extent.

Therefore, it is preferable to provide the opening portion SL not only in the wiring M2a corresponding to the wiring M102a but also in the wiring M2b corresponding to the wiring M102b. Thus, in the case of FIG. 23 to FIG. 27, the plurality of opening portions SL are formed in the opening portion forming region RG2 of the wiring M2b. At least a part of the opening portion forming region RG2 in the wiring M2b overlaps with the opening portion OP2 in plan view. Note that, when at least a part of the opening portion forming region RG2 overlaps with the opening portion OP2 in plan view, this suggests that at least a part of the plurality of opening portions SL formed in the wiring M2b overlaps with the opening portion OP2 in plan view.

The fifth condition is preferably applied not only to the wiring M2a but also to the wiring M2b. More specifically, in plan view, the overlapping region between the wiring M2b and the opening portion OP2 is preferably included in the opening portion forming region RG2. The overlapping region between the wiring M2b and the opening portion OP2 in plan view corresponds to the hatched region in the wiring M2b in FIG. 32.

The overlapping region between the wiring M2b and the opening portion OP2 in plan view corresponds to the region of the wiring M2b overlapping with the opening portion OP2 in plan view. Also, that the overlapping region between the wiring M2b and the opening portion OP2 is included in the opening portion forming region RG2 in plan view suggests that the entire region of the wiring M2b overlapping with the opening portion OP2 in plan view is included in the opening portion forming region RG2, which suggests that the plurality of opening portions SL are arranged in the entire region of the wiring M2b overlapping with the opening portion OP2 in plan view. In another view, that the overlapping region between the wiring M2b and the opening portion OP2 is included in the opening portion forming region RG2 in plan view suggests that the entire region of the wiring M2b located below the opening portion OP2 is included in the opening portion forming region RG2, which suggests that the plurality of opening portions SL are arranged in the entire region of the wiring M2b located below the opening portion OP2.

Not only in the wiring M2a but also in the wiring M2b, when the fifth condition is satisfied, in the region of each of the wirings M2a and M2b overlapping with the opening portion OP2 in plan view, more specifically, in the region of each of the wirings M2a and M2b below the opening portion OP2, the plurality of opening portions SL are formed in the wirings M2a and M2b. Therefore, in the region inside the opening portion OP2 in plan view, the stress applied to the interlayer insulation film IL3 due to each of the wirings M2a and M2b can be reduced, so that occurrence of a crack in the interlayer insulation film IL3, starting from the end portions (corners) of each of the wirings M2a and M2b, can be more accurately suppressed or prevented.

In addition, in the present embodiment, as the sixth condition, it is preferable that the plurality of opening portions SL are formed in the opening portion forming region RG1 of the wiring M2a such that no portion having a width (the width of the wiring portion) of 0.6 μm or more is generated in the wiring M2a below the opening portion OP2. Note that, as a premise of the sixth condition, the width W1a of the wiring M2a in a case where it is assumed that the plurality of opening portions SL are not formed in the wiring M2a is 0.6 μm or more.

As described above, the stress applied to the interlayer insulation film IL3 due to the wiring M2 is larger in the wiring M2 having a large width than in the wiring M2 having a small width. According to the study of the inventors of the present invention, it became clear that, in the study examples of FIG. 28 to FIG. 30, when the width of each of the wirings M102a and M102b is 0.6 μm or more, the crack CR is more likely to occur, starting from each end portion (corner portion) of the wirings M102a and M102b, in the interlayer insulation film IL3 sandwiched between each of the wirings M102a and M102b and the pad PD1.

Therefore, in the present embodiment, it is preferable to form the plurality of opening portions SL below the opening portion OP2 such that a portion having a large width is not generated in the wiring M2a, and more specifically, it is preferable to form the plurality of opening portions SL in the wiring M2a such that, below the opening portion OP2, a portion having a width (the width of the wiring portion) of 0.6 μm or more is not generated in the wiring M2a. As a result, below the opening portion OP2, the stress applied to the interlayer insulation film IL3 due to the wiring M2a can be more accurately reduced, and occurrence of a crack in the interlayer insulation film IL3 sandwiched between the wiring M2a and the pad PD1 can be suppressed or prevented more accurately.

The sixth condition is preferably applied not only to the wiring M2a but also to the wiring M2b. More specifically, the plurality of opening portions SL are preferably formed in the opening portion forming region RG2 of the wiring M2b such that a portion having a width (the width of the wiring portion) of 0.6 μm or more is not generated in the wiring M2b below (immediately below) the opening portion OP2. As a result, the stress applied to the interlayer insulation film IL3 due to each of the wirings M2a and M2b can be more accurately reduced below (immediately below) the opening portion OP2, and occurrence of a crack (CR) in the interlayer insulation film IL3, starting from the end portions (corner portions) of each of the wirings M2a and M2b, can be more accurately suppressed or prevented.

Note that, as a premise for applying the sixth condition also to the wiring M2b, the width W1b of the wiring M2b in a case where it is assumed that the plurality of opening portions SL are not formed in the wiring M2b is 0.6 μm or more. Referring to FIG. 26, in order that the wirings M2a and M2b satisfy the sixth condition, the width W2a of the wiring portion of each of the wirings M2a and M2b sandwiched between the opening portions SL adjacent in the Y direction is preferably less than 0.6 μm.

In addition, in the present embodiment, as the seventh condition, in plan view, it is preferable that the opening portion SL is not formed in the wiring M2 (M2a and M2b) in the region 5 μm or more apart from the opening portion OP2. From a different viewpoint, the seventh condition means that, in plan view, an outer edge of each of the opening portion forming regions RG1 and RG2 is spaced less than 5 μm apart from the opening portion OP2.

Figure 33:
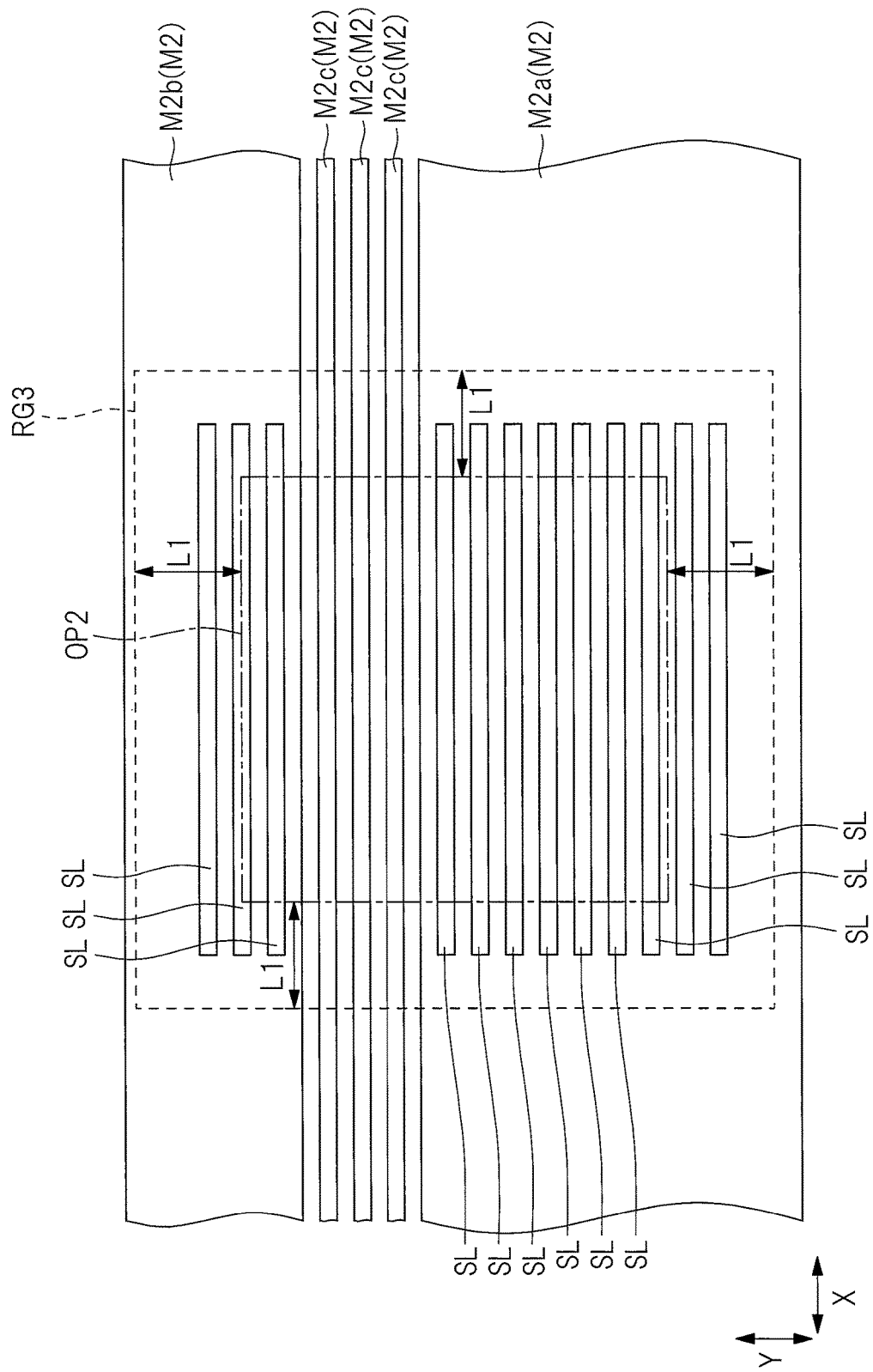
FIG. 33 is a plan view illustrating a principal part of the semiconductor device according to the one embodiment.

FIG. 33 is a diagram for describing the seventh condition. FIG. 33 is a plan view illustrating a principal part of the semiconductor device according to the present embodiment. As compared with FIG. 26, FIG. 33 does not have the two-dot chain line indicating the position of opening portion OP1 and additionally includes a dotted line indicating a region RG3. In FIG. 33, the region RG3 indicated by the dotted line corresponds to the region where the opening portion OP2 is expanded by 5 μm in each of the X direction and the Y direction. More specifically, in plan view, an interval (an interval in the X direction and an interval in the Y direction) L1 between the outer edge of the opening portion OP2 and an outer edge of the region RG3 is 5 μm (L1=5 μm). Therefore, a dimension of the region RG3 in the X direction is a value obtained by adding 10 μm to a dimension of the opening portion OP2 in the X direction, and a dimension of the region RG3 in the Y direction is a value obtained by adding 10 μm to a dimension of the opening portion OP2 in the Y direction.

The region RG3 surrounded by the dotted line illustrated in FIG. 33 corresponds to the region within 5 μm from the opening portion OP2 in plan view, and the region outside the region RG3 surrounded by the dotted line illustrated in FIG. 33 corresponds to the region 5 μm or more apart from opening portion OP2. In each wiring M2 (M2a, M2b, or M2c) extending below the pad PD1, it is preferable that the opening portions SL are not formed outside the region RG3 surrounded by the dotted line in FIG. 33, so that the seventh condition can be satisfied. The reason that it is preferable to satisfy the seventh condition is as follows.

In the region outside the opening portion OP2 in plan view, not only the insulation film LF but also the resin film PL1 is interposed between the redistribution wiring RW and the pad PD1. The resin film PL1 is relatively thick (more specifically, thicker than the insulation film LF) and is relatively soft (more specifically, softer than the insulation film LF) because the resin film PL1 is made of resin material. Accordingly, in the region outside the opening portion OP2 in plan view, as much as not only the insulation film LF but also the resin film PL1 is present between the redistribution wiring RW and the pad PD1, pressure (stress) from the redistribution wiring RW is less likely to be transmitted to the pad PD1 and is therefore less likely to be applied to the interlayer insulation film IL3 below the pad PD1. More specifically, the pressure (stress) applied from the pad PD1 to the interlayer insulation film IL3 in the region outside the opening portion OP2 in plan view is significantly smaller than the pressure (stress) applied from the pad PD1 to the interlayer insulation film IL3 in the region inside the opening portion OP2 in plan view. Therefore, not only in the case of FIG. 23 to FIG. 27 (the present embodiment), but also in the study example of FIG. 28 to FIG. 30, in the region outside the opening portion OP2 in plan view, there is little possibility that the crack CR or equivalent thereof may occur in the interlayer insulation film IL3, or even if there is the possibility, it is a very small possibility. Therefore, whether or not the opening portion SL is provided in the wiring M2 in the region outside the opening portion OP2 in plan view hardly affects the possibility of occurrence of the crack (CR) in the interlayer insulation film IL3. Meanwhile, when the opening portions SL are provided in the wiring M2 in the region outside the opening portion OP2 in plan view, resistance of the wiring M2 increases accordingly.

Therefore, in the present embodiment, as the seventh condition, in plan view, it is preferable that the plurality of opening portions SL are not formed in the wiring M2 (M2a, M2b, or M2c) in the region 5 μm or more apart from the opening portion OP2. If the seventh condition is satisfied, the opening portions SL are not formed in the region of the wiring M2 (M2a, M2b, or M2c) where the effect obtained by providing the opening portions SL cannot be expected (more specifically, a region 5 μm or more apart from the opening portion OP2). Therefore, it is possible to suppress an increase in resistance of the wiring M2 due to the provision of the opening portions SL while suppressing or preventing occurrence of a crack in the interlayer insulation film IL3, so that resistance of the wiring M2 can be reduced.

The technical idea of the present embodiment is summarized as follows. In the present embodiment, when the redistribution wiring RW is formed over pad PD1, the fact that the pressure (stress) transmitted from the redistribution wiring RW to the pad PD1 is applied to the interlayer insulation film IL3 below the pad PD1 is taken into consideration, and the stress applied to interlayer insulation film IL3 due to wiring M2 below pad PD1 is reduced, so that occurrence of a crack in the interlayer insulation film IL3 sandwiched between the wiring M2 and the pad PD1 is suppressed or prevented. As a result, reliability of the semiconductor device can be improved. In the present embodiment, as means of reducing the stress applied to the interlayer insulation film IL3 due to the wiring M2 below the pad PD1, the plurality of opening portions SL are formed in the wiring M2 below the pad PD1. In the wiring M2 below the pad PD1, the plurality of opening portions SL are provided in the region where the pressure (stress) applied from the pad PD1 to the interlayer insulation film IL3 is relatively large (the first, second, fourth, and fifth conditions). In addition, in the wiring M2 below the pad PD1, the plurality of opening portions SL are provided so as not to generate a portion having a large wiring width (the above third and sixth conditions). As a result, it is possible to enhance the effect obtained by providing the plurality of opening portions SL (the effect of preventing a crack from occurring in the interlayer insulation film IL3). In addition, the opening portion (SL) is not provided in the region of the wiring M2 below the pad PD1 where the effect obtained by providing the plurality of opening portions SL (the effect of preventing occurrence of a crack in the interlayer insulation film IL3) cannot be expected, so that it is possible to reduce the resistance of the wiring M2 (the above seventh condition).

As the wirings M2a and M2b in which the plurality of opening portions SL are formed, a power supply wiring or a ground wiring is suitably applicable, and particularly, a ground wiring is suitably applicable. The power supply wiring and the ground wiring have a large wiring width, and the ground wiring is generally larger in the wiring width than the power supply wiring. Therefore, when the power supply wiring or the ground wiring (in particular, the ground wiring) is present below the pad PD1 as the wiring M2, there is a concern that the crack CR may occur in the interlayer insulation film IL3 sandwiched between the wiring M2 and the pad PD1. In the present embodiment, when the wirings M2a and M2b as the power supply wiring or the ground wirings are present below the pad PD1, the plurality of opening portions SL are formed in the wirings M2a and M2b as described above, so that it is possible to suppress or prevent occurrence of a crack in the interlayer insulation film IL3 sandwiched between the power supply wiring or the ground wiring (wirings M2a and M2b) and the pad PD1.

Therefore, when the power supply wiring or the ground wiring is applied as the wirings M2a and M2b in which the plurality of opening portions SL are formed, the effect obtained by providing the plurality of opening portions SL is large, and in particular, when the ground wiring is applied, the effect obtained by providing the plurality of opening portions SL becomes extremely large.

Furthermore, in the plurality of wirings M2 extending below the pad PD1, the wirings M2a and M2b provided with the opening portions SL and the wiring M2c without the opening portions SL can be mixedly adopted. This will be described below with reference to FIG. 23 to FIG. 27.

In the case of FIG. 23 to FIG. 27, not only the wirings M2a and M2b but also the wiring M2c (third wiring) extends below the pad PD1 as the wiring M2. The width W1c (second width) of the wiring M2c is relatively small, and more specifically, is smaller than the width W1a of the wiring M2a (first width) in a case where it is assumed that the plurality of opening portions SL are not formed in the wiring M2a (W1c<W1a), and is smaller than the width (W1b) of the wiring M2b in a case where it is assumed that the plurality of opening portions SL are not formed in the wiring M2b (W1c<W1b). For example, the wirings M2a and M2b are a power supply wiring or a ground wiring, and the wiring M2c is a signal wiring (signal line). The power supply wiring is the wiring used to supply the power supply potential, the ground wiring is the wiring used to supply the ground potential (ground potential), and the signal wiring is the wiring used to transmit the signal. The wiring width of each of the power supply wiring and the ground wiring is considerably large, the wiring width of the signal wiring is relatively small, and the wiring width of the signal wiring is generally smaller than the wiring width of each of the power supply wiring and the ground wiring.

In the case of FIG. 23 to FIG. 27, the wirings M2a and M2b are formed with the plurality of opening portions SL, but those corresponding to the opening portions SL are not formed in the wiring M2c. The reason that, although the opening portions SL are formed in the wirings M2a and M2b, the opening portions are not formed in the wiring M2b is as follows.

More specifically, if the opening portions SL are not provided in the wirings M2a and M2b, the wiring width is considerably large, and accordingly, the stress applied to the interlayer insulation film IL3 due to the wirings M2a and M2b is increased. As a result, there is concern that a crack may occur in the interlayer insulation film IL3 sandwiched between each of the wirings M2a and M2b and the pad PD1. In contrast, even if the opening portions SL are not provided in the wiring M2c, the wiring width thereof is small, and accordingly, the stress applied to interlayer insulation film IL3 due to wiring M2c is not so large. As a result, there is relatively small concern that a crack may occur in the interlayer insulation film IL3 sandwiched between the wiring M2c and the pad PD1.

For this reason, of the wirings M2a, M2b, and M2c extending below the pad PD1, the opening portions SL are formed in the wirings M2a and M2b having a relatively high possibility of causing a crack in the interlayer insulation film IL3 unless the opening portions are formed, so that occurrence of a crack in the interlayer insulation film IL3 sandwiched between each of the wirings M2a and M2b and the pad PD1 is suppressed or prevented. In contrast, of the wirings M2a, M2b, and M2c extending below the pad PD1, the opening portions are not formed in the wiring M2c having a relatively low possibility of causing the crack of the interlayer insulation film IL3 even if the opening portions are not formed, so that the resistance of the wiring M2c can be reduced. As described above, in the wirings M2a, M2b, and M2c extending below the pad PD1, the wirings M2a and M2b having the opening portions SL and the wiring M2c not having the opening portions are provided in a mixed manner, so that it is possible to achieve both prevention of the crack in the interlayer insulation film IL3 and reduction of the resistance of wiring M2.

In addition, according to the study of the inventors of the present invention, as described in relation to the above third condition and sixth condition, it became clear that, when the width of the wiring M2 becomes 0.6 μm or more, the stress applied to the interlayer insulation film IL3 due to the wiring M2 increases, and the wiring M2 is more likely to be the cause of the crack CR.

Therefore, the wiring M2 (M2a and M2b) provided with the opening portions SL so as to satisfy any of the first to sixth conditions are preferably the wiring M2 (M2a and M2b) having a width of 0.6 μm or more in a case where it is assumed that the plurality of opening portions SL are not formed. More specifically, of the wiring M2 extending below the pad PD1, the wiring M2 (M2a and M2b) of which width is 0.6 μm or more in a case where it is assumed that the opening portions (SL) are not formed are preferably provided with the opening portions SL so as to satisfy any of the first to sixth conditions.

Meanwhile, the wiring M2 (M2c) of which width is less than 0.6 μm even in a case where the opening portions (SL) are not formed may be provided with the opening portions SL so as to satisfy any of the first to sixth conditions, but there is little concern of causing a crack in the interlayer insulation film IL3 even when the opening portion SL are not provided, and therefore, it is possible not to form the opening portions SL or equivalent thereof, and in this case, the resistance of the wiring M2 (M2c) can be reduced.

Therefore, the wirings M2a and M2b are preferably wirings of which widths W1a and W1b in a case where it is assumed that the plurality of opening portions SL are not formed are 0.6 μm or more, respectively, and the wiring M2c is preferably a wiring of which width W1c is less than 0.6 μm. The opening portions SL are provided in the wirings M2a and M2b where the effect obtained by providing the opening portions SL (the effect of preventing the crack in the interlayer insulation film IL3) is large, and the opening portions SL are not provided in the wiring M2c having the width of less than 0.6 μm where the effect obtained by providing the opening portions SL is small, so that it is possible to efficiently realize prevention of a crack in the interlayer insulation film IL3 and reduction of resistance of the wiring M2.

Also, the present embodiment (FIG. 23 to FIG. 27 and FIG. 31 to FIG. 34) illustrates a case where one wiring M2a having the opening portions SL, one wiring M2b having the opening portions SL, and three wirings M2c having no opening portions SL are passed below the pad PD1, but the number of each of the wirings M2a, M2b, and M2c is not limited thereto and can be changed to various numbers. Also, there may be a case where wiring M2c is not present below the pad PD1. There may still be not only a case where both wirings M2a and M2b are present below the pad PD1 but also a case where one of the wirings M2a and M2b is present but the other of the wirings M2a and M2b is not present below the pad PD1. Note that, as described above, the wiring M2a is a wiring whose end portion is located below the connection region CN (opening portion OP1) and which has the opening portions SL, and the wiring M2b is a wiring whose end portion is not located below the connection region CN (opening portion OP1) and which is located below the opening portion OP2 and which has the opening portions SL, and the wiring M2c is a wiring which does not have the opening portions SL.

Modification Example

Each modification example of the present embodiment will be described with reference to the drawings.

Figure 34:
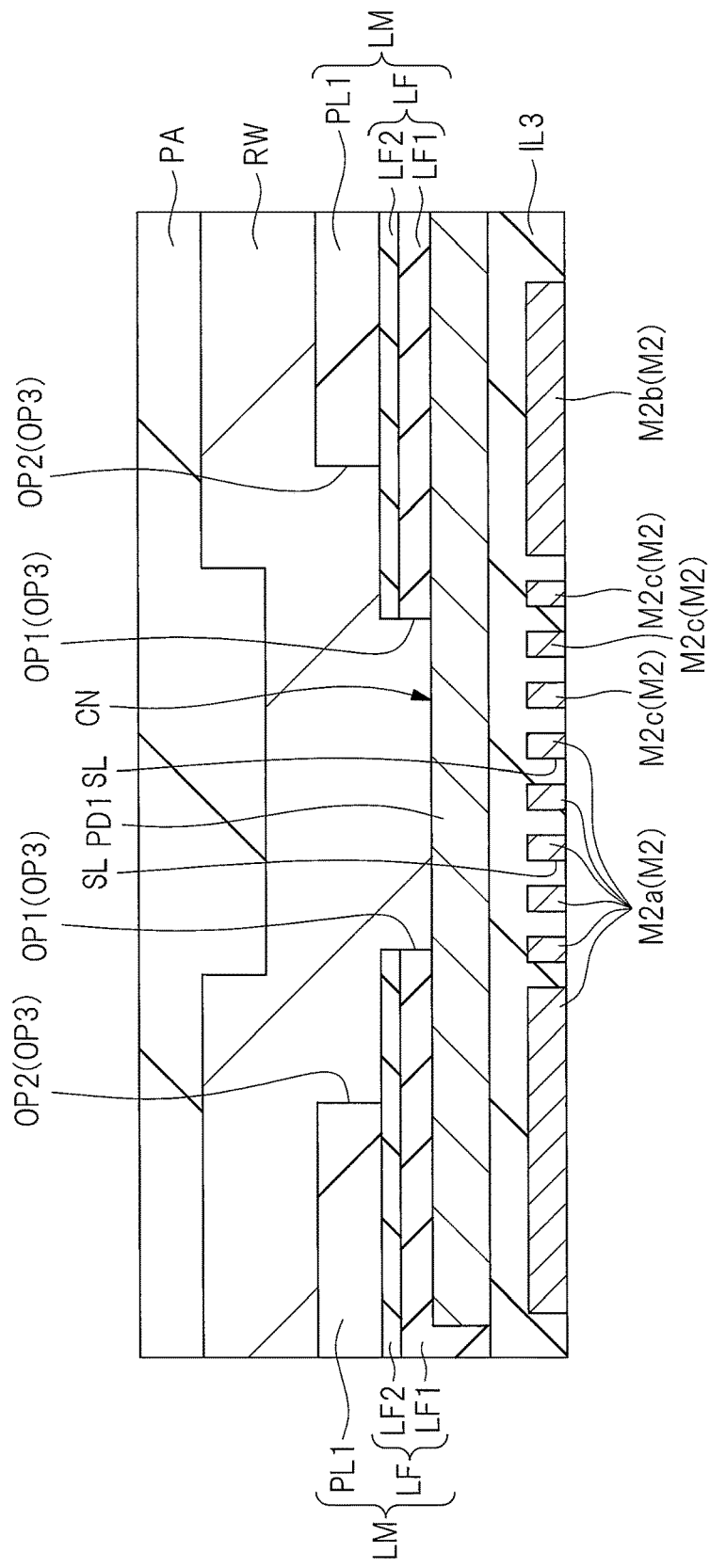
FIG. 34 is a cross-sectional view illustrating a principal part of a semiconductor device according to a first modification example.
Figure 35:
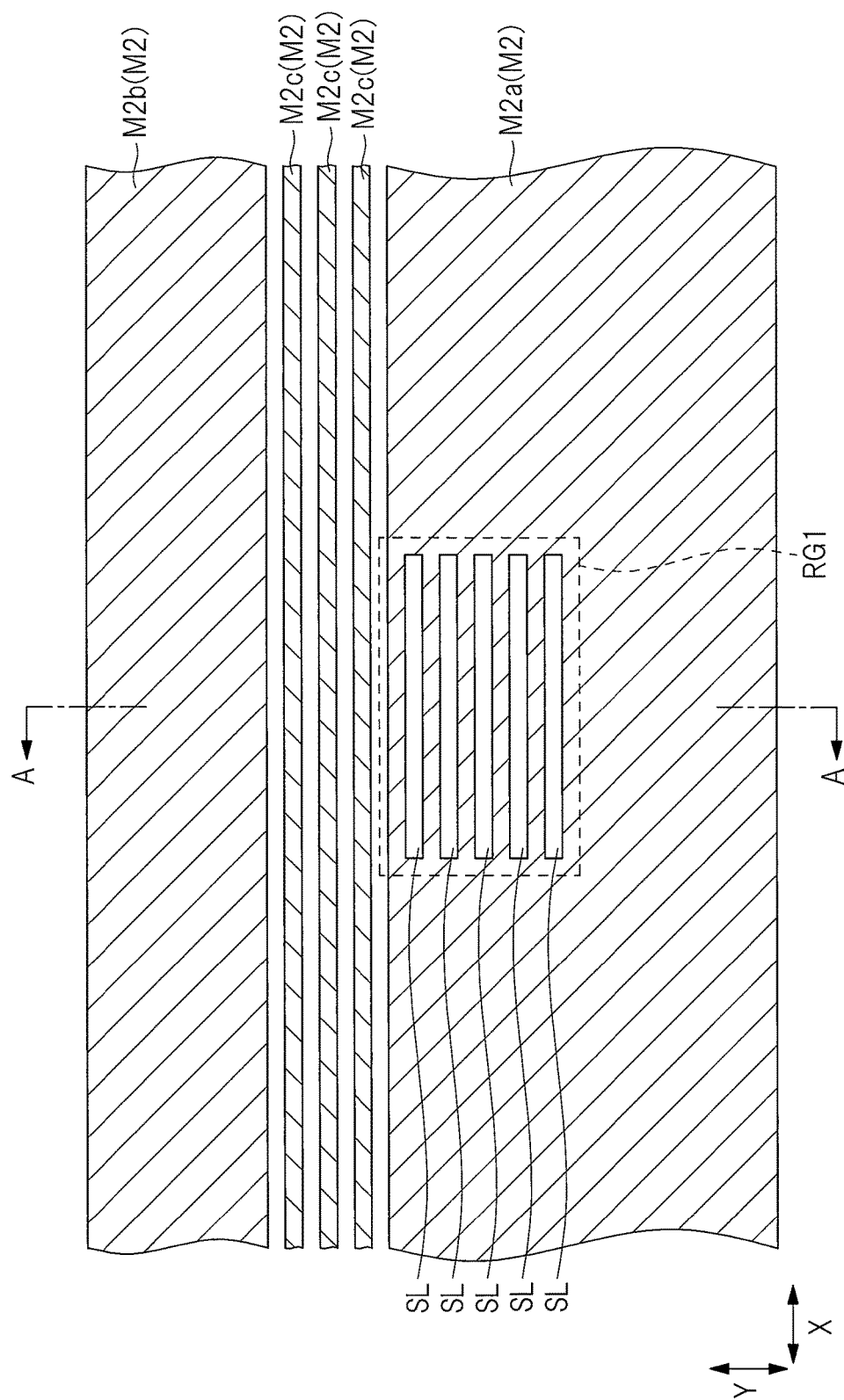
FIG. 35 is a plan view illustrating a principal part of the semiconductor device according to the first modification example.
Figure 36:
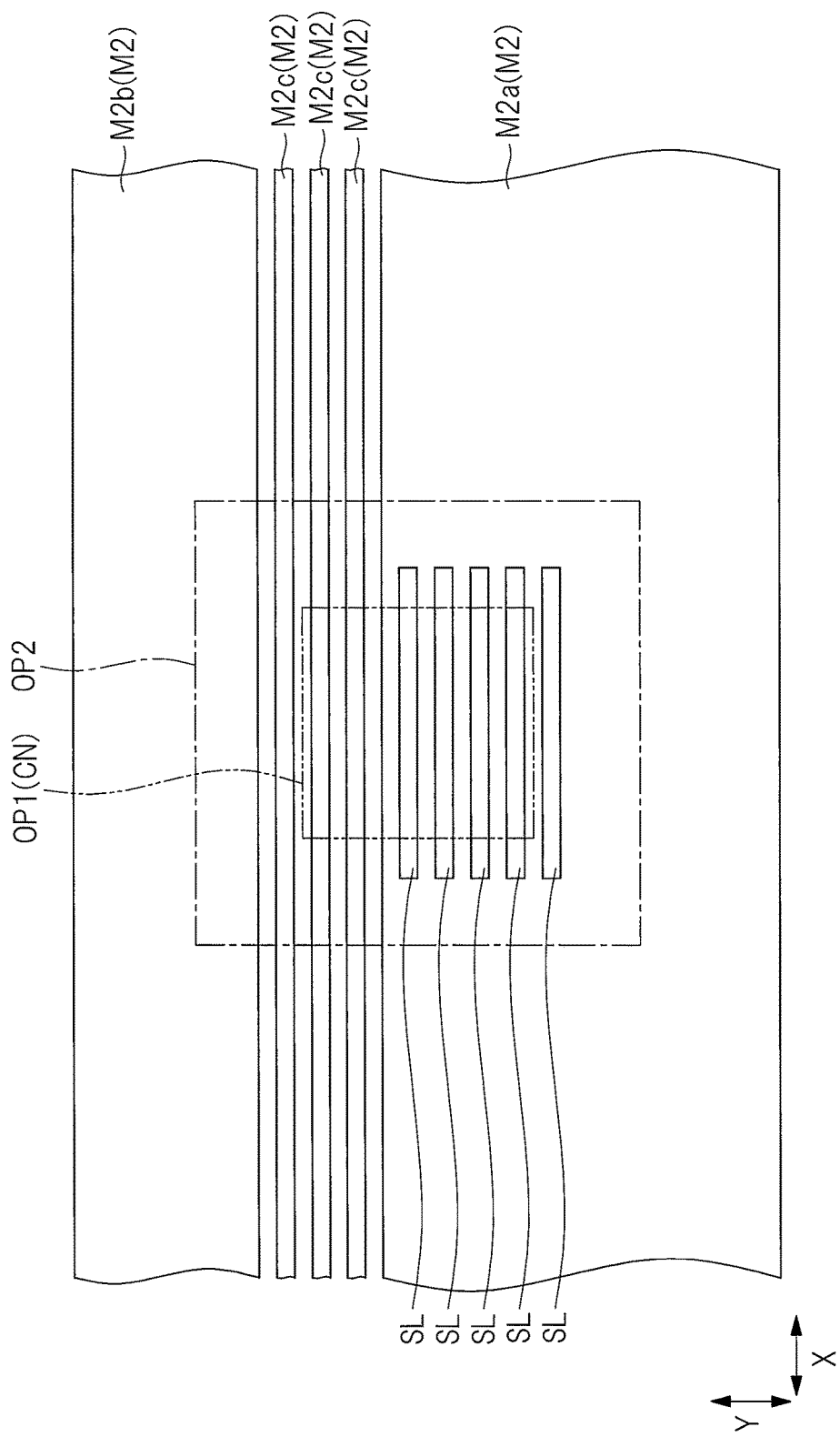
FIG. 36 is a plan view illustrating a principal part of the semiconductor device according to the first modification example.

FIG. 34 is a cross-sectional view illustrating a semiconductor device according to a first modification example of the present embodiment and corresponds to FIG. 23. Similarly to FIG. 23, also in FIG. 34, the interlayer insulation film IL2 and the structure under the interlayer insulation film IL2 are not illustrated. FIG. 35 and FIG. 36 are plan views illustrating a principal part of the semiconductor device according to the first modification example of the present embodiment and correspond to FIG. 27 and FIG. 26, respectively. More specifically, although FIG. 35 and FIG. 36 illustrate the wiring M2 in a lower layer than the PAD PD1, FIG. 35 illustrates a dotted line indicating the opening portion formation region RG1, and FIG. 36 illustrates a two-dot chain line indicating a position of the opening portion OP1 of the insulation film LF and illustrates a one-dot chain line indicating a position of the opening portion OP2 of the resin film PL1. Note that, although FIG. 35 is a plan view, in order to simplify the understanding, hatching is given to the wiring M2 (M2a, M2b, and M2c). Also, the sectional view taken along a line A-A of FIG. 35 substantially corresponds to FIG. 34. The plan view indicating the pad PD1 is the same as FIG. 24 also in the case of the first modification example.

In the case of the first modification example of FIG. 34 to FIG. 36, the opening portions (SL) are not formed in the wirings M2b and M2c out of the wirings M2a, M2b, and M2c extending below the pad PD1. Also, the plurality of opening portions SL are formed in the opening portion forming region RG1 in the wiring M2a, but an area of the opening portion forming region RG1 according to the first modification example of FIG. 34 to FIG. 36 is smaller than an area of the opening portion forming region RG1 in the case of FIG. 23 to FIG. 27. More specifically, in the case of the first modification example of FIG. 34 to FIG. 36, the opening portion forming region RG1 is included in the opening portion OP2 in plan view.

The remaining configuration of the semiconductor device according to the first modification example of FIG. 34 to FIG. 36 is the same as the configuration of the semiconductor device of FIG. 23 to FIG. 27, so the repetitive description thereof will be omitted here.

The first modification example of FIG. 34 to FIG. 36 satisfies the first condition, the second condition, the third condition, the fourth condition, and the seventh condition, but does not satisfy the fifth condition and the sixth condition. Since the first modification example of FIG. 34 to FIG. 36 satisfies the first condition, the second condition, the third condition, and the fourth condition, it is possible to obtain the effect of suppressing or preventing occurrence of a crack in the interlayer insulation film IL3 sandwiched between the pad PD1 and the wiring M2. However, in the case of FIG. 23 to FIG. 27, since the fifth condition and the sixth condition are further satisfied, the effect of suppressing or preventing occurrence of a crack in the interlayer insulation film IL3 sandwiched between pad PD1 and wiring M2 can be further enhanced as compared with the first modification example of FIG. 34 to FIG. 36.

FIG. 37 to FIG. 40 are plan views illustrating a principal part of a semiconductor device according to a second modification example of the present embodiment and each correspond to FIG. 27.

In the case of FIG. 27 and the cases of FIG. 37 to FIG. 40, the plurality of opening portions SL are formed in the opening portion forming regions RG1 and RG2 of the wirings M2a and M2b, and the planar shapes of the opening portions SL are different between the case of FIG. 27 and the cases of FIG. 37 to FIG. 40.

More specifically, in the case of FIG. 27, the plurality of opening portions SL are formed in a slit-like shape in the opening portion forming regions RG1 and RG2 of the wirings M2a and M2b. In contrast, in the cases of FIG. 37 to FIG. 40, the plurality of opening portions SL are formed in a mesh-like shape in the opening portion forming regions RG1 and RG2 of the wirings M2a and M2b. First, the case of FIG. 27 will be described.

In the case of FIG. 27, the wirings M2a and M2b extend in the X direction. In each of the opening portion forming regions RG1 and RG2 of the wirings M2a and M2b extending in the X direction, the plurality of slit-like opening portions SL extending in the X direction are arranged side by side in the Y direction. Since each opening portion SL has a slit-like shape, it has an elongated planar shape extending in one direction (here, in the X direction) in plan view, and for example, each opening portion SL has a rectangular planar shape having the long-side direction in the X direction. Therefore, each opening portion SL has a dimension (length) in the X direction larger than a dimension (width) in the Y direction. In the case of FIG. 27, each width (dimension in Y direction) of the opening portions SL (slit) is the same as each other. Also, in the case of FIG. 27, the plurality of opening portions SL (slits) are arranged with the same interval (array pitch) in the Y direction in each of the opening portion forming regions RG1 and RG 2 of the wirings M2a and M2b. Therefore, each width W2a (see FIG. 26) of the wiring portion sandwiched between the opening portions SL (slits) is the same as each other. Note that, although the wiring portion sandwiched between the opening portions SL (slits) extends in the X direction, the width W2a of the wiring portion sandwiched by the opening portions SL (slits) is preferably less than 0.6 μm as described in relation to the third condition and the sixth condition.

In the case of forming the slit-like opening portions SL in each of the wirings M2a and M2b, the extending direction (long-side direction) of the slit (opening portion SL) is preferably the direction in which the wirings M2a and M2b extend (here, the X direction). This makes it easier to suppress an increase in resistance of the wiring M2a due to the provision of the opening portions SL, which is advantageous to reduce resistance of the wiring M2a.

More specifically, in the wiring M2a, the current direction is the extending direction of the wiring M2a. Therefore, in the wiring M2a, a current path can be more easily secured in a case where the slit (opening portion SL) is provided along the extending direction (here, the X direction) of the wiring M2a than in a case where the slit (opening portion SL) is provided so as to traverse the extending direction of the wiring M2a, and as a result, resistance of the wiring M2a becomes lower. Therefore, when the slit is provided as the opening portion SL in the wiring M2a, it is preferable that the extending direction (long-side direction) of the slit (opening portion SL) is the same as the extending direction of the wiring M2a. This is also applicable to the wiring M2b.

Next, the case of FIG. 37 (second modification example) will be described.

Figure 37:
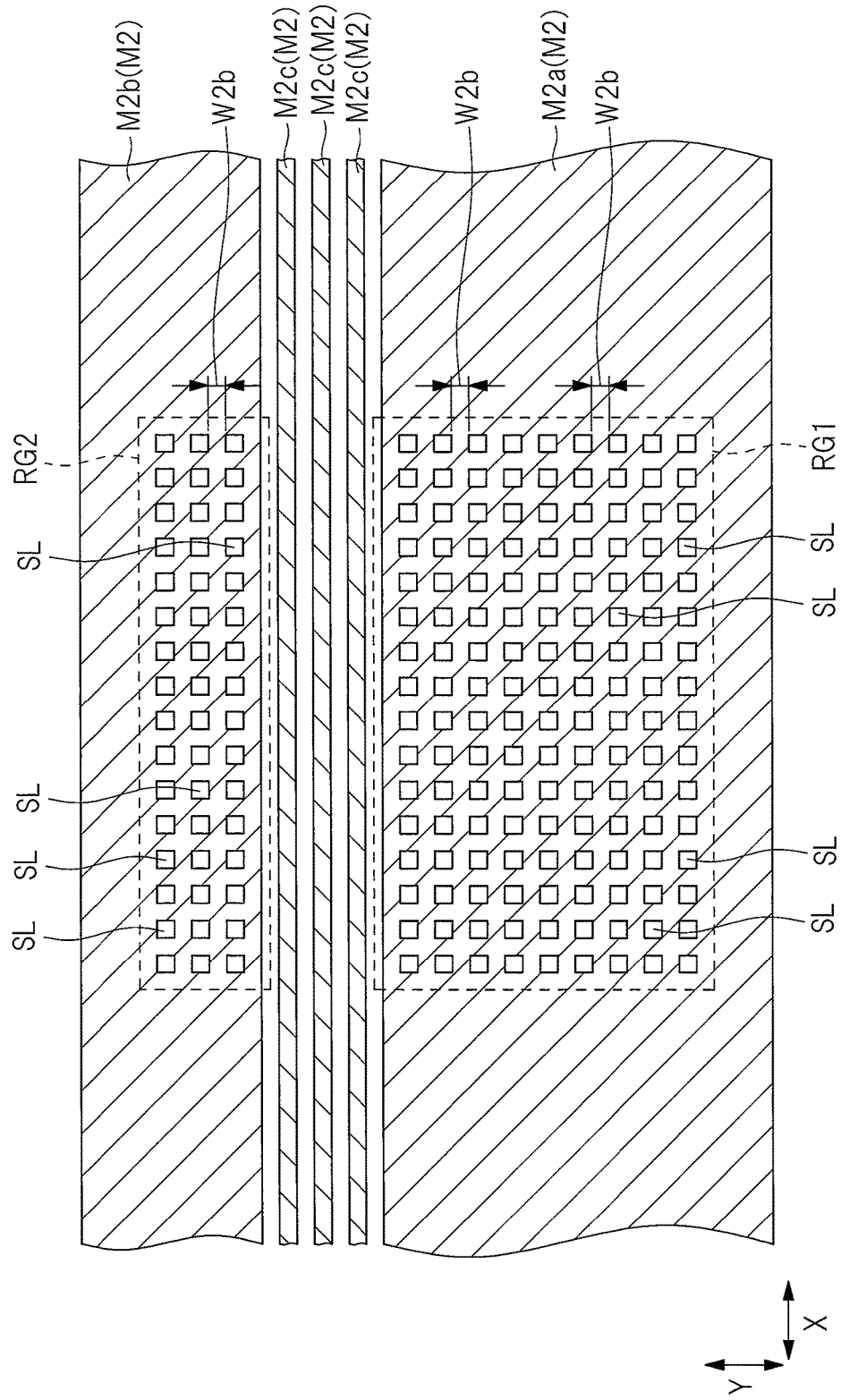
FIG. 37 is a plan view illustrating a principal part of a semiconductor device according to a second modification example.

In the case of FIG. 37, the wirings M2a and M2b extend in the X direction. In each of the opening portion forming regions RG1 and RG2 of the wirings M2a and M2b extending in the X direction, the plurality of mesh-like opening portions SL are formed. More specifically, the plurality of opening portions SL each having, for example, a rectangular or square planar shape are arrayed in an array (matrix) in the X direction and the Y direction. Also, in the case of FIG. 37, since the plurality of opening portions SL (slits) are aligned with the same interval (array pitch) in the X direction and the Y direction, each width (dimension in the Y direction) W2b of the wiring portions sandwiched between opening portions SL (slits) is the same as each other. The width W2b of the wiring portion sandwiched by the opening portions SL (slits) is preferably less than 0.6 μm as described in relation to the third condition and the sixth condition.

Figure 38:
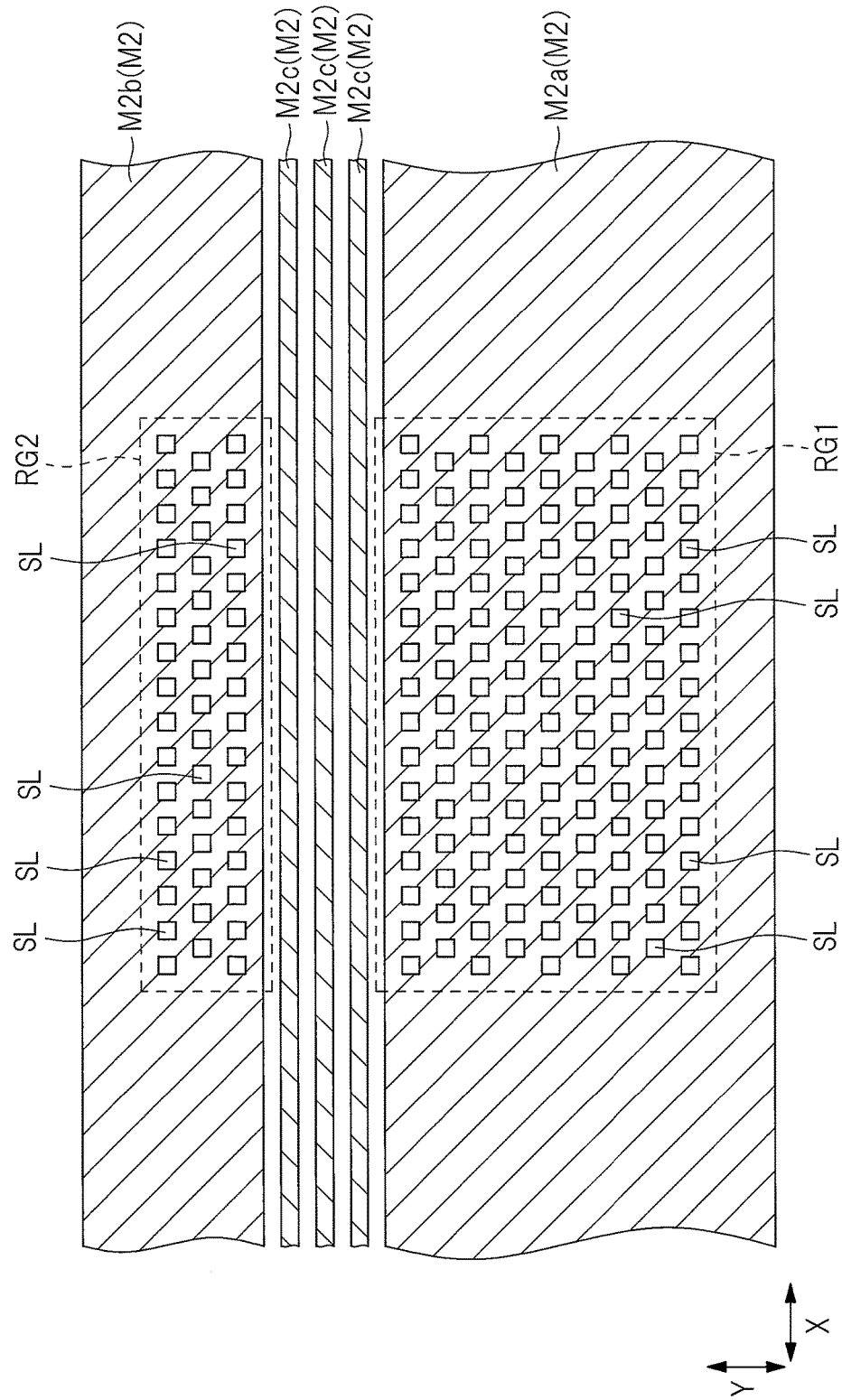
FIG. 38 is a plan view illustrating a principal part of the semiconductor device according to the second modification example.
Figure 39:
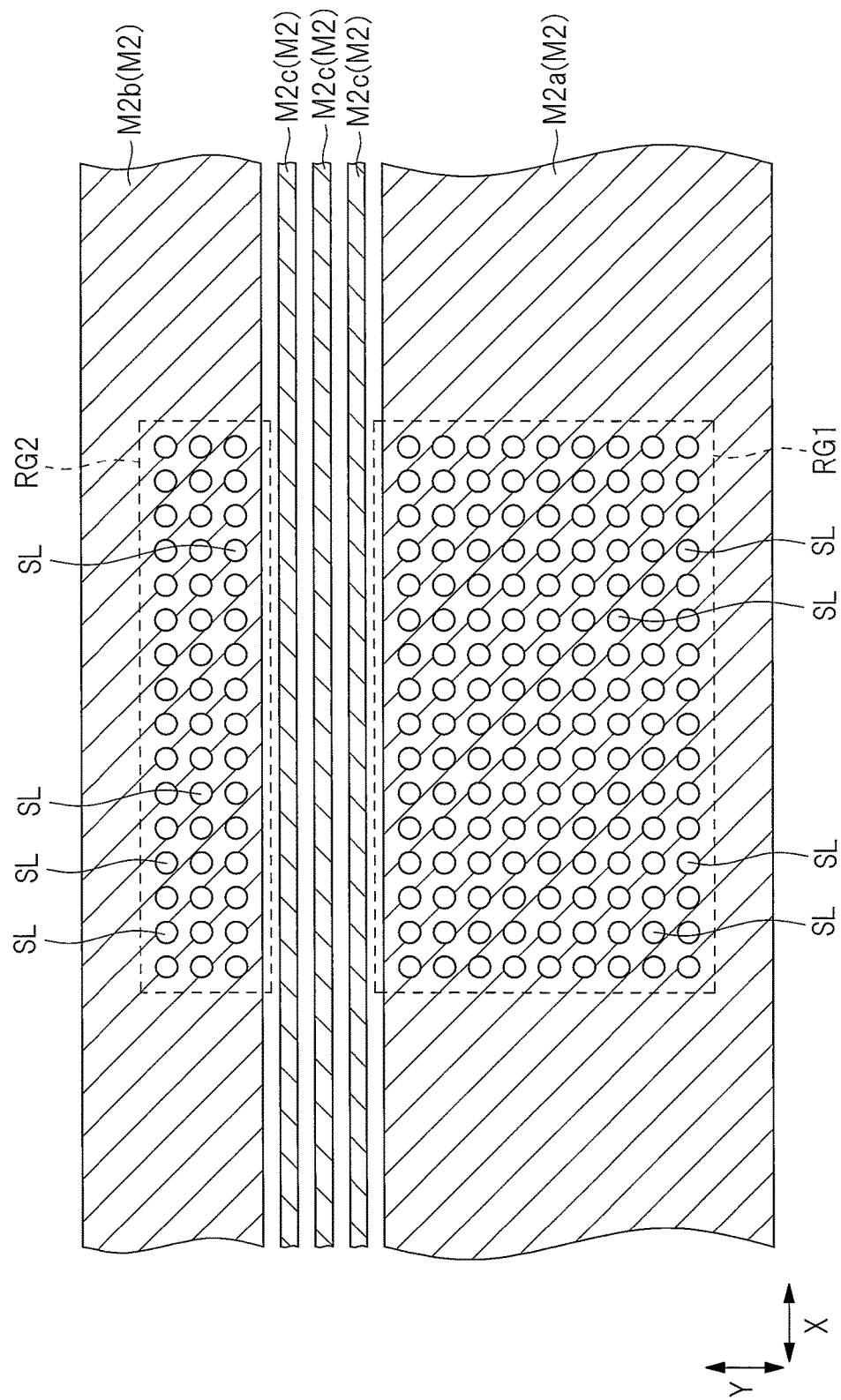
FIG. 39 is a plan view illustrating a principal part of the semiconductor device according to the second modification example.
Figure 40:
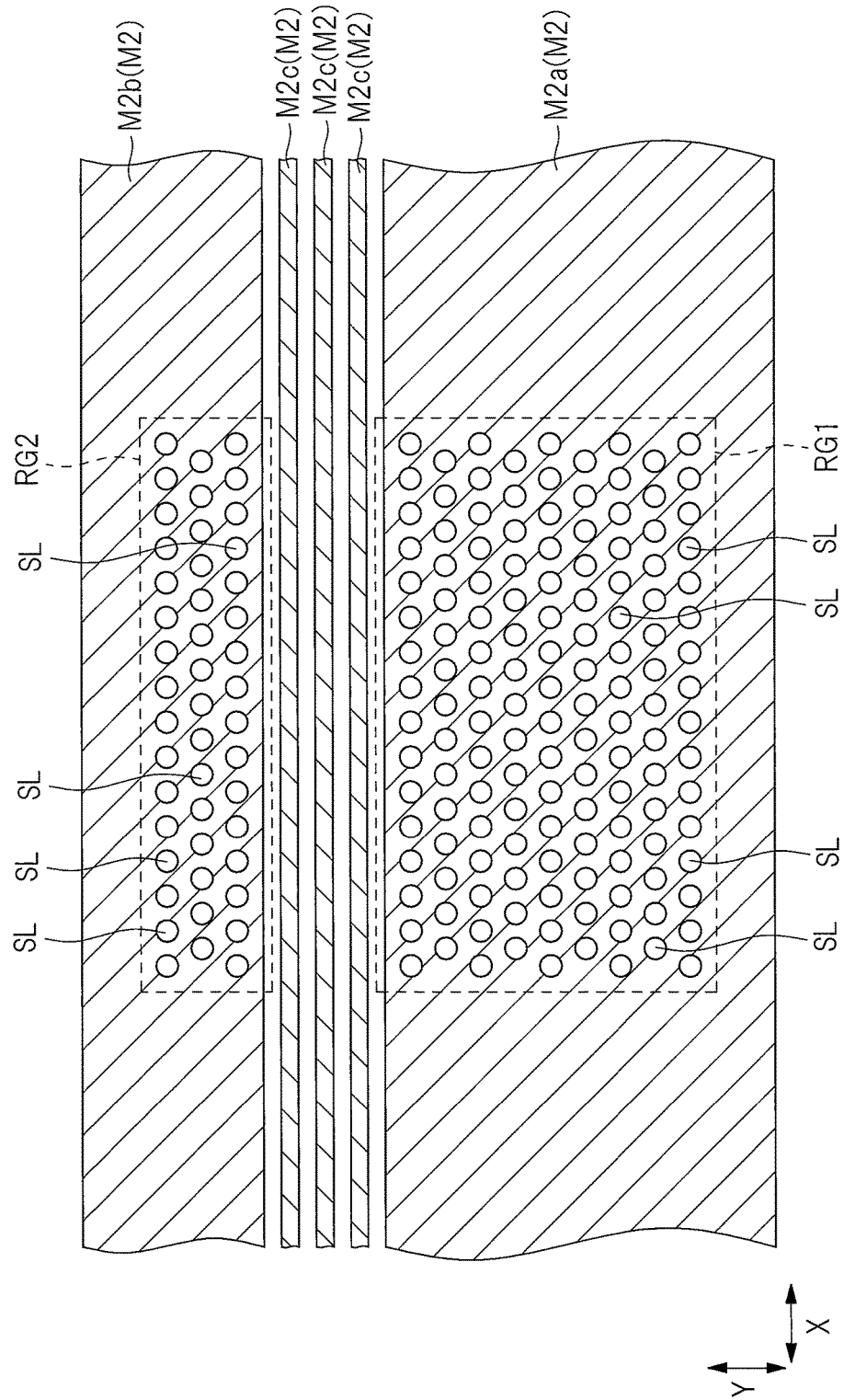
FIG. 40 is a plan view illustrating a principal part of the semiconductor device according to the second modification example.

Note that, in the array of the opening portion SL (array-like arrangement) of FIG. 37, the plurality of opening portions SL can be arrayed in a so-called staggered arrangement by shifting the array by ½ pitch for each column, and this case (the case of staggered arrangement) is illustrated in FIG. 38. In both the case of FIG. 37 and the case of FIG. 38, the plurality of opening portions SL can be considered to be formed in a mesh-like shape. Note that, although FIG. 37 and FIG. 38 illustrate the case where the planar shape of each opening portion SL is rectangular, it is also possible to adopt a planar shape (for example, a circular shape or the like) other than the rectangular shape. The case where the planar shape of each opening portion SL in FIG. 37 is changed to a circle is illustrated in FIG. 39, and the case where the planar shape of each opening portion SL in FIG. 38 is changed to a circle is illustrated in FIG. 40. In any cases of FIG. 37 to FIG. 40, the plurality of opening portions SL can be considered to be formed in a mesh-like shape.

In a case where the plurality of opening portions SL are formed in a slit-like shape in the opening portion forming regions RG1 and RG2 of the wirings M2a and M2b (in the case of FIG. 27), the following advantages can be obtained. More specifically, since an amount (volume) of a portion of the interlayer insulation film IL3 embedded in the opening portion SL can be efficiently increased, shrinkage and expansion of the wirings M2a and M2b are easily suppressed by the portion of the interlayer insulation film IL3 embedded in the opening portion SL (slit). Therefore, the effect of suppressing or preventing occurrence of a crack in the interlayer insulation film IL3 sandwiched between each of the wirings M2a and M2b and the pad PD1 can be further enhanced.

In a case where the plurality of opening portions SL are formed in a mesh-like shape in the opening portion forming regions RG1 and RG2 of the wirings M2a and M2b (in the cases of FIG. 37 to FIG. 40), the following advantages are obtained. More specifically, it is possible to suppress increase in resistance of the wirings M2a and M2b due to the provision of the plurality of opening portions SL in the wirings M2a and M2b and to reduce the resistance of the wirings M2a and M2b. Furthermore, in the wirings M2a and M2b, the phenomenon in which current is locally concentrated is unlikely to occur.

Next, a third modification example of the present embodiment will be described. FIG. 41 to FIG. 44 are plan views illustrating a principal part of a semiconductor device according to the third modification example of the present embodiment. Each of FIG. 41 to FIG. 44 indicates the wiring M2a serving as the wiring M2 extending below the pad PD1, and the wiring M2a is hatched in order to simplify the understanding. In addition, in each of FIG. 41 to FIG. 44, the two-dot chain line indicating the position of the opening portion OP1 in the insulating film LF, the one-dot chain line indicating the position of the opening portion OP2 in the resin film PL1, and the dotted line indicating the opening portion forming region RG1 are also illustrated. The plan view illustrating the pad PD1 is the same as FIG. 24 also in the case of the third modification example.

Figure 41:
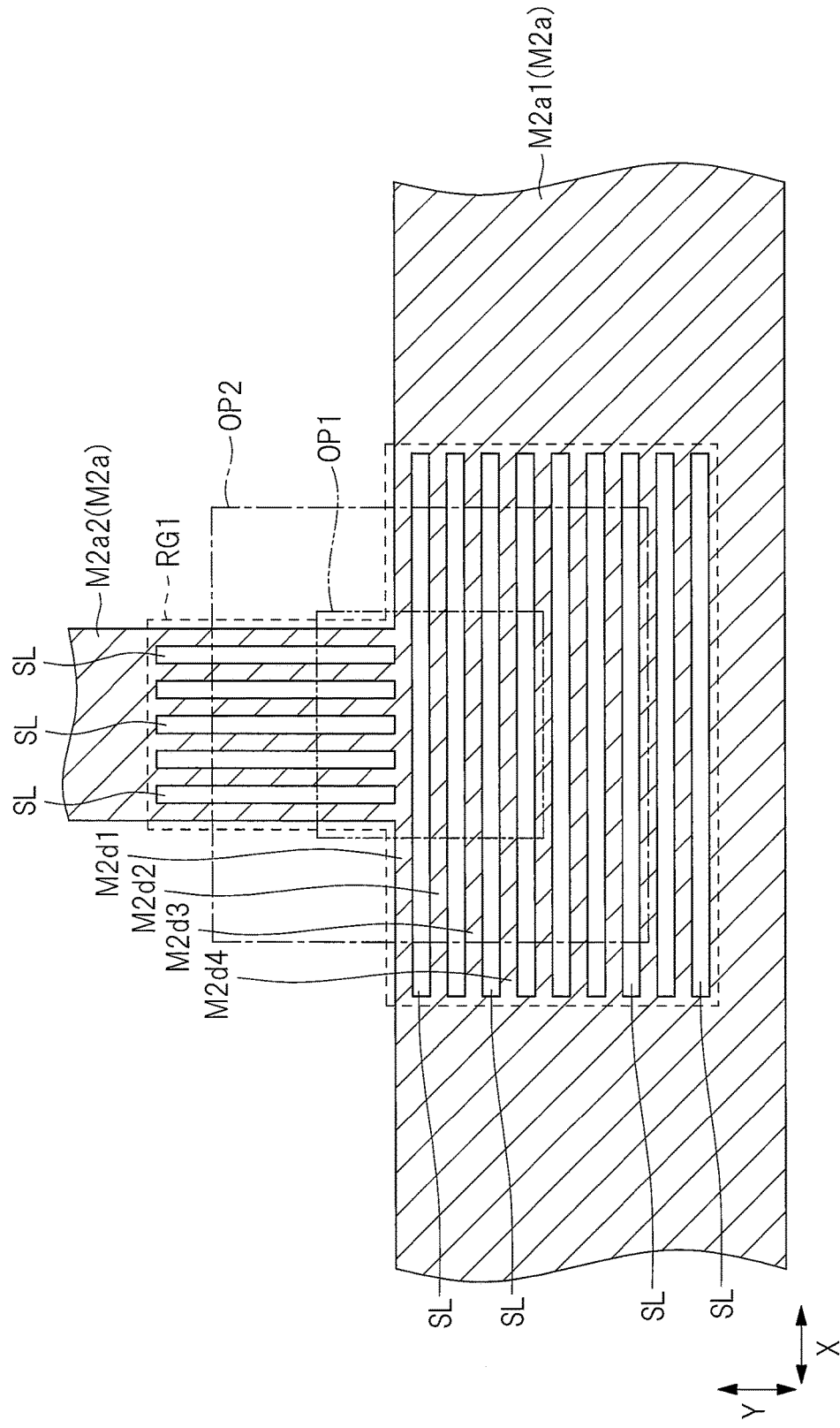
FIG. 41 is a plan view illustrating a principal part of a semiconductor device according to a third modification example.

First, the case of FIG. 41 will be described. In the case of FIG. 41, the wiring M2a extends below the pad PD1, and the wiring M2a includes a wiring portion M2a1 extending in the X direction and a wiring portion M2a2 extending in the Y direction in an integrated manner. The wiring portion M2a1 in FIG. 41 corresponds to the wiring M2a illustrated in FIG. 25 to FIG. 27, and the wiring M2a of FIG. 41 is obtained by integrally connecting the wiring portion M2a2 extending in the Y direction to the wiring M2a illustrated in FIG. 25 to FIG. 27. Therefore, in the wiring portion M2a1 of FIG. 41, the plurality of opening portions SL similar to the plurality of opening portions SL in the wiring M2a illustrated in FIG. 25 to FIG. 27 are formed. Also, in the wiring portion M2a2, the plurality of opening portions SL are formed. More specifically, also in the case of FIG. 41, the plurality of opening portions SL are formed in the opening portion forming region RG1 of the wiring M2a.

Also in the cases of FIG. 41 to FIG. 44, the first to the seventh conditions are satisfied, and accordingly, the above-mentioned effect can be obtained.

Note that, when the connecting portion between the wiring portion M2a1 and the wiring portion M2a2 is located in the opening portion OP2 of the resin film PL1 in plan view, and more particularly, when the connecting portion between the wiring portion M2a1 and the wiring portion M2a2 is located in the opening portion OP1 of the insulation film LF, the opening portions SL are preferably formed also in the vicinity of the connecting portion between the wiring portion M2a1 and the wiring portion M2a2 in order to prevent a crack from occurring in the interlayer insulation film IL3 sandwiched between the wiring M2a and the pad PD1. Therefore, in the cases of FIG. 41 to FIG. 44, the connecting portion between the wiring portion M2a1 and the wiring portion M2a2 is included in the opening portion forming region RG1, and the opening portions SL are also formed in the vicinity of the connecting portion between the wiring portion M2a1 and the wiring portion M2a2.

However, in the case of FIG. 41, resistance of a path of current flowing from the wiring portion M2a2 to the wiring portion M2a1 may increase. This will be described below.

In the case of FIG. 41, over the substantially entire opening portion forming region RG1 of the wiring portion M2al, the plurality of opening portions SL are formed in a slit-like shape extending in the X direction. Also, in the case of FIG. 41, the plurality of opening portions SL are formed in a slit-like shape extending in the Y direction over the substantially entire opening portion forming region RG1 of the wiring portion M2a2.

Since the wiring portion M2a2 is connected to a wiring portion M2d1 in the wiring portion M2al, the wiring portion M2d1 can function as a path for the current flowing from the wiring portion M2a2 to the wiring portion M2al, but the other wiring portions M2d2, M2d3, and M2d4 can hardly function as a path of current flowing from the wiring portion M2a2 to the wiring portion M2al. In this case, the wiring portions M2d1, M2d2, M2d3, and M2d4 are wiring portions constituting a part of the wiring portion M2a1 and extend in the Y direction. The wiring portions M2d1, M2d2, M2d3, and M2d4 have an opening portion SL between the adjacent ones and are separated from each other by the opening portion SL interposed therebetween.

Therefore, in the case of FIG. 41, the resistance of the current path flowing from the wiring portion M2a2 to the wiring portion M2a1 may increase. The case where this point is improved is the case of FIG. 42.

Figure 42:
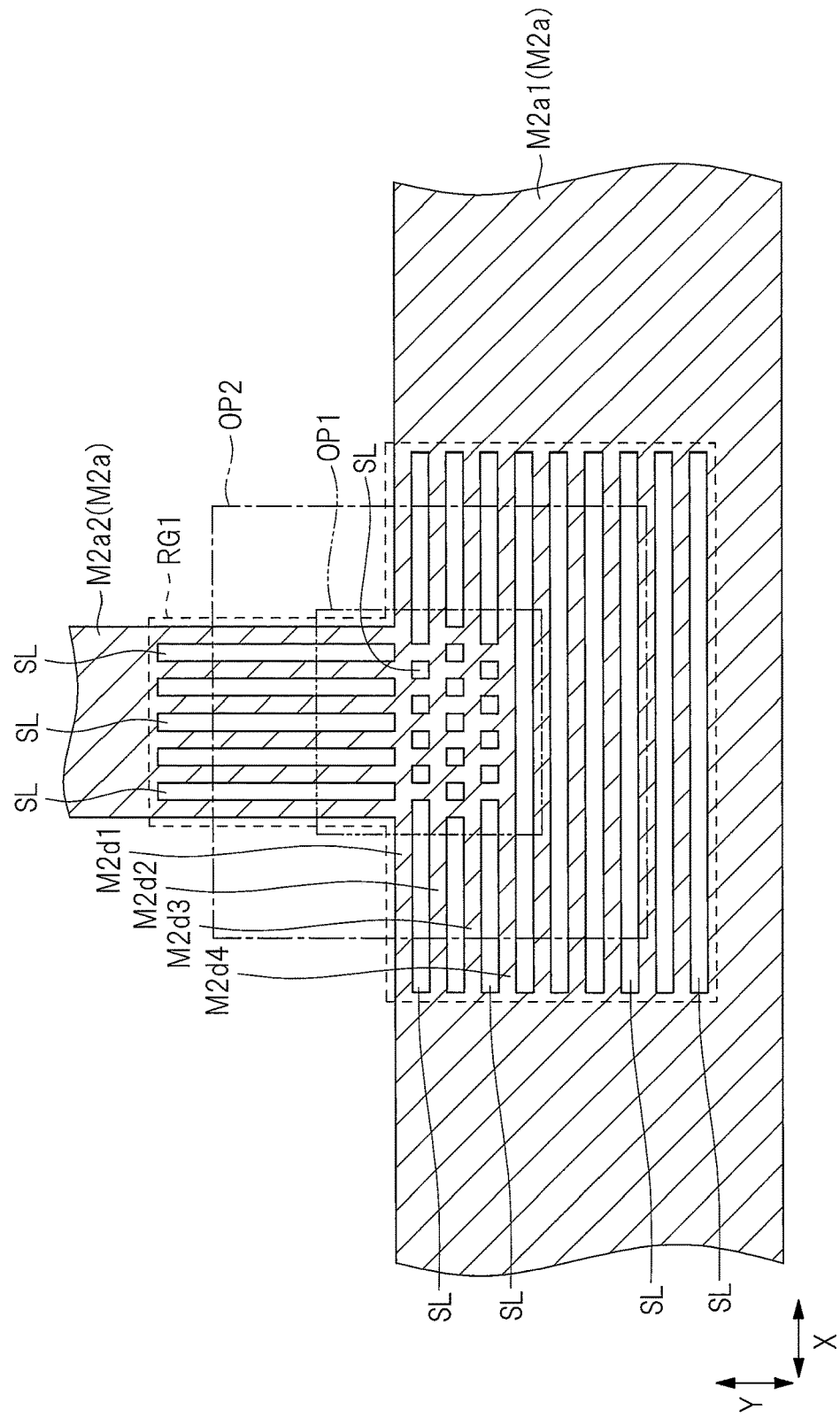
FIG. 42 is a plan view illustrating a principal part of the semiconductor device according to the third modification example.

Also in the case of FIG. 42, similarly to the case of FIG. 41, the plurality of opening portions SL are formed in a slit-like shape extending in the Y direction over the substantially entire opening portion forming region RG1 in the wiring portion M2a2. However, unlike the case of FIG. 41, in the case of FIG. 42, in the opening portion forming region RG1 of the wiring portion M2al, the plurality of opening portions SL are formed in a mesh-like shape in the vicinity of the connecting portion between the wiring portion M2a1 and the wiring portion M2a2, and the plurality of opening portions SL are formed in a slit-like shape extending in the X direction except in the vicinity of the connecting portion between the wiring portion M2a1 and the wiring portion M2a2. More specifically, in the case of FIG. 41, in the opening portion forming region RG1 in the wiring portion M2al, the opening portion SL is formed in a slit-like shape extending in the X direction also in the vicinity of the connecting portion between the wiring portion M2a1 and the wiring portion M2a2, but in the case of FIG. 42, in the opening portion forming region RG1 in the wiring portion M2al, the opening portion SL is formed in a mesh-like shape in the vicinity of the connecting portion between the wiring portion M2a1 and the wiring portion M2a2. Except that, the case of FIG. 42 is basically the same as the case of FIG. 41.

In the case of FIG. 42, in the opening portion forming region RG1 in the wiring portion M2al, the opening portion SL is formed in a mesh-like shape in the vicinity of the connecting portion between the wiring portion M2a1 and the wiring portion M2a2, so that not only the wiring portion M2d1 but also the wiring portions M2d2, M2d3, and M2d4 can function as a path of current flowing from the wiring portion M2a2 to the wiring portion M2al. This is because the wiring portions M2d2, M2d3, and M2d4 extending in the X direction are connected with one another by the wiring portion extending in the Y direction between the mesh-like opening portions. Therefore, as compared with the case of FIG. 41, in the case of FIG. 42, resistance of the path of the current flowing from the wiring portion M2a2 to the wiring portion M2a1 can be reduced.

Figure 43:
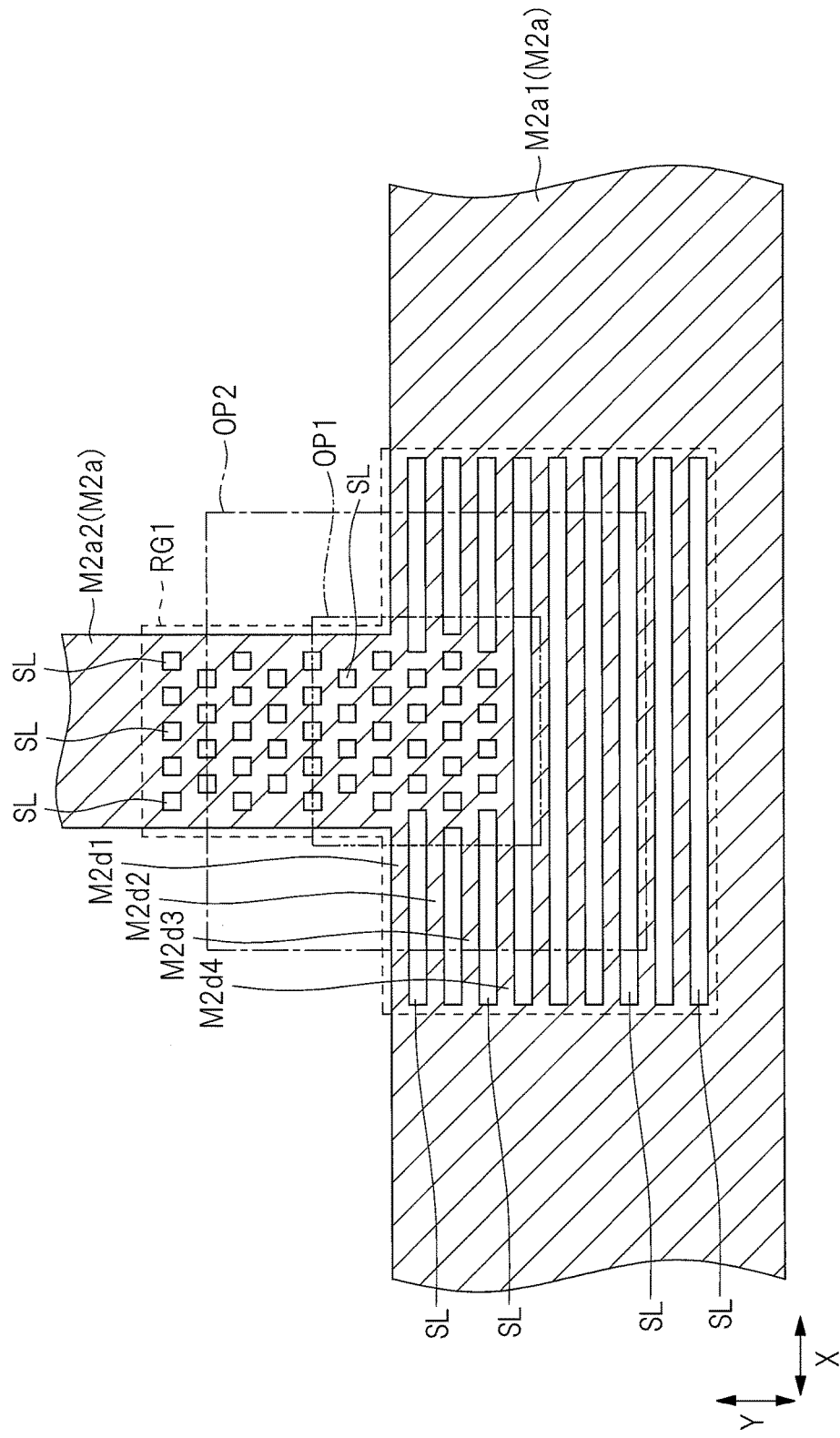
FIG. 43 is a plan view illustrating a principal part of the semiconductor device according to the third modification example.

FIG. 43 corresponds to the case where the plurality of opening portions SL are formed in a mesh-like shape over the substantially entire opening portion forming region RG1 in the wiring portion M2a2 in the case of FIG. 42. For this reason, also in the case of FIG. 43, similarly to the case of FIG. 42, in the opening portion forming region RG1 of the wiring portion M2al, the plurality of opening portions SL are formed in a mesh-like shape in the vicinity of the connecting portion between the wiring portion M2a1 and the wiring portion M2a2, and the plurality of opening portions SL are formed in a slit-like shape extending in the X direction except in the vicinity of the connecting portion.

In the case of FIG. 43, the resistance of the path of the current flowing from the wiring portion M2a2 to the wiring portion M2a1 can be reduced as compared with the case of FIG. 41. Also, in the case of FIG. 43, in the opening portion forming region RG1 of the wiring portion M2a2, the plurality of the opening portions SL are formed in a mesh-like shape, so that the resistance of the wiring portion M2a2 is made much smaller than that in the case of FIG. 42.

Figure 44:
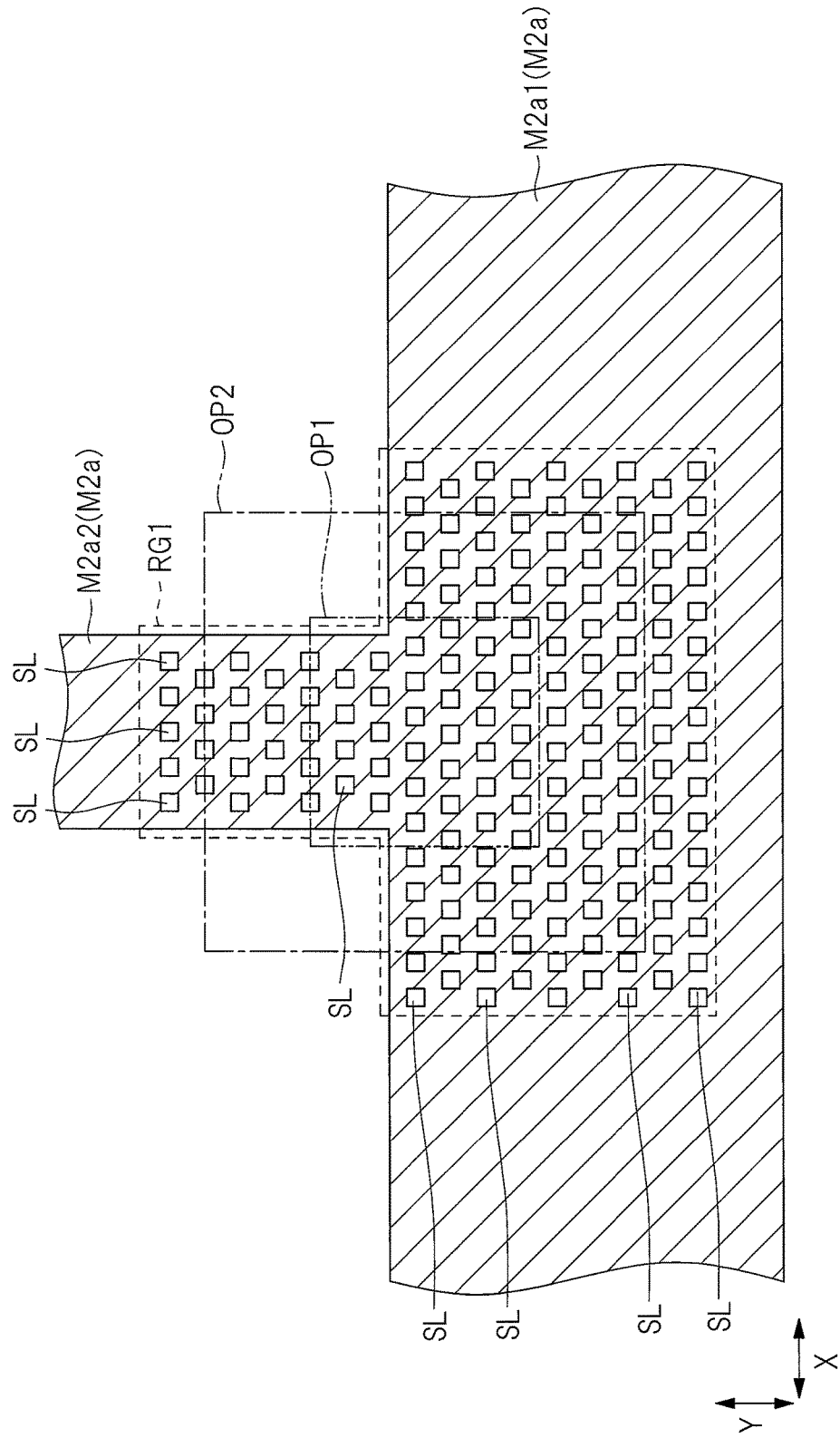
FIG. 44 is a plan view illustrating a principal part of the semiconductor device according to the third modification example.

FIG. 44 corresponds to a case where the plurality of opening portions SL are formed in a mesh-like shape over the entire opening portion forming region RG1 in the wiring M2a, that is, the entire opening portion forming region RG1 of the wiring portion M2a2 and the entire opening portion forming region RG1 of the wiring portion M2a1. In the case of FIG. 44, the resistance of the path of the current flowing from the wiring portion M2a2 to the wiring portion M2a1 can be reduced as compared with the case of FIG. 41. Also, in the case of FIG. 44, as compared with the cases of FIG. 41 to FIG. 43, the resistance of the wiring M2a can be further reduced by forming the plurality of opening portions SL in a mesh-like shape in the entire opening portion forming region RG1 of the wiring M2a.

Meanwhile, when the opening portions SL are formed in a slit-like shape, an amount (volume) of the portion of the interlayer insulation film IL3 embedded in the opening portion SL can be efficiently increased, so that shrinkage and expansion of the wiring M2a can be easily suppressed by the portion of the interlayer insulation film IL3 embedded in the opening portion SL (slit). This further enhances the effect of suppressing or preventing occurrence of a crack in the interlayer insulation film IL3 sandwiched between the wiring M2a and the pad PD1. For this reason, the effect of suppressing or preventing occurrence of a crack in the interlayer insulation film IL3 sandwiched between the wiring M2a and the pad PD1 can be enhanced more greatly in the case of FIG. 43 than in the case of FIG. 44 and enhanced more greatly in the case of FIG. 42 than in the case of FIG. 43.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
    a semiconductor substrate;
    a first wiring formed over the semiconductor substrate via a first interlayer insulation film;
    a second interlayer insulation film formed over the first interlayer insulation film so as to cover the first wiring;
    a first pad formed over the second interlayer insulation film;
    a first insulation film formed over the second interlayer insulation film and having a first opening portion in which the first pad is exposed;
    a second wiring formed over the first insulation film and over the first pad exposed in the first opening portion and electrically connected to the first pad; and
    a second pad formed over the first insulation film and integrally connected to the second wiring,
    wherein at least a portion of the first wiring overlaps with the first pad in plan view,
    wherein an end portion of the first wiring is located below a connection region between the first pad and the second wiring,
    wherein a plurality of second opening portions are formed in a first region of the first wiring, and
    wherein at least a portion of the first region overlaps with the connection region in plan view.

2. The semiconductor device according to claim 1, wherein, in plan view, an overlapping region between the first wiring and the connection region is included in the first region.

3. The semiconductor device according to claim 1, wherein the plurality of second opening portions are formed in a slit-like shape in the first region of the first wiring.

4. The semiconductor device according to claim 1, wherein the plurality of second opening portions are formed in a mesh-like shape in the first region of the first wiring.

5. The semiconductor device according to claim 1, wherein, a first width of the first wiring in a case where it is assumed that the plurality of second opening portions are not formed in the first wiring is 0.6 μm or more, and
    wherein, below the connection region, the plurality of second opening portions are formed in the first region of the first wiring such that a portion having a width of 0.6 μm or more is not generated in the first wiring.

6. The semiconductor device according to claim 1, wherein the first insulation film is composed of a layered film including a second insulation film and a third insulation film formed over the second insulation film,
    wherein the third insulation film is made of a resin film,
    wherein the first opening portion is formed by a third opening portion in the second insulation film and a fourth opening portion in the third insulation film,
    wherein the third opening portion is included in the fourth opening portion in plan view, and
    wherein the second wiring is connected to the first pad exposed in the third opening portion in the second insulation film.

7. The semiconductor device according to claim 6, wherein, in plan view, an overlapping region between the first wiring and the third opening portion is included in the first region.

8. The semiconductor device according to claim 7, wherein, in plan view, an overlapping region between the first wiring and the fourth opening portion is included in the first region.

9. The semiconductor device according to claim 8, wherein a first width of the first wiring in a case where it is assumed that the plurality of second opening portions are not formed in the first wiring is 0.6 μm or more, and
    wherein, below the fourth opening portion, the plurality of second opening portions are formed in the first region of the first wiring such that a portion having a width of 0.6 μm or more is not generated in the first wiring.

10. The semiconductor device according to claim 8, wherein, in plan view, the plurality of second opening portions are not formed in a region 5 μm or more apart from the fourth opening portion.

11. The semiconductor device according to claim 8, wherein the plurality of second opening portions are formed in a slit-like shape in the first region of the first wiring.

12. The semiconductor device according to claim 8, wherein the plurality of second opening portions are formed in a mesh-like shape in the first region of the first wiring.

13. The semiconductor device according to claim 8, wherein the second insulation film is composed of a layered film including a fourth insulation film made of a silicon oxide film and a fifth insulation film made of a silicon oxynitride film or a silicon nitride film formed over the fourth insulation film.

14. The semiconductor device according to claim 1, wherein the first pad is an aluminum pad, and
    wherein the second wiring is a copper wiring.

15. The semiconductor device according to claim 1,
wherein the first wiring is a power supply wiring or a ground wiring.

16. The semiconductor device according to claim 1, further comprising:
a protective insulation film formed over the first insulation film so as to cover the second wiring,
wherein the protective insulation film includes a fifth opening portion in which the second pad is exposed.

17. The semiconductor device according to claim 1, further comprising:
a third wiring of a same layer as the first wiring so as to extend below the first pad,
wherein at least a portion of the third wiring overlaps with the first pad in plan view,
wherein an end portion of the third wiring is located below the connection region,
wherein, in the third wiring, an opening portion is not formed, and
wherein a second width of the third wiring is smaller than a first width of the first wiring in a case where it is assumed that the plurality of second opening portions are not formed in the first wiring.

18. The semiconductor device according to claim 17,
wherein the first wiring is a power supply wiring or a ground wiring, and
wherein the third wiring is a signal wiring.

19. The semiconductor device according to claim 1,
wherein the first wiring includes a first wiring portion extending in a first direction and a second wiring portion extending in a second direction crossing the first direction in an integrated manner,
wherein a connection portion between the first wiring portion and the second wiring portion is included in the first region, and
wherein, in the first region of the first wiring portion, the plurality of second opening portions are formed in a mesh-like shape in the vicinity of the connecting portion, and except in the vicinity of the connection portion, the plurality of second opening portions are formed in a slit-like shape extending in the first direction.

20. A semiconductor device comprising:
a semiconductor substrate;
a first wiring formed over the semiconductor substrate via a first interlayer insulation film;
a second interlayer insulation film formed over the first interlayer insulation film so as to cover the first wiring;
a first pad formed over the second interlayer insulation film;
a first insulation film formed over the second interlayer insulation film and having a first opening portion in which the first pad is exposed;
a second wiring formed over the first insulation film and over the first pad exposed in the first opening portion and electrically connected to the first pad; and
a second pad formed over the first insulation film and integrally connected to the second wiring,
wherein the first insulation film is composed of a layered film including a second insulation film and a third insulation film formed over the second insulation film,
wherein the third insulation film is made of a resin film,
wherein the first opening portion is formed by a third opening portion in the second insulation film and a fourth opening portion in the third insulation film,
wherein the third opening portion is included in the fourth opening portion in plan view,
wherein the second wiring is connected to the first pad exposed in the third opening portion in the second insulation film,
wherein at least a portion of the first wiring overlaps with the first pad in plan view,
wherein an end portion of the first wiring is located below the fourth opening portion,
wherein the plurality of second opening portions are formed in the first region of the first wiring, and
wherein at least a part of the first region overlaps with the fourth opening portion in plan view.

* * * * *